United States Patent [19]
Ella

[11] Patent Number: 5,910,756
[45] Date of Patent: Jun. 8, 1999

[54] FILTERS AND DUPLEXERS UTILIZING THIN FILM STACKED CRYSTAL FILTER STRUCTURES AND THIN FILM BULK ACOUSTIC WAVE RESONATORS

[75] Inventor: Juha Ella, Salo, Finland

[73] Assignee: Nokia Mobile Phones Limited, Espoo, Finland

[21] Appl. No.: 08/861,216

[22] Filed: May 21, 1997

[51] Int. Cl.$^6$ .............. H03H 9/205; H03H 9/54; H03H 9/70
[52] U.S. Cl. .............. 333/133; 333/189; 333/191; 310/322; 310/324; 310/335; 310/349; 310/366
[58] Field of Search .................. 333/187–192, 333/133; 310/321, 322, 324, 334, 335, 349, 365, 366

[56] References Cited

U.S. PATENT DOCUMENTS

| | | | |
|---|---|---|---|
| 3,173,100 | 3/1965 | White | 330/35 |
| 3,189,851 | 6/1965 | Fowler | 333/189 |
| 3,293,557 | 12/1966 | Denton | 330/4.6 |
| 3,486,046 | 12/1969 | Zalar | 310/8 |
| 3,568,108 | 3/1971 | Poirier et al. | 333/30 |
| 3,686,579 | 8/1972 | Everett | 330/5.5 |
| 3,696,312 | 10/1972 | Kuhn et al. | 333/24 R |
| 3,760,471 | 9/1973 | Börner | 29/25.35 |
| 3,764,928 | 10/1973 | Gires et al. | 330/5.5 |
| 3,916,490 | 11/1975 | Sheahan et al. | 29/25.35 |
| 3,924,312 | 12/1975 | Coussot et al. | 29/25.35 |
| 4,019,181 | 4/1977 | Olsson et al. | 342/42 |
| 4,166,967 | 9/1979 | Benes et al. | 310/338 |
| 4,320,365 | 3/1982 | Black et al. | 333/187 |
| 4,365,216 | 12/1982 | Minagawa et al. | 333/153 |

(List continued on next page.)

FOREIGN PATENT DOCUMENTS

| | | |
|---|---|---|
| 0609555 | 8/1994 | European Pat. Off. . |
| 52-13793 | 2/1977 | Japan ............ 333/191 |
| 62-76913 | 4/1987 | Japan . |
| 5-299970 | 11/1993 | Japan ............ 333/190 |

OTHER PUBLICATIONS

"A monolithic piezoelectric amplitude modulator" Bransalov et al, International Journal of Electronics, vol. 47, No. 6, Dec. 1979, pp. 545–553.

"Ultralinear small–angle phase modulator", Symposium on Frequency Control, 1991, pp. 645–648, Forty–Fifth Annual Symposium on Frequency Control, J. Lowe and F.L. Walls.

"Acoustic Bulk Wave Composite Resonators", K. Lakin, Appl. Phys. Lett. 38(3), Feb. 1, 1981, pp. 125–127.

(List continued on next page.)

*Primary Examiner*—Benny Lee
*Assistant Examiner*—Barbara Summons
*Attorney, Agent, or Firm*—Perman & Green, LLP

[57] ABSTRACT

There is provided a Bulk Acoustic Wave Resonator-Stacked Crystal Filter (BAWR-SCF) filtering circuit or device. The BAWR-SCF circuit comprises a first pair of ports, a second pair of ports, a first lead that is connected between a first and a second one of the first pair of ports, and a second lead that is connected between a first and a second one of the second pair of ports. The BAWR-SCF circuit also comprises a first BAW resonator connected in series in the first lead, and a second BAW resonator connected between the first and second leads. The BAWR-SCF further comprises a Stacked Crystal Filter (SCF) having first and second terminals connected in the first lead between the first BAW resonator and the second one of the first pair of ports. The SCF also has a third terminal that is connected to a node of the second lead. The frequency response of the BAWR-SCF circuit has steeply-sloped upper and lower edges that are similar to those yielded by ladder filters which are constructed primarily of BAW resonators. The upper and lower notches of the BAWR-SCF circuit's frequency response are also similar to those yielded by ladder filters which are constructed primarily of BAW resonators. The BAWR-SCF circuit also provides stopband attenuation characteristics that are similar to those yielded by SCFs. Additional BAW resonators connected in a ladder configuration and/or SCFs may also be provided in the BAWR-SCF circuit.

23 Claims, 26 Drawing Sheets

U.S. PATENT DOCUMENTS

| | | | |
|---|---|---|---|
| 4,418,299 | 11/1983 | Momosaki | 310/361 |
| 4,456,850 | 6/1984 | Inoue et al. | 310/324 |
| 4,502,932 | 3/1985 | Kline et al. | 204/192.18 |
| 4,556,812 | 12/1985 | Kline et al. | 310/324 |
| 4,562,370 | 12/1985 | Von Dach | 310/312 |
| 4,642,508 | 2/1987 | Suzuki et al. | 310/321 |
| 4,897,618 | 1/1990 | Svetanoff | 331/76 |
| 5,153,476 | 10/1992 | Kosinski | 310/313 R |
| 5,162,691 | 11/1992 | Mariani et al. | 310/321 |
| 5,166,646 | 11/1992 | Avanic et al. | 331/107 A |
| 5,185,589 | 2/1993 | Krishnaswamy et al. | 333/133 |
| 5,233,259 | 8/1993 | Krishnaswamy et al. | 310/324 |
| 5,294,898 | 3/1994 | Dworsky et al. | 333/187 |
| 5,332,943 | 7/1994 | Bhardwaj | 310/326 |
| 5,373,268 | 12/1994 | Dworsky et al. | 333/187 |
| 5,382,930 | 1/1995 | Stokes et al. | 333/191 |
| 5,422,533 | 6/1995 | Kosinski et al. | 310/335 |
| 5,446,306 | 8/1995 | Stokes et al. | 257/416 |
| 5,587,620 | 12/1996 | Ruby et al. | 310/346 |
| 5,596,239 | 1/1997 | Dydyk | 310/311 |
| 5,629,906 | 5/1997 | Sudol et al. | 367/162 |
| 5,646,583 | 7/1997 | Seabury et al. | 333/187 |
| 5,692,279 | 12/1997 | Mang et al. | 29/25.35 |

OTHER PUBLICATIONS

"Systematic Design of Stacked–Crystal Filters by Microwave Network Methods", A. Ballato, IEEE Trans. of Microwave Theory and Techniques, vol., MTT–22, No. 1, Jan., 1974, pp. 14–25.

"Multi–Layered Ultrasonic Transducers Employing Air–Gap Structure", S. Yoshimoto, IEEE Trans. Of Ultrasonic . . . vol. 42, No. 3, May, 1995, pp. 339–343.

"Design of Unapodized Surface Wave Transducers with Spectral Weighting", G. Nudd, IEEE Trans. On Microwave Theory and Techniques, vol. MTT–22, No. 1, Jan., 1974, pp. 14–23.

"Development of Miniature Filters for Wireless Applications", K. Lakin et al., IEEE MTT–S Digest, 1995, pp. 883–886.

"Temperature Compensated High Coupling and High . . . Substrates", T.Shiosaki et al., Ultrasonic Symposium, 1984, pp. 405–410.

"An Air–Gap Type Piezoelectric Composite Thin Film Resonator", H. Satoh et al., IEEE, 1985, pp. 361–366.

"Coplanar Waveguides and Microwave Inductors on Silicon Substrates", A. Reyes, IEEE, 1995, pp. 2016–2021.

"Ultrasonic in Integrated Electronics", W. Newell, Proceedings of the IEEE, May, 1965, pp. 1305–1309.

"Recent Advances in Monolithic Film Resonator Technology" M.M. Driscoll, IEEE, Ultrasonics Symposium, 1986, pp. 365–369.

"Thin Film Bulk Acoustic Wave Filters for GPS", K.M. Lakin, IEEE Ultrasonics Symposium, 1992 pp. 471–476.

FILTERS AND DUPLEXERS UTILIZING THIN FILM STACKED CRYSTAL FILTER STRUCTURES AND THIN FILM BULK ACOUSTIC WAVE RESONATORS

FIELD OF THE INVENTION

This invention relates to filters and, in particular, this invention relates to filters that include Bulk Acoustic Wave (BAW) resonators and Stacked Crystal Filter (SCF) devices.

BACKGROUND OF THE INVENTION

It is known to fabricate monolithic filters that include Bulk Acoustic Wave (BAW) resonator devices (also known in the art as "Thin Film Bulk Acoustic Wave Resonators (FBARs)"). Presently, there are primarily two known types of Bulk Acoustic Wave devices, namely, BAW resonators and Stacked Crystal Filters (SCFs). One difference between BAW resonators and SCFs is the number of layers that are included in the structures of the respective devices. By example, BAW resonators typically include two electrodes and a single piezoelectric layer that is disposed between the two electrodes. One or more membrane layers may also be employed between the piezoelectric layer and a substrate of the respective devices. SCF devices, in contrast, typically include two piezoelectric layers and three electrodes. In the SCF devices, a first one of the two piezoelectric layers is disposed between a first, lower one of the three electrodes and a second, middle one of the three electrodes, and a second one of the piezoelectric layers is disposed between the middle electrode and a third, upper one of the three electrodes. The middle electrode is generally used as a grounding electrode.

BAW resonators are often employed in bandpass filters having various topologies. M. M. Driscoll et al. (Driscoll), entitled "Recent Advances in Monolithic Film Resonator Technology", Ultrasonic Symposium, 1986, pp. 365–369. The Driscoll publication discloses a multiple-pole filter that includes BAW resonators connected in a series configuration and a number of tuning elements, namely, inductors, that are each connected between ground and a respective node located between a respective pair of the BAW resonators. An equivalent circuit of an individual BAW resonator is shown in FIG. 4b. The equivalent circuit includes an equivalent inductance (Lm), an equivalent capacitance (Cm), and an equivalent resistance (R), that are connected in series, and a parallel parasitic capacitance (Co).

One concern relating to the design of filters is the elimination of the parasitic capacitance (Co). The parasitic capacitance (Co) associated with each BAW resonator of the filter can be canceled at the filter's center frequency by connecting an additional tuning element (e.g., an inductor) in parallel with each BAW resonator in the manner disclosed in the Driscoll publication. Unfortunately, however, this technique does not cause the parasitic capacitance (Co) to be canceled at out-of-band frequencies. Also, the use of the tuning elements adds undesired complexity and size to the overall structure of the filter.

Filters that include BAW resonators are often constructed to have ladder topologies. For the purposes of this description, ladder filters that are constructed primarily of BAW resonators are also referred to as "BAW ladder filters". The design of ladder filters is described in a publication entitled "Thin Film Bulk Acoustic Wave Filters for GPS", by K. M. Lakin et al. (Lakin), IEEE Ultrasonic Symposium, 1992, pp. 471–476. As is described in this publication, BAW ladder filters are typically constructed so that one or more BAW resonators are series-connected within the filters and one or more BAW resonators are shunt-connected within the filters. An exemplary BAW ladder filter 41 that includes two BAW resonators 42 and 43 is shown in FIG. 8d. Another exemplary (single) BAW ladder filter 44 that includes two series-connected BAW resonators 43 and 45 and two shunt-connected BAW resonators 42 and 46 is shown in FIG. 8f. An equivalent circuit of the BAW ladder filter 44 is shown in FIG. 8h. Still another exemplary BAW ladder filter 47 is shown in FIG. 8i. This filter 47 has a "balanced" topology, and is similar to the filter 44 of FIG. 8f, but also includes a BAW resonator 48 and a BAW resonator 49. An equivalent circuit of this filter 47 is shown in FIG. 8j.

BAW ladder filters are typically designed so that the series-connected resonators (also referred to as "series resonators") yield a series resonance at a frequency that is approximately equal to, or near, the desired (i.e., "design") center frequency of the respective filters. Similarly, the BAW ladder filters are designed so that the shunt-connected resonators (also referred to as "shunt resonators" or "parallel resonators") yield a parallel resonance at a frequency that is approximately equal to, or near, the desired center frequency of the respective filters.

BAW ladder filters yield passbands having bandwidths that are a function of, for example, the types of materials used to form the piezoelectric layers of the BAW resonators, and the respective thicknesses of the layer stacks of the BAW resonators. Typically, the series-connected BAW resonators of BAW ladder filters are fabricated to have thinner layer stacks than the shunt-connected resonators of the filters. As a result, the series and parallel resonances yielded by the series-connected BAW resonators occur at somewhat higher frequencies than the series and parallel resonant frequencies yielded by the shunt-connected BAW resonators (although the series resonance of each series-connected BAW resonator still occurs at a frequency that is near the desired filter center frequency on the frequency spectrum). In a BAW ladder filter, the parallel resonances yielded by the series-connected BAW resonators cause the filter to exhibit, a notch above the upper edge or skirt of the filter's passband, and the series resonances yielded by the shunt-connected BAW resonators cause the filter to exhibit a notch below the lower edge of the filter's passband. These notches have "depths" that are defined by the acoustic and electric losses of the series-connected and shunt-connected BAW resonators (i.e., the notches are defined by quality factors of the shunt and series BAW resonators).

The difference in the thicknesses of the layer stacks of the series-connected and shunt-connected BAW resonators can be achieved during the fabrication of the devices. By example, in a case in which the BAW resonators include one or more membrane layers, an additional layer of suitable material and thickness may be added to the membrane layers of the shunt-connected devices during fabrication so that, after the devices are completely fabricated, the shunt-connected devices will have thicker layer stacks than the series-connected resonators. As another example, the series resonators can be fabricated to have thinner piezoelectric layers than the shunt resonators, and/or the thicknesses of the upper electrodes of the series resonators can be reduced by a selected amount using a suitable technique, after the deposition of the upper electrode layers. These steps require the use of masking layers.

The performance of BAW ladder filters may be further understood in view of the element equivalent circuit of the BAW resonator shown in FIG. 4b. The series resonance of the individual BAW resonator is caused by the equivalent inductance (Lm) and the equivalent capacitance (Cm). At the series resonant frequency of the BAW resonator, the impedance of the BAW resonator is low (i.e., in an ideal case, where there are no losses in the device, the BAW resonator functions like a short circuit). At frequencies that are lower than this series resonant frequency, the impedance of the BAW resonator is capacitive. At frequencies that are higher than the series resonant frequency of the BAW resonator, but which are lower than the parallel resonant frequency of the device (the parallel resonance results from equivalent capacitance (Co)), the impedance of the BAW resonator is inductive. Also, at higher frequencies than the parallel resonant frequency of the BAW resonator, the impedance of the device is again capacitive, and, at the parallel resonant frequency of the device, the impedance of the BAW resonator is high (i.e., in an ideal case the impedance is infinite and the device resembles an open circuit at the parallel resonant frequency).

For an exemplary case in which two BAW resonators (e.g., a shunt BAW resonator and a series BAW resonator) having equivalent circuits similar to the one shown in FIG. 4b are employed in a BAW ladder filter, a lowest resonant frequency of the filter is one at which the series resonance of the shunt BAW resonator occurs. At this frequency, an input of the BAW ladder filter is effectively shorted to ground, and thus a frequency response of the BAW ladder filter exhibits a deep notch below the passband of the filter. The next highest resonant frequencies of the BAW ladder filter are the series resonant frequency of the series BAW resonator and the parallel resonant frequency of the shunt BAW resonator. These resonant frequencies are within the passband frequencies of the BAW ladder filter, and are located at or near the desired center frequency of the BAW ladder filter on the frequency spectrum. At the parallel resonant frequency of the shunt BAW resonator, the shunt BAW resonator behaves like an open circuit, and at the series resonant frequency of the series BAW resonator, the series BAW resonator behaves like a short circuit (and thus provides a low-loss connection between input and output ports of the BAW ladder filter). As a result, for a case in which a signal having a frequency that is approximately equal to the center frequency of the BAW ladder filter is applied to the input of the BAW ladder filter, the signal experiences minimum insertion loss (i.e., it encounters low losses) as it traverses the filter circuit between the filter's input and output.

A highest resonant frequency of the BAW ladder filter is one at which the series-connected BAW resonator yields a parallel resonance. At this frequency, the series BAW resonator behaves like an open circuit and the shunt BAW resonator behaves like a capacitor. As a result, the filter's input and output are effectively de-coupled from one another, and the frequency response of the filter includes a deep notch above the filter's passband.

The frequency response of a BAW ladder filter that includes no tuning elements typically has deep notches and steeply-sloped upper and lower passband edges (i.e., skirts). Unfortunately, however, these types of ladder filters tend to provide poor stopband attenuation (i.e., out-of-band rejection) characteristics. An example of a measured frequency response of a BAW ladder filter that exhibits deep notches, steeply-sloped passband edges, and poor stopband attenuation, and which includes four BAW resonators and no tuning elements, is shown in FIG. 9a.

Another exemplary frequency response is shown in FIG. 8e, for the BAW ladder filter 41 of FIG. 8d. The BAW ladder filter 41 yields the frequency response of FIG. 8e assuming that 1) the resonators 43 and 42 include the layers listed in respective Tables 1 and 2 below, 2) the layers of resonators 43 and 42 have thicknesses and include the materials listed in respective Tables 1 and 2, 3) the filter 41 is connected between 50 Ohm terminals, and 4) the filter 41 includes no tuning elements.

TABLE 1

SERIES BAW RESONATOR (43, 45)

| Layer | |
|---|---|
| Upper electrode: Molybdenum (Mo) | 308 nm |
| Piezoelectric layer: Zinc-oxide (ZnO) | 2147 nm |
| Lower electrode: Molybdenum (Mo) | 308 nm |
| first membrane layer: silicon-dioxide ($SiO_2$) | 90 nm |
| area of upper electrode | 225 um* 225 um |

TABLE 2

SHUNT BAW RESONATOR (42, 46)

| Layer | |
|---|---|
| Upper electrode: Molybdenum (Mo) | 308 nm |
| Piezoelectric layer: Zinc-oxide (ZnO) | 2147 nm |
| Lower electrode: Molybdenum (Mo) | 308 nm |
| first membrane layer: ($SiO_2$) | 90 nm |
| second membrane layer: ($SiO_2$) | 270 nm |
| area of upper electrode | 352 um* 352 um |

As can be appreciated in view of Tables 1 and 2, the BAW resonator 42 includes two membrane layers, and the BAW resonator 43 includes only a single membrane layer. The employment of two membrane layers in the resonator 42 causes the resonant frequencies yielded by the resonator 42 to be lower than those yielded by the series-connected resonator 43, as was described above.

The level of stopband attenuation provided by a BAW ladder filter can be increased by including additional BAW resonators in the filter and/or by constructing the filter so that the ratio of the areas of the filter's parallel-connected BAW resonators to the areas of the filter's series-connected BAW resonators is increased. FIG. 8g shows an exemplary "simulated" frequency response of the filter 44 (which includes a greater number of resonators than the filter 41), assuming that 1) the resonators 43 and 45 include the layers having the thicknesses and materials listed in Table 1, 2) the resonators 42 and 46 include the layers having the thicknesses and materials listed in Table 2, and 3) the filter 44 includes no tuning elements.

As can be appreciated in view of FIGS. 8e and 8g, the degree of attenuation provided by the filter 44 at out-of-band frequencies is improved somewhat over the attenuation level provided by the filter 41 that includes only two BAW resonators. Unfortunately, however, the employment of additional BAW resonators in a filter increases the filter's overall size and can cause an undesirable increase in the level of insertion loss of the filter. This is also true in cases in which the filter's parallel-connected BAW resonators are fabricated to have larger areas than the series-resonators. Moreover, even if such measures are taken in an attempt to improve the filter's passband response, the level of stopband attenuation provided by the filter may be insufficient for certain applications.

As shown in FIGS. 8e and 8g, the center frequencies of the passbands of respective filters 41 and 44 are located at about 947.5 MHz on the frequency spectrum, and the minimum passband bandwidth yielded by each of the filters 41 and 44 is approximately 25 MHz. As can be appreciated by those having skill in the art, these frequency response characteristics are required of filters that are employed in GSM receivers.

It is known to employ one or more SCF devices in a passband filter. An advantage of employing SCF devices in passband filters is the better stopband attenuation characteristics provided by these filters in general, as compared to the stopband attenuation characteristics of typical BAW ladder filters. An exemplary lumped element equivalent circuit of a SCF is shown in FIG. 8b. The equivalent circuit includes an equivalent inductance (2Lm), an equivalent capacitance (Cm/2), an equivalent resistance (2R), and parasitic capacitances (Co). As can be appreciated in view of FIG. 8b, the SCF can be considered to be an LC resonator having parallel capacitances (Co) connected to ground.

Like the BAW ladder filters described above, filters that are comprised primarily of SCF devices can also suffer from a number of drawbacks. One drawback is that SCFs generally yield frequency responses that do not exhibit such desired characteristics as deep notches and steeply-sloped passband edges. This can be seen in view FIG. 8c, which shows an exemplary frequency response of a SCF. The frequency response of a filter that is comprised primarily of one or more SCF components can be improved to some extent by connecting an inductor between each SCF structure, as is described in U.S. Pat. No. 5,382,930. Unfortunately, however, the addition of these inductors adds to the overall size and complexity of the filter, and can also increase the filter's level of insertion loss, owing to losses in the inductors. Another drawback associated with these types of filters is that it can be difficult to control the passband bandwidths of the filters.

In view of the above description, it can be appreciated that it would be desirable to provide a filter which can yield the desired frequency response characteristics provided by both BAW ladder filters and Stacked Crystal Filters. That is, it would be desirable to provide a filter which exhibits a frequency response having deep notches and steeply-sloped upper and lower passband edges, and which also yields stopband attenuation levels that are similar to those generally yielded by Stacked Crystal Filters. It is also desirable that the filter be small in size, and be able to exhibit the desired frequency response characteristics without the use of tuning elements.

Another concern of this invention relates to duplex filters. Duplex filters (also referred to as "duplexers") are conventionally employed as three port devices in transceivers to isolate the receiver (RX) and transmitter (TX) portions of the transceiver from one another and to provide frequency selectivity for each of the RX and TX portions of the transceiver. Duplex filters typically include a bandstop filter for filtering signals that are output by the TX portion of the transceiver, before the signals are transmitted from the transceiver via an antenna. The bandstop filter attenuates signals having frequencies within the filter's stopband, which normally includes the same frequencies of the transceiver's receive band. Duplex filters also typically include a passband filter for filtering signals that are received by the antenna, before the signals are provided to the RX portion of the transceiver.

Most conventional duplexers suffer from a number of drawbacks. For example, one conventional type of duplexer, namely, ceramic duplexers, which are often employed in mobile telephone transceivers, generally are undesirably large in size. Also, some conventional duplexers employed in mobile telephones sometimes include Surface Acoustic Wave (SAW) devices, which unfortunately cannot operate at certain high RF power levels such as those often employed in GSM transmitters. It can thus be appreciated that it would be desirable to provide a duplexer which overcomes these problems.

OBJECTS OF THE INVENTION

It is an object of this invention to provide a filter that provides improved frequency response characteristics relative to those that can be provided by individual BAW ladder filters and individual SCF devices.

It is another object of this invention to provide a bandpass filter which exhibits a frequency response having deep notches and steeply-sloped upper and lower passband edges, and which also provides a high degree of attenuation at out-of-band frequencies.

It is another object of this invention to provide an improved duplex filter.

Further objects and advantages of this invention will become apparent from a consideration of the drawings and ensuing description.

SUMMARY OF THE INVENTION

The foregoing and other problems are overcome and the objects of the invention are realized by a Bulk Acoustic Wave Resonator-Stacked Crystal Filter (BAWR-SCF) device or circuit. According to one embodiment of the invention, the BAWR-SCF circuit comprises four ports, a first lead that is connected between a first and a second one of the ports, and a second lead that is connected between a third and a fourth one of the ports. The BAWR-SCF circuit also comprises a first, "series" BAW resonator and a second, "shunt" BAW resonator, that are connected in a ladder configuration, and further includes a Stacked Crystal Filter (SCF). In accordance with this embodiment of the invention, the first BAW resonator is connected in series in the first lead between the first port of the BAWR-SCF circuit and a first terminal of the SCF. The second BAW resonator includes a first terminal that is coupled to the first lead between the first BAW resonator and the first port, and also includes a second terminal that is connected to the second lead. The SCF includes first and second terminals that are connected in the first lead between the first BAW resonator and the second port, and also includes a third terminal that is connected to a node of the second lead, which is preferably connected to ground during use.

In accordance with another embodiment of the invention, a BAWR-SCF circuit is provided which is similar to that described above, except that the first terminal of the second, shunt BAW resonator is coupled to the first lead between the first BAW resonator and the first terminal of the SCF.

According to another embodiment of the invention, a BAWR-SCF circuit is provided which is also similar to that described above, except that in this embodiment the BAWR- SCF circuit also comprises a third BAW resonator and a fourth BAW resonator. The third BAW resonator is connected in series in the first lead between the SCF and the second port, and the fourth BAW resonator has a first terminal that is coupled to the first lead between the third BAW resonator and the second port.

In accordance with a further embodiment of the invention, a BAWR-SCF circuit is provided which is also similar to that described above. However, in this embodiment of the invention, the first terminal of the second, shunt BAW resonator is coupled to the first lead between the first BAW resonator and the first terminal of the SCF, and the first terminal of the fourth BAW resonator is coupled to the first lead between the SCF and the third BAW resonator.

In still another embodiment of the invention, a BAWR-SCF circuit is provided which has a "balanced" topology. The BAWR-SCF circuit in accordance with this embodiment of the invention includes first and second BAW resonators, first and second leads, four ports, and an SCF that are similar to those described above. The first BAW resonator is connected in series in the first lead between a first one of the ports of the BAWR-SCF circuit and a first terminal of the SCF. The second BAW resonator includes a first terminal that is coupled to the first lead between the first BAW resonator and the first port, and also includes a second terminal that is connected to the second lead. The SCF includes first and second terminals that are connected in the first lead between the first BAW resonator and a second one of the ports, and also includes a third terminal that is connected to a node, which is preferably connected to ground during use. The BAWR-SCF circuit also comprises a third BAW resonator and a fourth BAW resonator. The third BAW resonator is connected in series in the first lead between the SCF and the second port. The fourth BAW resonator has a first terminal that is coupled to the first lead between the third BAW resonator and the second port, and a second terminal that is connected to the second lead. The balanced BAWR-SCF circuit also includes a fifth BAW resonator that is connected in series in the second lead, and which has a first terminal coupled to a third one of the ports. The balanced BAWR-SCF circuit further comprises a sixth BAW resonator that is connected in series in the second lead, and which includes a first terminal that is coupled to a fourth one of the ports. The BAWR-SCF in accordance with this embodiment of the invention further comprises an additional SCF. This SCF includes first, second, and third terminals. The first terminal is coupled to a second terminal of the fifth BAW resonator, the second terminal is coupled to a second terminal of the sixth BAW resonator, and the third terminal is connected to the node.

In accordance with the invention, by employing the BAW resonators connected in a ladder topology and SCFs within a single circuit, such as any one of the various embodiments of the BAWR-SCF circuit described above, the desired characteristics provided by both BAW ladder filters and Stacked Crystal Filters can be provided. Each of the various embodiments of the BAWR-SCF circuit described above exhibits a frequency response having deep notches and steeply-sloped passband edges that are similar to those typically yielded by BAW ladder filters, and also yields stopband attenuation characteristics that are similar to those typically yielded by Stacked Crystal Filters. The BAWR-SCF circuits of the invention provide generally improved frequency responses relative to those that can be exhibited by, for example, individual BAW ladder filters or individual SCF devices.

In each of the BAWR-SCF devices of the invention, "series-connected" ones of the BAW resonators preferably include layer stacks of similar thicknesses, and "parallel-connected" (or "shunt-connected") ones of the BAW resonators preferably include layer stacks of similar thicknesses. Preferably, the series-connected BAW resonators include thinner layer stacks than do the parallel-connected BAW resonators, thereby enabling each BAWR-SCF device to yield a frequency response having an upper notch at the frequency of the parallel resonances of the series-connected BAW resonators, and a lower notch at the frequency of the series resonances of the parallel-connected BAW resonators.

In accordance with another aspect of the invention, each SCF (which yield series resonances) of the BAWR-SCF circuits may be fabricated to have a layer stack of a thickness that enables the SCF to yield either a fundamental resonant frequency or a second harmonic resonant frequency at or near the desired ("design") center frequency of the BAWR-SCF device. Preferably, the BAWR-SCF devices of the invention are constructed so that the SCFs yield a second harmonic resonance, rather than a fundamental resonance, at the "design" center frequency of the respective BAWR-SCF devices. This is because the BAWR-SCF devices are easier to fabricate in this case.

The BAWR-SCF circuits may include any suitable types of BAW resonators and SCFs, including, for example, solidly-mounted (i.e., acoustic mirror structure) BAW resonators and SCFs. The use of acoustic mirrors in the BAWR-SCF devices offers a number of advantages over the use of other types of structures. One advantage is that the acoustic mirror devices are structurally more rugged than the other types of devices. Another advantage is that, in high power applications, any heat that may be generated due to losses in the devices is conducted efficiently to the substrates of the respective devices via the acoustic mirrors. A further advantage of using acoustic mirror devices in the BAWR-SCF devices of the invention is that the acoustic mirrors can help to attenuate any unwanted harmonic responses that may occur in the devices.

In accordance with another aspect of the invention, it is preferable that each of the BAWR-SCF devices of the invention be constructed so as to include as few vias as possible in the structures of the respective devices.

In accordance with another aspect of the invention, a duplex filter (duplexer) for use in a transceiver is provided. The duplex filter preferably comprises a first, "transmit" portion and a second, "receive" portion. During times when the duplexer is connected within a transceiver, the first portion filters signals that are output by a transmitter portion of the transceiver before the signals are transmitted from the transceiver over an antenna. The second portion of the duplexer filters signals that are received by the antenna, and provides filtered signals to a receiver portion of the transceiver. The first and second portions of the duplexer each comprise a respective BAWR-SCF circuit, which may be similar to any of those described above. Preferably, the first portion of the duplexer is tuned to yield a passband response having a center frequency $f_{c1}$, a lower notch at a frequency $f_{N1}$, and an upper notch at a frequency $f_{N2}$, and the second portion of the duplexer is tuned to yield a passband response having a center frequency $f_{c2}$, a lower notch at a frequency $f_{N3}$, and an upper notch at a frequency $f_{N4}$.

In accordance with a further aspect of the invention, a double duplex filter for use in a dual-mode transceiving device (e.g., a dual-mode mobile station) is provided. The double duplex filter preferably comprises a first duplexer and a second duplexer. In accordance with a preferred embodiment of the invention, the first duplexer includes a first filter and a second filter. Each of the first and second filters has a respective first pair of ports coupled to an output of a transmitter portion of the transceiving device, and each of the first and second filters also includes a respective second pair of ports. At least a first one of the second pair of ports of each of the first and second filters is coupled to at least one antenna of the transceiving device. The first and second filters comprise respective BAWR-SCF circuits that are tuned to provide passbands over a first frequency band and a second frequency band, respectively.

The second duplexer of the double duplex filter preferably also includes a first filter and a second filter. Each of these duplex filters has a respective first pair of ports and a respective second pair of ports. At least a first one of the first pair of ports of each filter is coupled to the at least one antenna. The second pair of ports of the filters are preferably coupled to an input of a receiver portion of the transceiving device. The first and second filters of the second duplexer comprise respective BAWR-SCF circuits that are tuned to provide passbands over a third frequency band and a fourth frequency band, respectively.

BRIEF DESCRIPTION OF THE DRAWINGS

The above set forth and other features of the invention are made more apparent in the ensuing Detailed Description of the Invention when read in conjunction with the attached Drawings, wherein:

FIG. 1b illustrates a top view of a portion of the BAW resonator of FIG. 1a;

FIG. 5b illustrates a top view of a portion of the SCF of FIG. 5a;

FIG. 7b shows a top view of a portion of the SCF of FIG. 7a;

FIG. 9c also shows an exemplary frequency response (B') of a SCF that includes the piezoelectric layers 22 and 23 of FIG. 9b;

FIG. 10b shows a frequency response of the BAWR-SCF device of FIG. 10a;

FIG. 10f shows a frequency response (FR) of a SCF of the BAWR-SCF device of FIG. 10a;

FIG. 11b shows a frequency response of the device of FIG. 11a;

FIG. 14b shows a side view of the duplex filter of FIG. 14a;

Identically labeled elements appearing in different ones of the figures refer to the same element but may not be referenced in the description for all figures.

DETAILED DESCRIPTION OF THE INVENTION

Before describing the presently preferred embodiments of this invention, a brief reference will be made to the Bulk Acoustic Wave (BAW) devices shown in FIGS. 1a–4a and the Stacked Crystal Filters (SCFs) shown in FIGS. 5a–8a. The Bulk Acoustic Wave (BAW) devices shown in FIGS. 1a–4a are further described in a commonly assigned copending U.S. patent application entitled "A Device Incorporating a Tunable Thin Film Bulk Acoustic Resonator for Performing Amplitude and Phase Modulation", filed on Oct. 2, 1996, and invented by Juha Ellä.

Figure 1A:
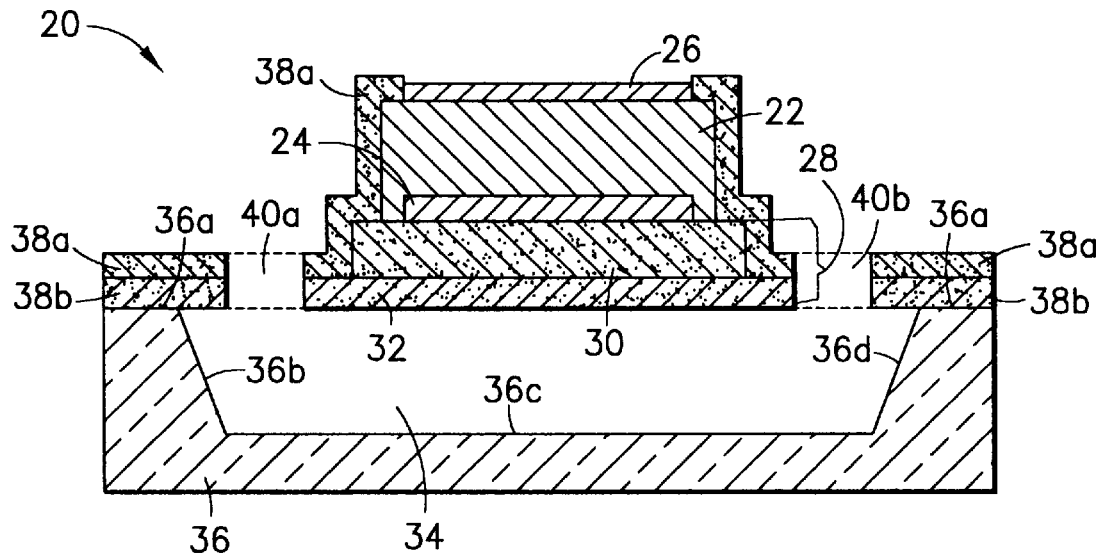
FIG. 1a illustrates a cross-section of an exemplary Bulk Acoustic Wave (BAW) resonator that includes a membrane and an air gap.
Figure 1B:
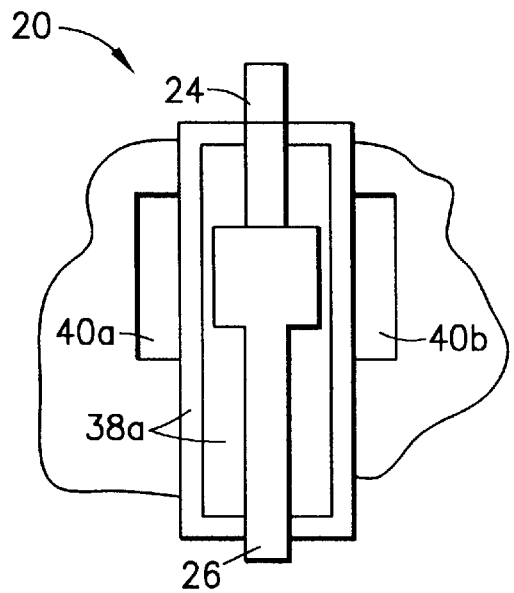

In FIGS. 1a and 1b, a side view of a cross-section and a top view of a cross section, respectively, are shown of a BAW resonator 20 having a membrane or bridge structure 28. The BAW resonator 20 comprises a piezoelectric layer 22, a layer 38b, a protective layer 38a (e.g., polyimide), a first, lower electrode 24, a second, upper electrode 26, the membrane 28, etch windows 40a and 40b, an air gap 34, and a substrate 36. The piezoelectric layer 22 comprises, by example, a piezoelectric material that can be fabricated as a thin film such as, by example, zinc-oxide (ZnO), zinc-sulfur (ZnS), or aluminum-nitride (AlN). The membrane 28 comprises two layers, namely, a top layer 30 and a bottom layer 32, although only a single membrane layer may also be employed. The top layer 30 is comprised of, by example, silicon (Si), silicon-dioxide (SiO$_2$), poly-silicon (poly-si), or aluminum-nitride (AlN), and the bottom layer 32 is comprised of, by example, silicon, silicon-dioxide (SiO$_2$), or gallium arsenide (GaAs). The layer 38b is also comprised of, by example, SiO$_2$ or GaAs. The lower electrode 24 may be comprised of, by example, gold (Au), molybdenum (Mo), or aluminum (Al), although gold is preferably employed since it provides greater advantages during the growing of the piezoelectric layer 22 than do the other materials. The upper electrode 26 may also be comprised of, by example, gold. (Au), molybdenum (Mo), or aluminum (Al), although aluminum is preferably used since it is less electrically lossy than the other materials. During fabrication of the device 20, the layers 38b and 32 are deposited simultaneously, and as a single layer, over the substrate 36 of the device 20. The etch windows 40a and 40b are formed by etching through this single layer and the layer 38a (as a result, the separately labelled layers 38b and 32 are provided). The substrate 36 is comprised of a material such as, by example, silicon (Si), SiO$_2$, GaAs, or glass. Through the etch windows 40a and 40b, a portion of the substrate 36 is etched to form the air gap 34 after the membrane layers have been deposited over the substrate 36.

Figure 2:
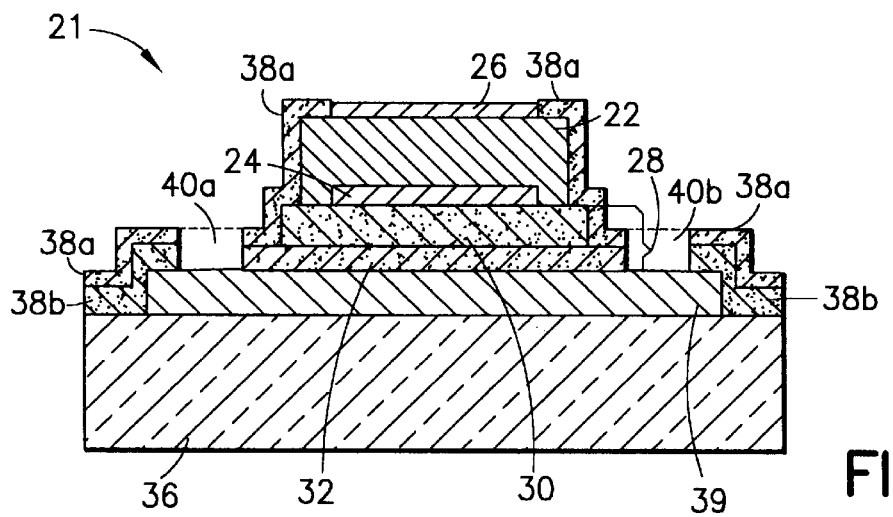
FIG. 2 illustrates a cross-section of an exemplary BAW resonator that includes a sacrificial layer.

Referring to FIG. 2, a BAW resonator 21 is shown. The BAW resonator 21 is similar to the one illustrated in FIG. 1a, with an addition of a sacrificial layer 39. During fabrication of the resonator 21, the sacrificial layer 39 is deposited over the substrate 36 prior to the deposition of the membrane 28. After all of the resonator layers are formed, the sacrificial layer 39 is removed through the etch windows 40a and 40b to form air gap 34. The layer 32 provides protection for the piezoelectric layer 22 during the removal of the sacrificial layer 39.

For both of the resonators 20 and 21, the piezoelectric layer 22 produces vibrations in response to a voltage being applied across the electrodes 24 and 26. The vibrations that reach the interface between the membrane 28 and the air gap 34 are reflected by this interface back into the membrane 28. In this manner, the air gap 34 isolates vibrations produced by the piezoelectric layer 22 from the substrate 36.

Figure 3A:
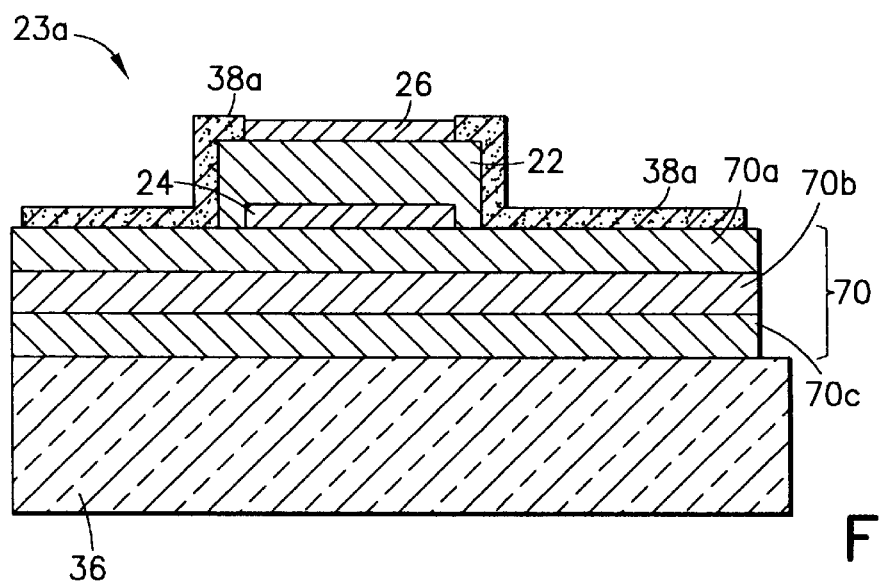
FIG. 3a illustrates a cross-section of an exemplary solidly-mounted BAW resonator that includes an acoustic mirror.
Figure 3B:
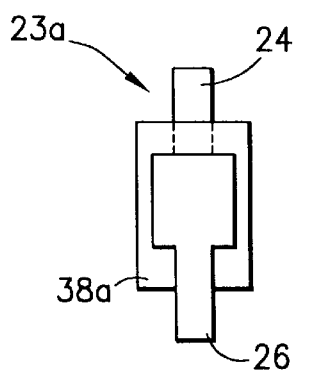
FIG. 3b shows a top view of a portion of the BAW resonator of FIG. 3a, including a protective layer 38a and electrodes 24 and 26.

FIGS. 3a and 3b show a side view of a cross-section and a top view of a cross-section, respectively, of another device, namely, a solidly-mounted BAW resonator 23a. BAW resonator 23a has a similar structure as that of the BAW resonator 20 of FIG. 1a, except that no layer 38b is provided, and the membrane 28 and the air gap 34 are replaced with an acoustic mirror 70 which acoustically isolates vibrations produced by the piezoelectric layer 22 from the substrate 36. It should be noted, however, that a membrane or tuning layer (not shown) may also be provided between the acoustic mirror 70 and the electrode 24, if needed to tune the device 23a to enable it to provide desired frequency response characteristics.

The acoustic mirror 70 may comprise an odd number of layers (e.g., from three to nine layers). The acoustic mirror 70 shown in FIG. 3a comprises three layers, namely a top layer 70a, a middle layer 70b, and a bottom layer 70c. Each layer 70a, 70b and 70c has a thickness that is, by example, approximately equal to one quarter wavelength at the center frequency of the device. The top layer 70a and bottom layer 70c are comprised of materials having low acoustic impedances such as, by example, silicon (Si), silicon-dioxide (SiO$_2$), poly-silicon, aluminum (Al), or a polymer. Also, the middle layer 70b is comprised of a material having a high acoustic impedance such as, by example, gold (Au), molybdenum (Mo), or tungsten (W) (tungsten is preferred). A ratio of the acoustic impedances of consecutive layers is large enough to permit the impedance of the substrate to be transformed to a lower value. When the piezoelectric layer 22 vibrates, the vibrations it produces are substantially isolated from the substrate 36 by the layers 70a, 70b and 70c. Being that the vibrations are isolated in this manner, and because no etching of the substrate 36 is required during the fabrication the BAW resonator 23, the substrate 36 may be comprised of various materials having low or high acoustic impedances such as, by example, Si, SiO$_2$, GaAs, glass, or a ceramic material (e.g., alumina). Also, for any of the high impedance dielectric layers described above, tantalum dioxide may be employed in lieu of the materials mentioned above.

Figure 4B:
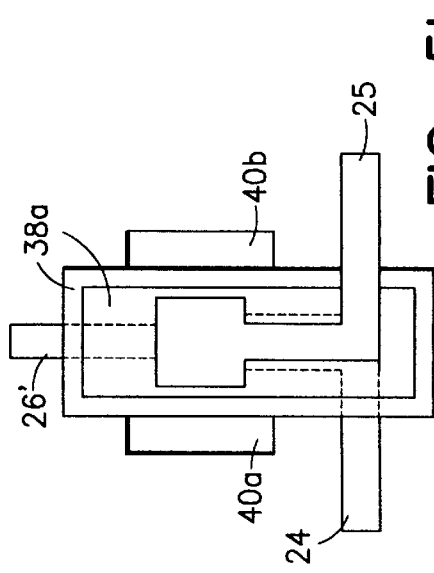
FIG. 4b shows a lumped element equivalent circuit of a BAW resonator.
Figure 4A:
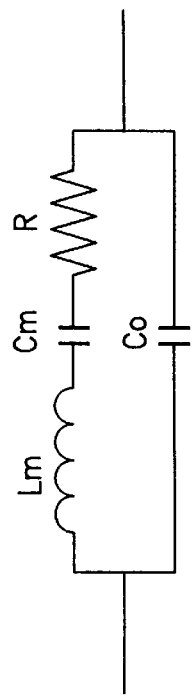
FIG. 4a illustrates a cross-section of an exemplary BAW resonator that includes a substrate having a via.

In FIG. 4a, a cross-section of another type of BAW resonator 80 is shown. The resonator 80 comprises a piezoelectric layer 22, a first, lower electrode 24, a second, upper electrode 26, a membrane 88, and a substrate 90 having a via 92. The piezoelectric layer 22, the first and second electrodes 24 and 26, and the membrane 88 form a stack that preferably has a thickness of, by example, 2 μm to 10 μm, and the substrate 90 preferably has a thickness of, by example, 0.3 mm to 1 mm. A portion of the via 92 located directly underneath the membrane 88 preferably has a length of, by example, 100 μm to 400 μm. The substrate 90 may comprise, by example, Si or GaAs. The resonator 80 functions in a similar manner as the resonator 20 described above in that both of these devices employ air interfaces to reflect acoustic vibrations produced by the piezoelectric layers 22 of the respective devices. A primary difference between these resonators 20 and 80, however, is the method employed for fabricating the respective devices. For example, for the resonator 80, after all of the layers 22, 24, 26, and 88 are formed, a portion of the substrate is then etched away from underneath the substrate 90 to form the via 92.

Each of the BAW resonators described above may be fabricated using thin film technology, including, by example, sputtering and chemical vapor deposition steps. BAW resonators exhibit series and parallel resonances that are similar to those of, by example, crystal resonators. Resonant frequencies of BAW resonators can typically range from about 0.5 GHz to 5 GHz, depending on the layer thicknesses of the devices. Also, the impedance levels of BAW resonators are a function of the horizontal dimensions of the devices.

Figure 5B:
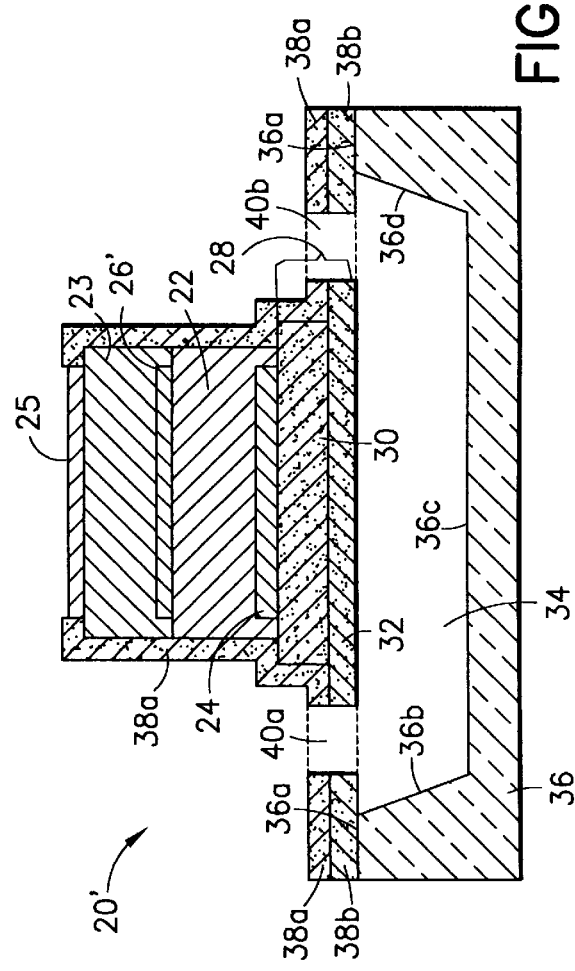
Figure 5A:
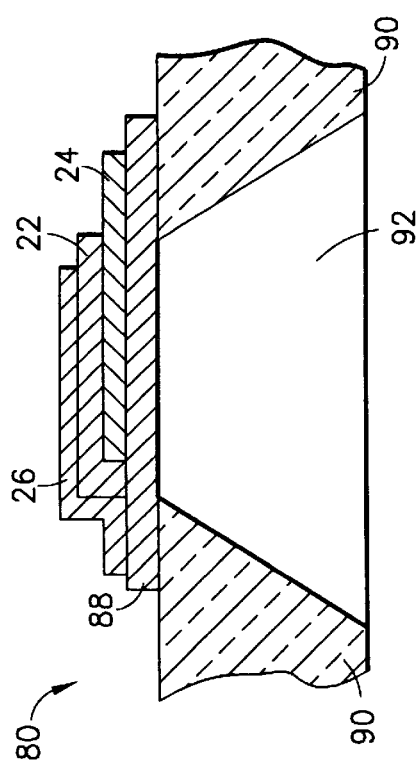
FIG. 5a illustrates a cross-section of an exemplary Stacked Crystal Filter (SCF) that includes a membrane and an air gap.

Reference will now be made to FIGS. 5a–8a, which show various embodiments of another type of BAW device, namely a Stacked Crystal Filter (SCF). FIGS. 5a and 5b show a Stacked Crystal Filter 20'. The SCF 20' is constructed of layers 36, 32, 30, 24, 22, 38a, and 38b, an air gap 34, and etch windows 40a and 40b, that are similar to those of the BAW resonator 20 described above. In addition to these layers, the Stacked Crystal Filter 20' also includes a second, middle electrode 26', which is similar to the electrode 26 of the BAW resonator 20 described above, and which is employed as a ground electrode. The SCF 20' also includes an additional piezoelectric layer 23 that is disposed over the electrode 26' and over portions of the piezoelectric layer 22. The SCF 20' further includes a third, upper electrode 25 that is disposed over a top portion of the piezoelectric layer 23. The electrodes 25 and 26' may comprise similar materials as the electrodes 24 and 26 of BAW resonator 20, and the piezoelectric layers 22 and 23 may comprise similar materials as the piezoelectric layer 22 of BAW resonator 20. Also, as can be appreciated in view of FIGS. 5a and 5b, the protective layer 38a covers portions of the piezoelectric layer 23 and the electrode 25, in addition to covering portions of the other layers of the SCF 20'. For the purposes of this description, the piezoelectric layers 22 and 23 of SCF 20' are also referred to as a first, lower piezoelectric layer 22, and a second, upper piezoelectric layer 23, respectively.

Figure 6:
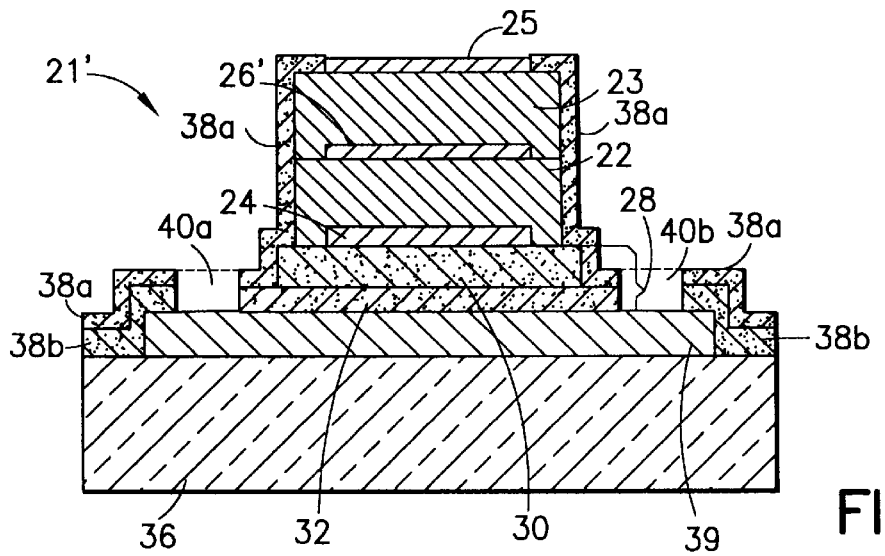
FIG. 6 illustrates a cross-section of an exemplary SCF that includes a sacrificial layer.

FIG. 6 shows a Stacked Crystal Filter 21' that is similar to that of FIGS. 5a and 5b, with an addition of a sacrificial layer 39. The sacrificial layer 39 is employed to form an air gap (not shown in FIG. 6) in a similar manner as was described above with respect to FIG. 2. The layer 32 provides protection for the piezoelectric layer 22 during the removal of the sacrificial layer 39.

Figure 7A:
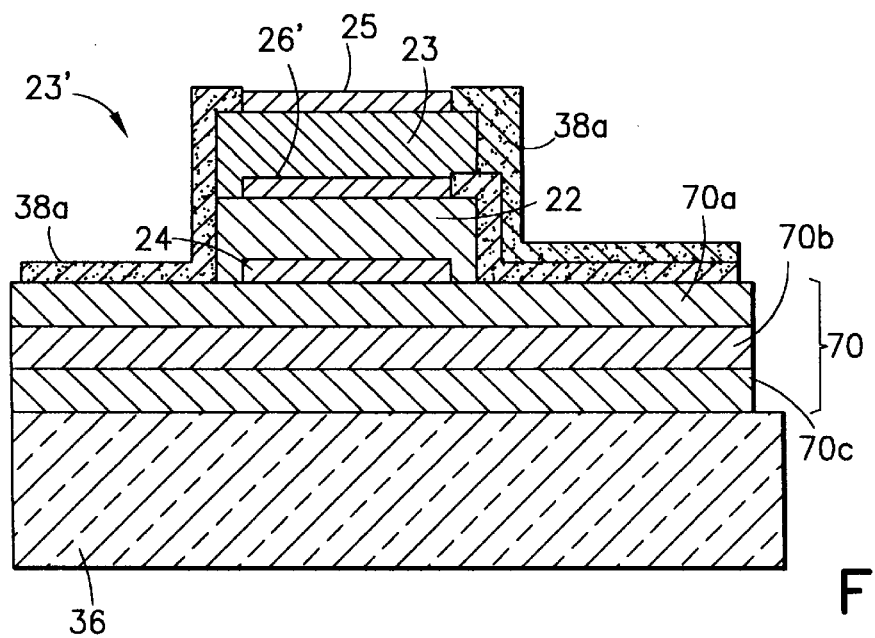
FIG. 7a illustrates a cross-section of an exemplary solidly-mounted SCF that includes an acoustic mirror.
Figure 7B:
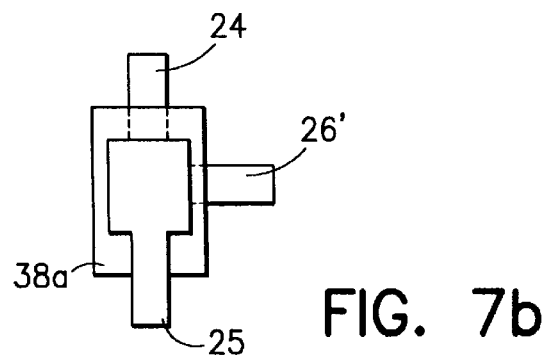

FIG. 7a shows a solidly-mounted Stacked Crystal Filter 23' that comprises layers 36, 70, 70a, 70b, 70c, 24, 22, and 38a, that are similar to those of BAW resonator 23a of FIGS. 3a and 3b. The SCF 23' also includes an additional piezoelectric layer 23, a second, middle electrode 26', and a third, upper electrode 25. The electrodes 25 and 26' may comprise similar materials as the electrodes 24 and 26 of BAW resonator 23a, and the piezoelectric layers 22 and 23 may comprise similar materials as the piezoelectric layer 22 of BAW resonator 23a. The piezoelectric layer 23 is disposed over portions of the electrode 26' and the piezoelectric layer 22, and the electrode 25 is disposed over a top surface of the piezoelectric layer 23. The electrode 26' of SCF 23' serves as a ground electrode and covers portions of the acoustic mirror 70 and the piezoelectric layer 22. Protective layer 38a covers portions of the layers 23, 25, and 26', in addition to covering other portions of the SCF 23'. FIG. 7b shows a top portion of the SCF 23', including the electrodes 24, 25 and 26', and a portion of protective layer 38a. For the purposes of this description, the piezoelectric layers 22 and 23 of SCF 23' are also referred to as a first, lower piezoelectric layer 22, and a second, upper piezoelectric layer 23, respectively. It should be noted that a membrane or tuning layer (not shown) may also be provided between the acoustic mirror 70 and the electrode 24 of the device 23', if needed for tuning the device 23' to enable it to provide desired frequency response characteristics.

Figure 8A:
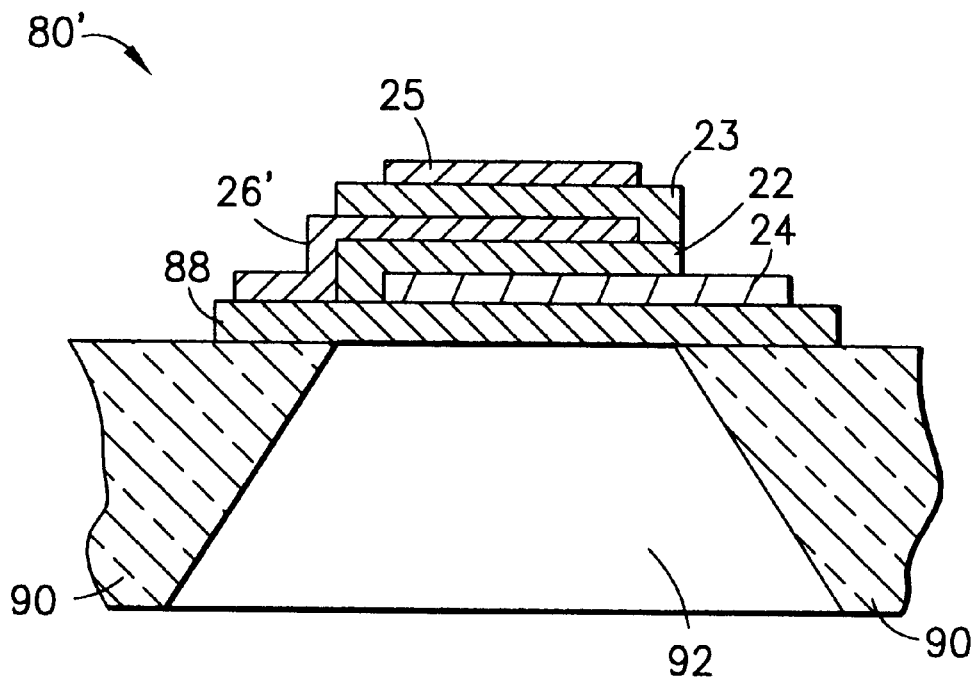
FIG. 8a illustrates a cross-section of an exemplary SCF that includes a substrate having a via.
Figure 8B:
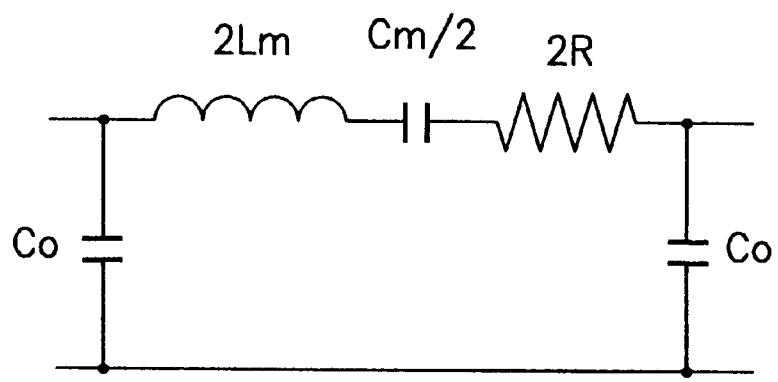
FIG. 8b shows a lumped element equivalent circuit of a SCF.
Figure 8C:
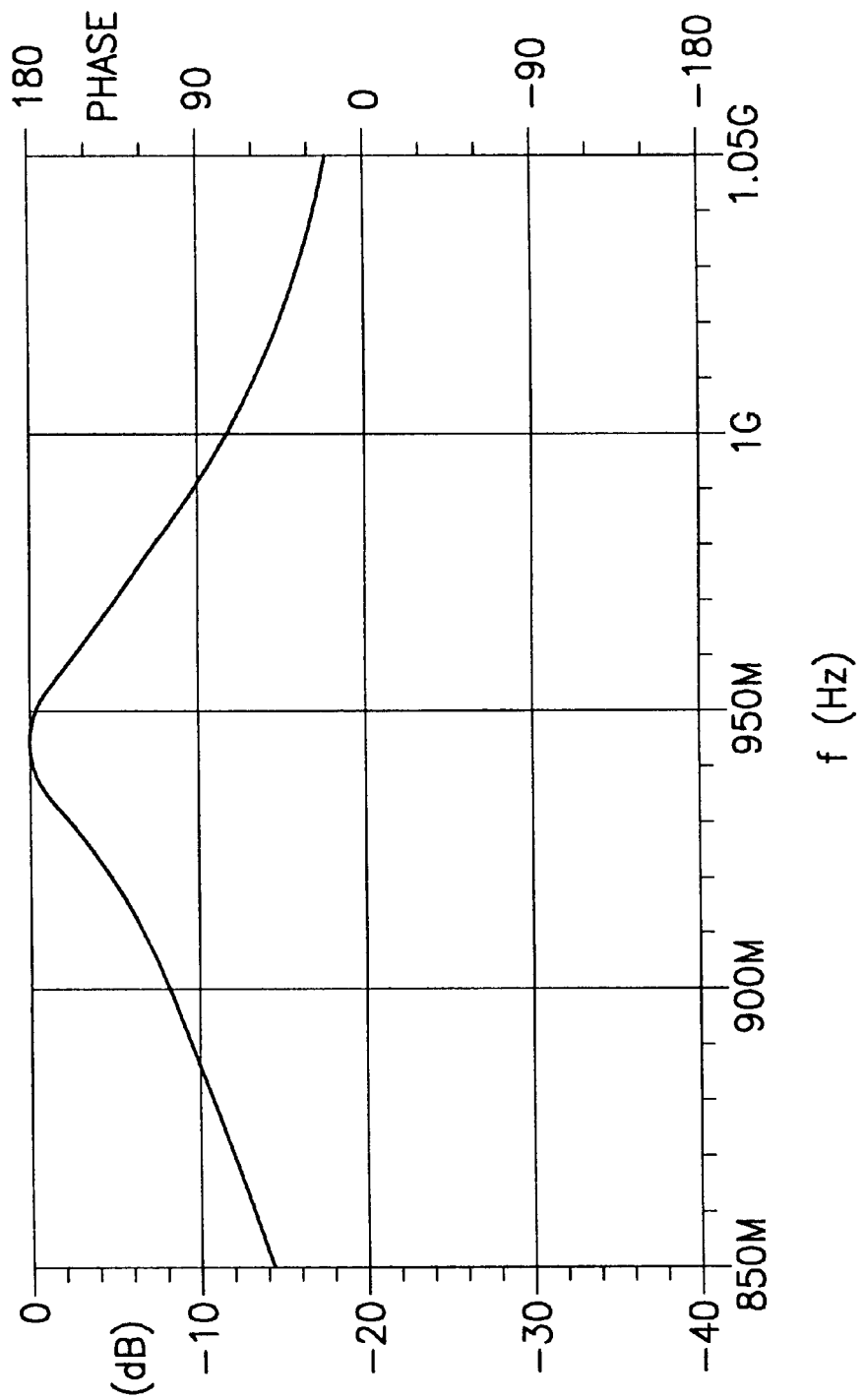
FIG. 8c shows an exemplary frequency response of a SCF.

FIG. 8a shows a Stacked Crystal Filter 80' that is comprised of a substrate 90, a membrane 88, a first, lower electrode 24, a first, lower piezoelectric layer 22, and a via 92, that are similar to those of BAW resonator 80 described above. In addition to these components, the SCF 80' also includes a second, upper piezoelectric layer 23, a second, middle electrode 26', and a third, upper electrode 25, that include similar materials as described above. The middle electrode 26' is disposed over portions of the piezoelectric layer 22 and the membrane 88. The piezoelectric layer 23 is disposed over portions of middle electrode 26' and the piezoelectric layer 22, and the third electrode 25 is disposed over the piezoelectric layer 23. The second electrode 26' of this device serves as a ground electrode.

Each of the Stacked Crystal Filters shown in FIGS. 5a–8a may be fabricated using the same substrate materials and deposition methods used to fabricate the BAW resonators of FIGS. 1a–4a. As referred to above, an equivalent circuit of a SCF is shown in FIG. 8b. Also, as was described above, SCFs are two-port devices having equivalent capacitances (Co) (see FIG. 8b), and perform similar to LC resonating circuits. SCFs exhibit a series resonance. Like the BAW resonators described above, the impedance levels of Stacked Crystal Filters are a function of the horizontal dimensions of the devices. Also like the BAW resonators described above, the fundamental (series) resonant frequency of each SCF is a function of the thickness of the layer stack (e.g., including the thicknesses of the electrodes, the piezoelectric layers, and the membrane(s), if any) disposed over the substrate of the device.

An aspect of the invention will now be described. As was described above, BAW ladder filters can exhibit passbands having deep notches and steeply-sloped passband edges. Unfortunately, however, these filters can exhibit poor stopband attenuation (e.g., out-of-band rejection) characteristics. As was also described above, Stacked Crystal Filters can generally exhibit better stopband attenuation characteristics than can be exhibited by BAW ladder filters. In view of these considerations, the inventor has determined that by providing BAW resonators connected in a ladder topology and SCFs within a single device, the desired characteristics provided by both BAW ladder filters and Stacked Crystal Filters can be provided. More particularly, the inventor has developed filters that are comprised of "series" BAW resonators, "shunt" BAW resonators, and Stacked Crystal Filters, and which exhibit frequency responses having deep notches and steeply-sloped passband edges, and which also provide overall stopband attenuation levels that are similar to those typically provided by Stacked Crystal Filters. The filters of the invention provide improved frequency responses relative to those that can be provided by, for example, individual BAW ladder filters or individual SCF devices. The filters of the invention are referred to as Bulk Acoustic Wave Resonator-Stacked Crystal Filter (BAWR-SCF) devices or circuits (or FBAR-SCF devices), and may be embodied in accordance with various topologies, including, for example, ladder filter topologies and balanced filter topologies, as will be described below. The BAW resonators of the BAWR-SCF devices of the invention may be similar to any of those described above and shown in FIGS. 1a–4a, and the SCFs of the BAWR-SCF devices may be similar to any of those described above and shown in FIGS. 5a–8a.

Before describing the various embodiments of the BAWR-SCF devices of the invention, an aspect of the invention relating to the performance and fabrication of these devices will first be considered. As was described above, SCFs and BAW resonators exhibit resonant frequencies that are a function of the thicknesses of the layer stacks (e.g., including the electrodes, the piezoelectric layers, and the membrane(s), if any) of the respective devices. As was also described above, within a typical BAW ladder filter, the series-connected BAW resonators are constructed so as to yield a series resonance at a frequency that is approximately equal to, or near, the "design" (or desired) center frequency of the filter, and also to yield a parallel resonance which causes the filter to exhibit a notch above the upper edge of the filter's passband. Also, the parallel-connected BAW resonators are constructed so as to yield a parallel resonance at a frequency that is approximately equal to, or near, the "design" center frequency of the filter, and also to yield a series resonance which causes the filter to exhibit a notch below the lower edge of the filter's passband. In BAW ladder filters, the series-connected BAW resonators preferably include somewhat thinner layer stacks than the parallel-connected resonators, thereby enabling the parallel resonances of the series-connected BAW resonators to occur at higher frequencies than the series resonant frequencies of the parallel-connected BAW resonators (and thus enabling the upper and lower passband notches to be formed). The difference in the layer stack thicknesses of the series and parallel BAW resonators may be provided by, for example, including additional layers (e.g., membrane layers) in the parallel BAW resonators, or by including, in the parallel BAW resonators, layers having greater thicknesses than the respective layers of the series BAW resonators. Which manner of providing the difference in the layer stack thicknesses is employed depends on various considerations such as, for example, applicable design requirements, fabrication techniques being employed (e.g., a procedure which allows for easiest device fabrication is preferred), etc. In accordance with the invention, each of these design aspects relating to the BAW resonators of BAW ladder filters are also provided with respect to the BAW resonators of the BAWR-SCF devices to be described below. That is, for each of the BAWR-SCF devices to be described below, the "series-connected" BAW resonators preferably have thinner layer stacks than do the "parallel-connected" BAW resonators, thereby enabling the BAWR-SCF devices to yield a passband having an upper notch at the frequency of the parallel resonances of the series-connected BAW resonators, and a lower notch at the frequency of the series resonances of the parallel-connected BAW resonators.

Each series-connected BAW resonator of each BAWR-SCF circuit preferably has a layer stack having a thickness that is similar to that of the layer stacks of the other series-connected BAW resonators (if any) included in the BAWR-SCF circuit. Similarly, each parallel-connected BAW resonator of each BAWR-SCF circuit preferably has a layer stack having a thickness that is similar to that of the layer stacks of the other parallel-connected BAW resonators (if any) included in the BAWR-SCF circuit. The manner in which the particular thicknesses of the BAW resonator layer stacks are chosen to yield the desired frequency response characteristics (e.g., the desired center frequency, passband bandwidth, level of insertion loss, level of out-of-band rejection, passband ripple amplitude, notch depths, passband edge slopes, etc.) may be in accordance with any suitable technique. As such, aspects relating to the design of the BAW resonators of the BAWR-SCF devices to be described below will not be further described below in the descriptions of all of the devices.

In accordance with another aspect of the invention, the SCFs of each BAWR-SCF circuit may be fabricated to have layer stacks of thicknesses that enable the SCFs to yield either a fundamental (series) resonant frequency or a second harmonic (series) resonant frequency at or near the "design" center frequency of the BAWR-SCF circuit. As can be appreciated, the layer stack thicknesses of the SCFs will differ in each case. This difference in layer stack thicknesses is preferably provided by a difference in the thicknesses of the piezoelectric layers of the stacks, although the difference may also be provided by differences in the thicknesses of the remaining layers of the stacks. Which one of these "layer differences" is employed, however, may depend on various considerations, such as applicable design requirements, the relative ease of device fabrication for each case (e.g., it is preferred that device fabrication be as simple as possible), etc. By example, in cases in which ease of device fabrication is a concern, it is preferable that the "difference" in the layer stack thicknesses be provided by a "difference" in the piezoelectric layers, and that the upper, middle, and lower electrodes of the SCF devices of each BAWR-SCF circuit have similar thicknesses as each electrode of the BAW resonators of the BAWR-SCF device, since this allows for simplified device fabrication (as will be further described below). However, it should be noted that, in practice, design, manufacturing, and/or other requirements, as well as possible imperfections in the fabrication process, may make it necessary to fabricate the SCF devices so that at least one of the electrodes of each SCF has a different thickness than the electrodes of the BAW resonators, as will be further described below. It should also be noted that, in cases in which the series and shunt BAW resonators are constructed to include membrane layers, it is preferred that the SCFs also be constructed to include membrane layers. For cases in which the shunt BAW resonators include thicker membrane layers than the series BAW resonators (to provide the upper and lower passband notches), the SCFs may be constructed to include a membrane layer having a thickness that is similar to the membranes of either the series or shunt BAW resonators, depending on, for example, applicable design criteria and fabrication techniques employed (e.g., it is preferred that the fabrication process be as simple as possible). Moreover, in cases in which the shunt BAW resonators are constructed to include a membrane layer, and where the series BAW resonators are constructed so as to not include a membrane layer, the SCIs may be constructed to either include or not include a membrane layer, depending on, for example, applicable design criteria and fabrication techniques employed (e.g., it is preferred that fabrication be as simple as possible). In either of these cases, and as was described above, the SCFs of each BAWR-SCF circuit are fabricated to have overall layer stack thicknesses that enable the SCFs to yield either a fundamental (series) resonant frequency or a second harmonic (series) resonant frequency at or near the "design" center frequency of the BAWR-SCF circuit.

The relationship between the thicknesses of the piezoelectric layers of SCFs and BAW resonators of a BAWR-SCF circuit, with regard to whether the SCF yields a fundamental resonance or a second harmonic resonance at the center frequency of the BAWR-SCF circuit, may be further understood in view of FIGS. 9b–9e.

Figure 9A:
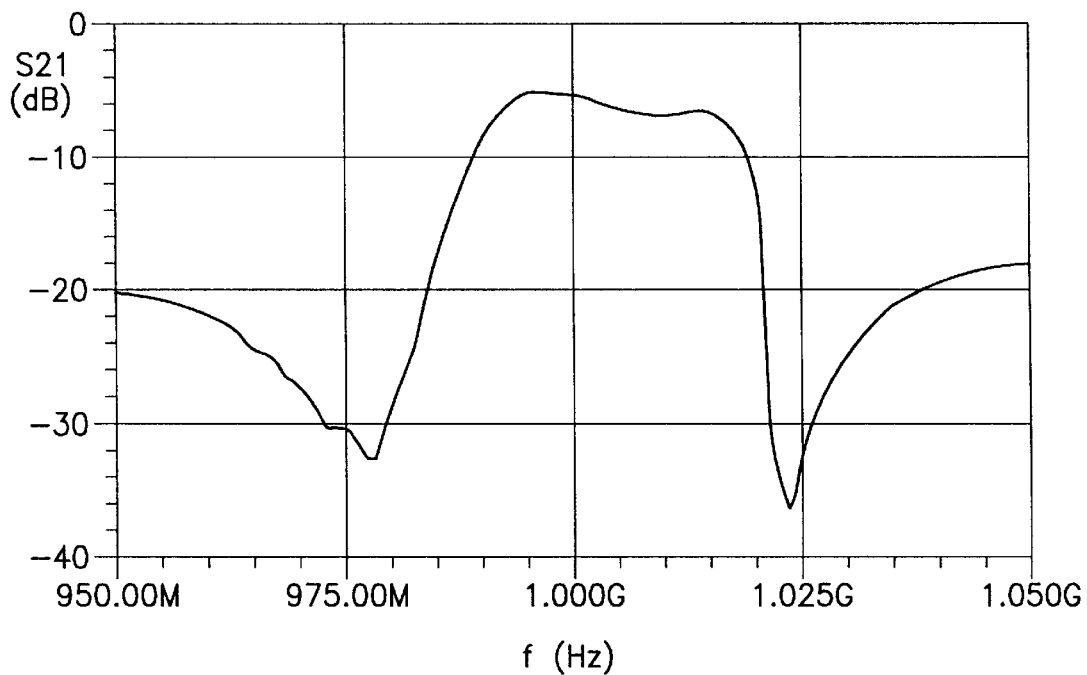
FIG. 9a shows an exemplary frequency response of a ladder filter that includes four BAW resonators and no tuning elements, in accordance with the prior art.
Figure 9B:
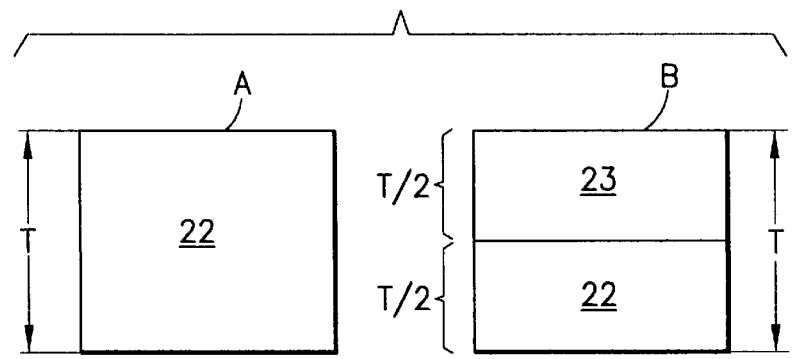
FIG. 9b shows a piezoelectric layer 22 of a BAW resonator (A), and a pair of piezoelectric layers 22 and 23 of a SCF (B), wherein the piezoelectric layer 22 of BAW resonator (A) has a thickness of T, and wherein each piezoelectric layer 22 and 23 of BAW resonator (B) has a thickness of T/2.
Figure 9C:
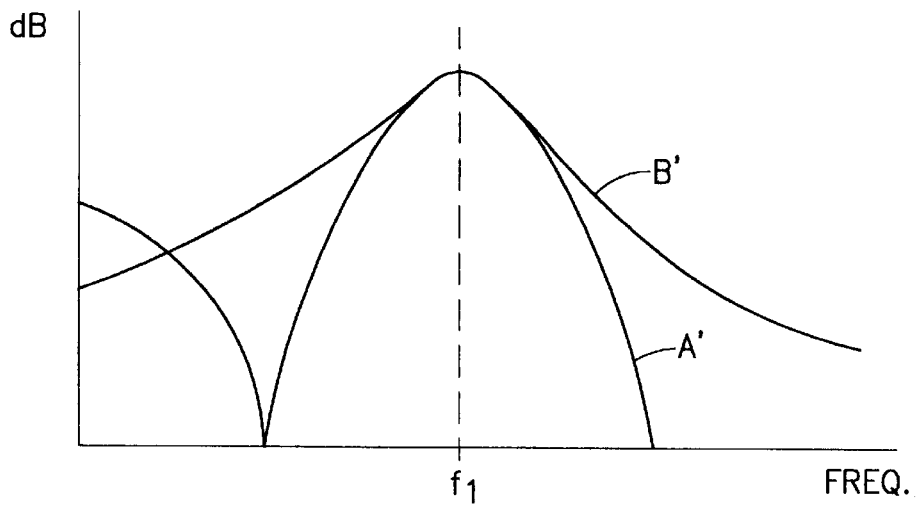
FIG. 9c shows an exemplary frequency response (A') of a filter that includes BAW resonators connected in a ladder configuration, wherein the BAW resonators of the filter include the piezoelectric layer 22 of FIG. 9b.

FIG. 9b illustrates a piezoelectric layer 22 of a layer stack of an individual BAW resonator (A) (for convenience, the other layers of resonator (A) are not shown), and piezoelectric layers 22 and 23 of a layer stack of an individual SCF (B) (for convenience, the other layers of SCF (B) are not shown), for a case in which the layer 22 of the BAW resonator (A) has a thickness of (T), and the layers 22 and 23 of the SCF (B) each have respective thicknesses of (T/2). FIG. 9c shows an exemplary frequency response (A') of a BAW ladder filter, assuming that BAW resonators of the ladder filter each include a piezoelectric layer having a thickness of (T). The frequency response (A') has a center frequency $(f_1)$. Also, the individual SCF (B) having the piezoelectric layers 22 and 23 of FIG. 9b yields a frequency response (B') and a fundamental resonant frequency of $(f_1)$.

Figure 9D:
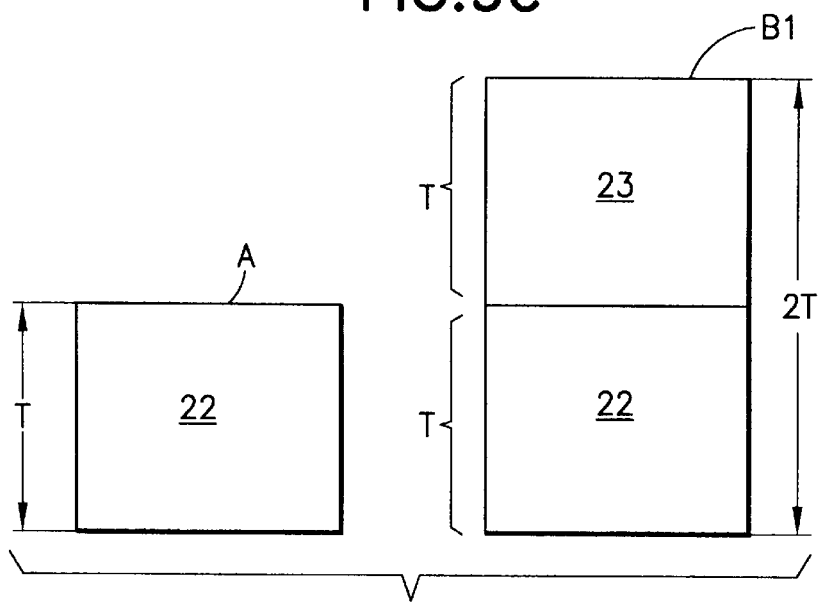
FIG. 9d shows the piezoelectric layer 22 of the BAW resonator (A) of FIG. 9b, and also shows a pair of piezoelectric layers 22 and 23 of a SCF (13), wherein the piezoelectric layer 22 of BAW resonator (A) and the piezoelectric layers 22 and 23 of SCF (B1) each have respective thicknesses of T.
Figure 9E:
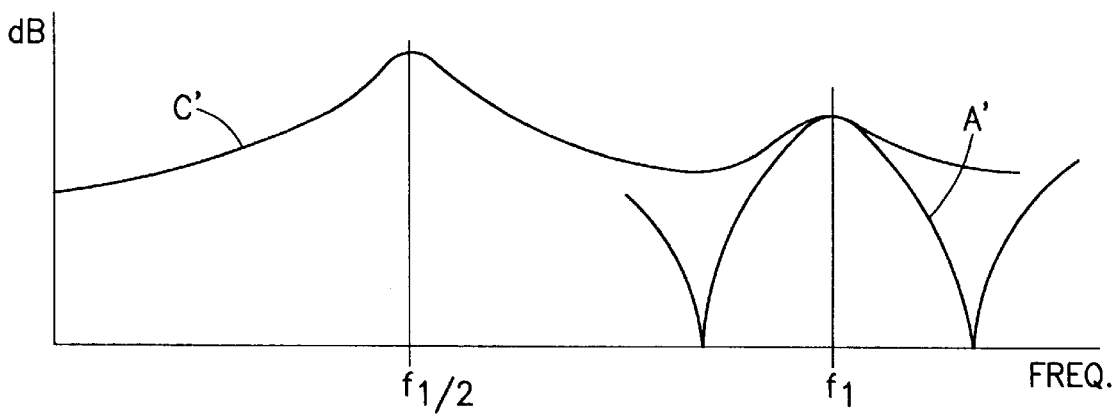
FIG. 9e shows a portion of the exemplary frequency response (A') of FIG. 9c, and also shows an exemplary frequency response (C') of a SCF that includes the piezoelectric layers 22 and 23 of FIG. 9d.

FIG. 9d illustrates the piezoelectric layer 22 of the individual BAW resonator (A), and piezoelectric layers 22 and 23 of an individual SCF (B1), for a case in which the layer 22 of the BAW resonator (A), and the layers 22 and 23 of the SCF (B1) each have respective thicknesses of (T). The SCF (B1) yields a frequency response (C') having a second harmonic resonance at the frequency $(f_1)$, and a fundamental resonance at the frequency $(f_{1/2})$, as shown in FIG. 9e. A portion of the frequency response (A') is also shown in FIG. 9e, wherein the passband is centered at frequency $(f_1)$.

Preferably, the BAWR-SCF devices of the invention are constructed so that the SCFs yield a second harmonic resonance, rather than a fundamental resonance, at approximately the center frequency of the respective BAWR-SCF devices. This is because the BAWR-SCF devices are easier to fabricate in the case in which the SCFs yield the second harmonic resonance at approximately the center frequency of the respective devices. By example, for the case in which the SCFs are constructed to yield a fundamental resonance at the center frequency of a BAWR-SCF device, each of the respective stack layers of the respective BAW resonators and SCFs, up to and including the lower electrode layers of the respective BAW resonators and SCFs, may be deposited and formed simultaneously. However, because the piezoelectric layers of the SCFs have different thicknesses than the piezoelectric layers of the BAW resonators in this case, the piezoelectric layers of the BAW resonators and the SCFs cannot be deposited simultaneously. Indeed, in this case the upper piezoelectric layer of the SCFs needs to be deposited on the lower layers of the SCFs either before or after the deposition of the single piezoelectric layer of the BAW resonators. As can be appreciated, this can complicate the fabrication process, and requires the performance of masking steps.

For the case in which each BAWR-SCF device is fabricated so that the SCFs yield a second harmonic at approximately the center frequency of the BAWR-SCF circuit, however, the respective layers of the BAW resonators and the SCFs, at least up to and including the piezoelectric layer of the BAW resonators and the lower piezoelectric layer of the SCFs, can be deposited simultaneously during fabrication, since these piezoelectric layers have similar thicknesses (an example of steps for fabricating one of the BAWR-SCF devices of the invention will be described below). As can be appreciated, in this case fabrication is easier. It should be noted that, if desired, the BAWR-SCF circuits may also be fabricated so that the SCFs exhibit other harmonic resonant frequencies, besides the fundamental and second harmonic resonant frequencies, at approximately the "design" center frequency of the respective BAWR-SCF devices.

Another aspect of the invention relating to the performance and fabrication of the BAWR-SCF devices of the invention, with respect to the operation of the SCF devices at their second harmonic resonant frequencies, will now be considered. As was described above, in order to simplify fabrication of the BAWR-SCP circuits of the invention, it is preferred that the lower, middle, and upper electrodes of the SCF devices of the BAWR-SCF circuits have similar thicknesses as each electrode of the BAW resonators of the respective BAWR-SCF circuits. Although the SCFs include three electrode layers, whereas the BAW resonators include only two electrode layers, the additional SCF electrode layer, which may have a thickness of, for example, approximately 200 nm, generally does not cause the SCFs to yield resonant frequencies that vary from the desired center frequency of the BAWR-SCF circuits by an unacceptably large frequency differential (e.g., a differential that can undesirably affect the performance of the BAWR-SCF device). However, and as was also described above, in practice it may be necessary to fabricate the SCF devices so that one or more of the electrodes of the SCF devices have substantially different thicknesses than the BAW resonator electrodes, in order to satisfy applicable design/manufacturing criteria and/or other requirements (e.g., manufacturing limitations on the overall thickness of one of the electrodes of the SCFs). Also, possible imperfections in the fabrication process may cause one or more stack layers to have a thickness that differs from a "design" thickness by a certain amount. As these imperfections and/or differences in thickness can cause the SCFs to yield second harmonic frequencies that are offset from the center frequencies of the respective BAWR-SCF circuits by an unacceptably large frequency differential, it may be necessary to "compensate" for this frequency differential by fabricating each SCF so that its layer stack thickness is "optimized" to enable the correct resonant frequency to be provided. In these cases, it is preferred that the "compensation" be provided by an optimization of the thicknesses of the middle or upper electrode of the SCFs rather than by an optimization of the thicknesses of the other SCF stack layers (e.g., the piezoelectric layers). This is because in the preferred case each of the respective lower electrodes of the BAW resonators and the SCFs, as well as the respective piezoelectric layers of the BAW resonators and the respective lower piezoelectric layers of the SCFs, may be deposited simultaneously (since they have similar thicknesses), whereas if a layer other than the middle or upper electrode were "optimized", fabrication would be more difficult (since the optimized layer would likely have a different thickness than the same respective layers of the BAW resonators of the BAWR-SCF circuit). Also, unlike electrode layers, which generally include materials that can be easily fabricated to have precise thicknesses, piezoelectric materials in general can be difficult to fabricate to a precise thickness. Moreover, the fabrication process is generally easier in cases in which both of the piezoelectric layer have similar thicknesses (i.e., deposition period durations and process parameters are similar in this case) instead of different thicknesses.

The precise thickness of the layer chosen to be "optimized" for enabling the SCF to yield a desired resonant frequency may be selected in accordance with any suitable, known technique. Which one of the upper and middle electrodes is optimized may depend on various considerations including, by example, the degree of precision of the fabrication methods and equipment employed, and the types of material used in the electrodes. For the case in which the thicknesses of the upper electrodes of the SCFs are optimized, and where the middle and lower electrodes of the SCFs are constructed to have thicknesses that are similar to the BAW resonator electrode thicknesses, the respective stack layers of the BAW resonators and the SCFs, up to and including the top electrodes of each BAW resonator and the middle electrodes of each SCF, may be fabricated simultaneously.

It should by noted that, in some cases, the thicknesses of other SCF stack layers besides the electrode layers may need to be optimized for enabling the SCFs to yield the desired resonant frequency. By example, assuming that applicable design criteria require that the electrodes of the SCFs be very thick relative to the BAW resonator electrode thicknesses, and that this would cause the SCFs to yield a second harmonic resonant frequency that is offset from the desired BAWR-SCF circuit center frequency by an unacceptable large frequency differential, the thickness of one of the piezoelectric layers and/or the membrane layers can be optimized (e.g., reduced) to enable the SCFs to provide the desired resonant frequency.

The BAWR-SCF circuits to be described below may be fabricated as monolithic integrated circuits or may be fabricated to include BAW resonator and SCF components formed on separate respective wafers. Also, and as was described above, the BAWR-SCF circuits to be described below may include any of the various types of BAW resonators described above and shown in FIGS. 1a–4a, and any of the various types of SCFs described above and shown in FIGS. 5a–8a. For example, each BAW resonator and SCF may include "bridge" structures (i.e., one or more membrane layers) like the BAW resonator 20 of FIG. 1a and the SCF 20' of FIG. 5a. Also by example, each BAW resonator and SCF may be a solidly-mounted device (a device that includes an acoustic mirror) similar to the ones shown in FIGS. 3a and 7a, respectively. If acoustic mirror devices are employed, the shunt BAW resonators of the respective BAWR-SCF circuit preferably include a membrane layer between the top acoustic mirror layer and the lower electrode layer to enable the shunt BAW resonators to provide a notch below the BAWR-SCF circuit's passband, in the manner described above.

The use of acoustic mirror devices in the BAWR-SCF circuits offers a number of advantages over the use of other types of devices such as, by example, those that include bridge structure, in the BAWR-SCF circuits. One advantage is that the acoustic mirror devices are structurally more rugged than the other types of devices. Another advantage is that, in high power applications, any heat that may be generated due to losses in the devices is conducted efficiently to the substrates of the respective devices via the acoustic mirrors.

A further advantage of using acoustic mirror devices in the BAWR-SCF circuits of the invention is that the acoustic mirrors can help to attenuate any unwanted harmonic responses that may be produced within the BAWR-SCF devices. This may be further understood in view of the following example. In this example, it is assumed that in the BAWR-SCF devices described below, the piezoelectric layers of each SCF each have a thickness that is equal to the thickness of the individual piezoelectric layer of the respective BAW resonators, and that, as a result, each SCF exhibits a second harmonic resonance at a center frequency of the BAWR-SCF device. It is also assumed that the BAW resonators and the SCFs of the BAWR-SCF devices include acoustic mirror layers, and that each acoustic mirror layer has a thickness of one-quarter wavelength (e.g, $\lambda/4$) at the center frequency of the respective BAWR-SCF device. In this case, each SCF exhibits a fundamental resonance at a frequency which is approximately equal to one-half of the center frequency of the BAWR-SCF device, and thus may cause a spurious response at this frequency. At the fundamental resonant frequency of the SCF, the thickness of each acoustic mirror layer is $\lambda/8$. As can be appreciated by those skilled in the art, at this frequency the amount of acoustic energy which is reflected back towards the bottom piezoelectric layer of the SCF by the interface between the top layer of the acoustic mirror and the lower electrode of the SCF is small. As a result, the spurious response of the SCF at its fundamental resonant frequency becomes attenuated. In cases in which the BAWR-SCF circuit includes "bridge" type structures instead of acoustic mirror structures, external matching circuitry may be employed to attenuate any spurious responses that may occur at the fundamental resonant frequency of the SCF, although at least some attenuation is also provided by the BAW resonators of the BAWR-SCF device.

As another example, it is assumed that each piezoelectric layer of the SCF has a thickness which is equal to one-half of the thickness of each individual piezoelectric layer of the BAW resonators, and that, as a result, the SCF exhibits a fundamental resonance at the center frequency of the BAWR-SCF circuit. In this case, harmonic resonances of the SCF and the BAW resonators of the BAWR-SCF circuit may cause spurious responses, although no spurious responses can occur at frequencies that are lower than the BAWR-SCF circuit's center frequency. By example, spurious responses may occur at the second harmonic resonant frequencies of the SCF and the BAW resonators. At the second harmonic resonant frequency of the SCF, the acoustic mirror layers of the SCF have a thickness which is equal to λ/2 and no impedance transformation of the substrate of the device occurs at the interface between the top acoustic mirror layer and the lower electrode. As a result, acoustic energy is not reflected by this interface away from the substrate and back towards the piezoelectric layers, but is instead propagated to the substrate. This causes the spurious response of the SCF at its second harmonic resonant frequency to become attenuated.

Another consideration relating to the fabrication of the BAWR-SCF devices of the invention will now be described. Thin film devices that include BAW components (e.g., BAW resonators or SCFs) often include one or more vias. At least one of these vias may be employed to contain an electrically conductive material for enabling a lower or middle electrode of one BAW component to be electrically coupled to another component such as, for example, an upper electrode of another resonator of the device, an external circuit (e.g., bonding wires coupled to a wiring substrate), or a contact pad or terminal (also referred to as a node) of the device. In some cases, it may not be required to provide these vias if the BAW components are coupled to one another through their upper electrodes or through their lower electrodes, or in cases in which a BAW component is coupled to, for example, an external circuit or contact pad, through the component's upper electrode.

As vias can increase the series resistance within a filter, and can take up area within the filter, it is preferable that the number of vias included in the filter be as few as possible. Therefore, it is also preferable that the filter include a minimum number of connections between BAW component lower and middle electrodes, between BAW component lower and upper electrodes, between BAW component middle and upper electrodes, and between BAW component lower or middle electrodes and filter contact pads or external circuits.

Figure 8D:
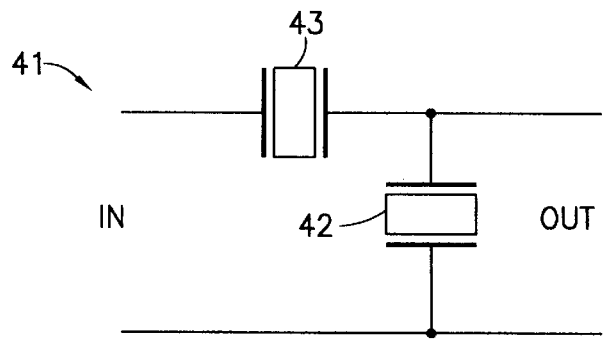
FIG. 8d shows a circuit diagram of an exemplary BAW ladder filter that includes two BAW resonators, and which is constructed in accordance with the prior art.
Figure 8E:
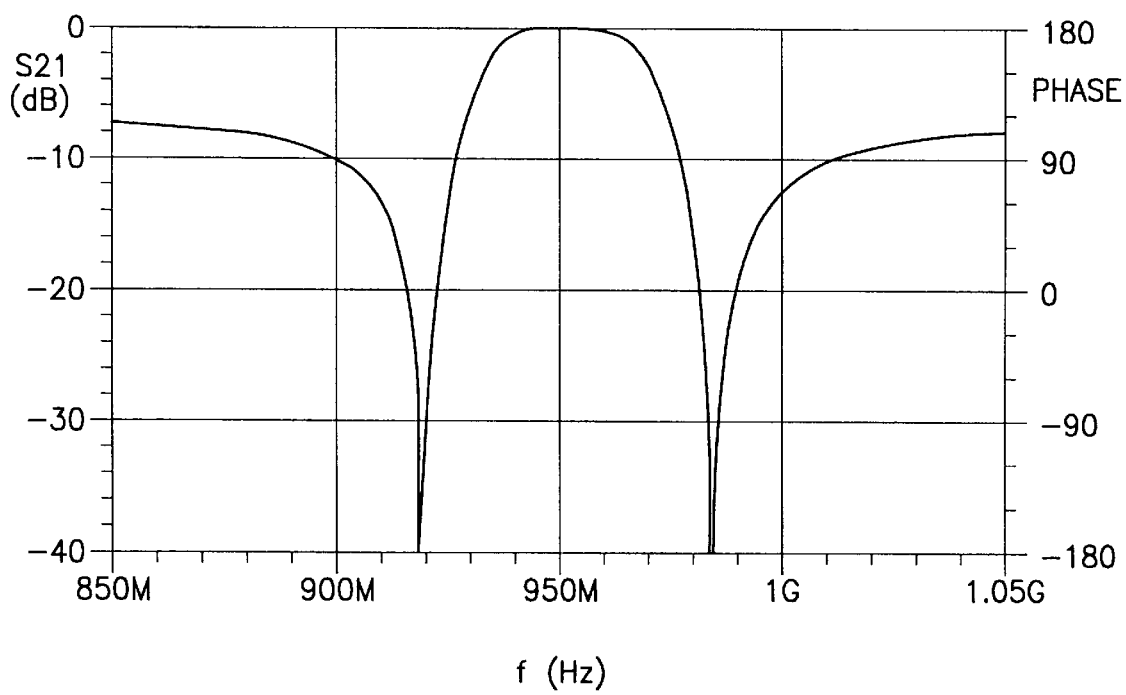
FIG. 8e shows an exemplary frequency response of the BAW ladder filter of FIG. 8d.
Figure 8F:
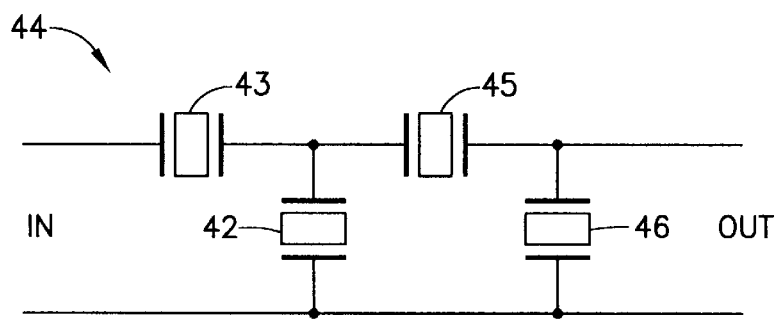
FIG. 8f shows a circuit diagram of an exemplary BAW ladder filter that includes four BAW resonators, and which is constructed in accordance with the prior art.
Figure 8G:
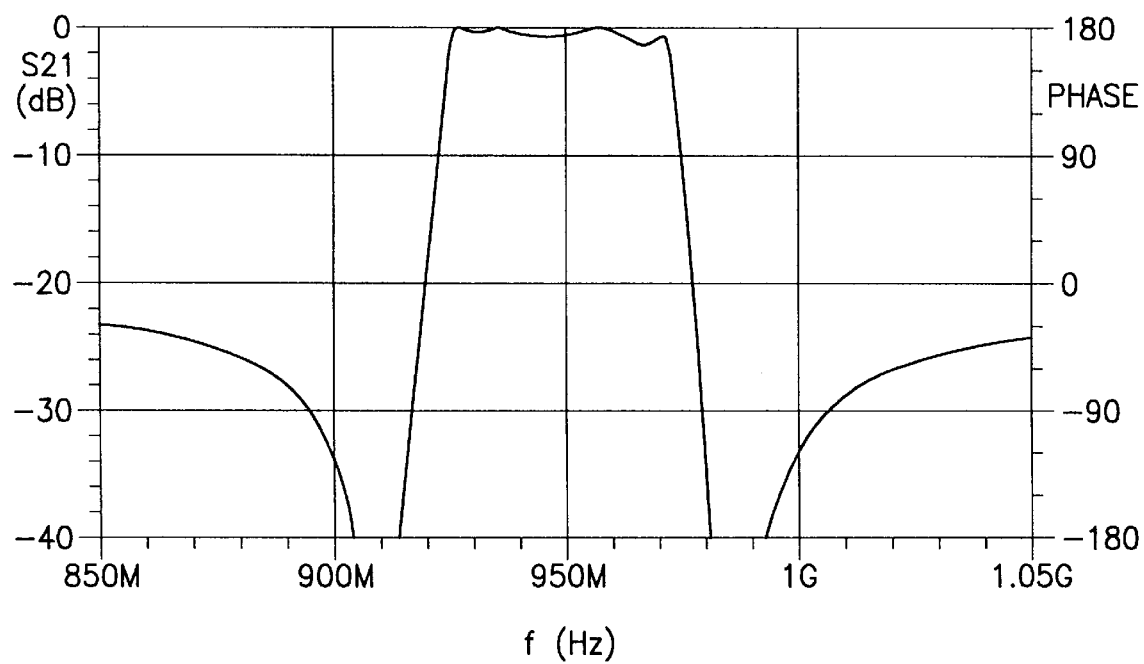
FIG. 8g shows an exemplary frequency response of the BAW ladder filter of FIG. 8f.
Figure 8H:
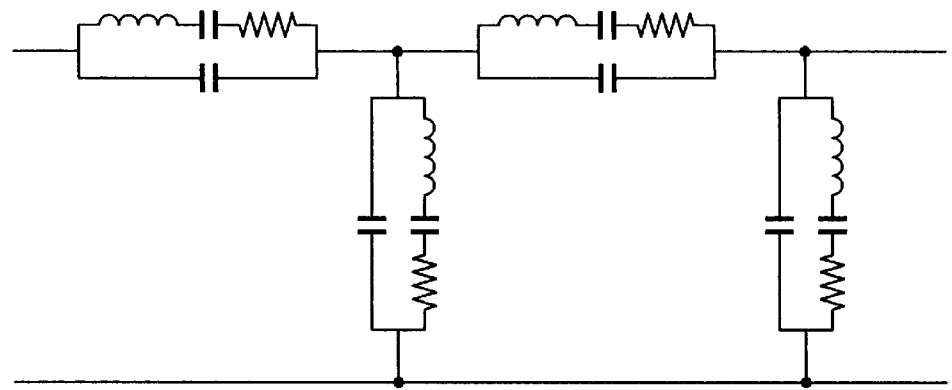
FIG. 8h shows a lumped element equivalent circuit of the BAW ladder filter of FIG. 8f.
Figure 9F:
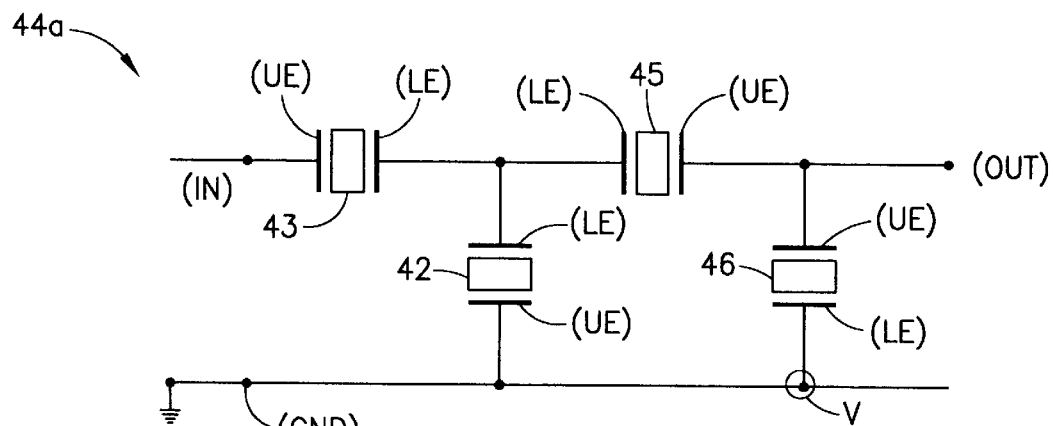
FIG. 9f shows the, BAW ladder filter of FIG. 8f having a topology that requires a via (V) to be provided in the filter.

As an example, and referring to FIG. 9f, a circuit diagram of a BAW ladder filter 44a is shown that is similar to the one shown in FIG. 8f. In FIG. 9f, the resonators 42, 43, 45, and 46 are connected within the filter 44a in a manner so that an upper electrode (UE) of BAW resonator 43 is coupled to an input node (In) of the filter 44a, upper electrodes (UE) of the BAW resonators 45 and 46 are coupled to output node (Out) of the filter 44a, and lower electrode (LE) of BAW resonator 46 is coupled to a node (GND) which is normally grounded. In this manner, it is necessary to provide only a single via between the lower electrode (LE) of BAW resonator 46 and ground node (GND) in the structure of filter 44a. This via is represented in the circuit diagram of FIG. 9f by the label "V". The interconnections between the remaining electrodes (LE) and (UE) of the BAW resonators 42, 43, 45, and 46 are also shown in FIG. 9f.

Figure 9G:
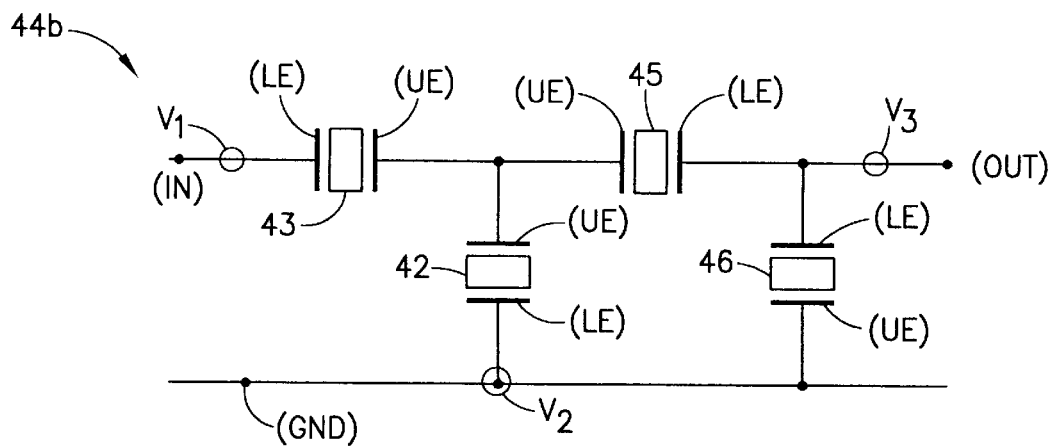
FIG. 9g shows the BAW ladder filter of FIG. 8f having a topology that requires vias (V1), (V2) and (V3) to be provided in the filter.

As another example, and referring to FIG. 9g, a circuit diagram of a BAW ladder filter 44b is shown that is similar to filter 44a of FIG. 9f. However, in the filter 44b, the BAW filters 42, 43, 45, and 46 are arranged in the filter 44 so that the lower electrode (LE) of the BAW resonator 43 is coupled to the input node (In), the lower electrode (LE) of the BAW resonator 42 is coupled to the ground node (GND), and the lower electrodes (LE) of the BAW resonators 45 and 46 are coupled to the output node (Out). With this arrangement, three vias V1, V2, and V3 need to be provided in the filter structure. As can be appreciated, the topology of filter 44a is preferred over that of filter 44b since the filter 44a includes a smaller number of vias than the filter 44b.

Figure 8I:
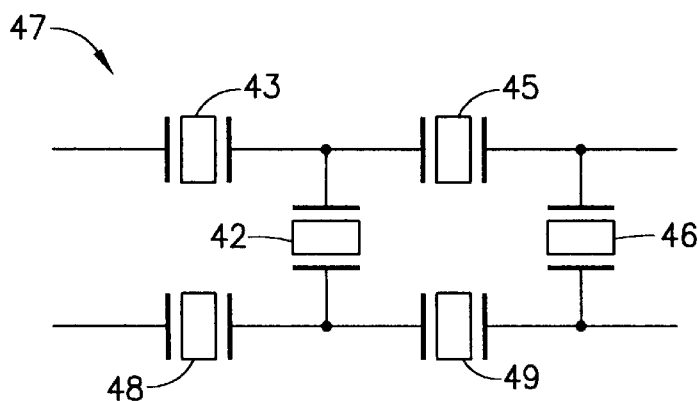
FIG. 8i shows a schematic diagram of an exemplary "balanced" ladder filter that is constructed in accordance with the prior art.
Figure 8J:
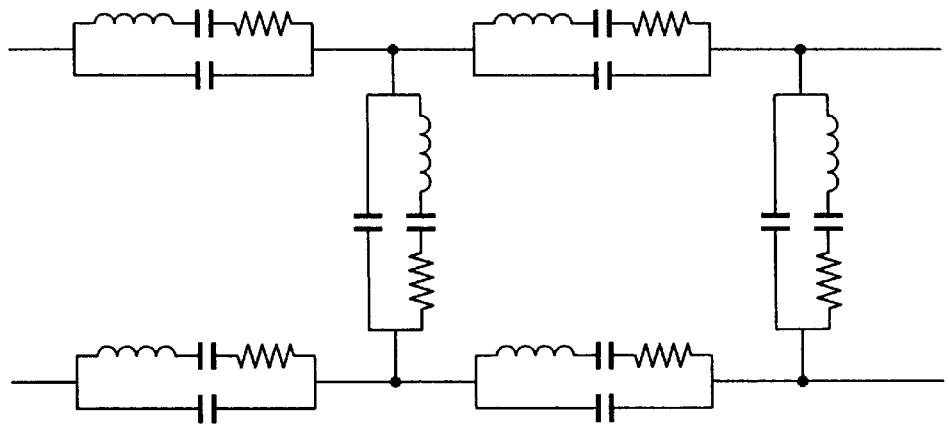
FIG. 8j shows a lumped element equivalent circuit of the balanced ladder filter of FIG. 8i.
Figure 9H:
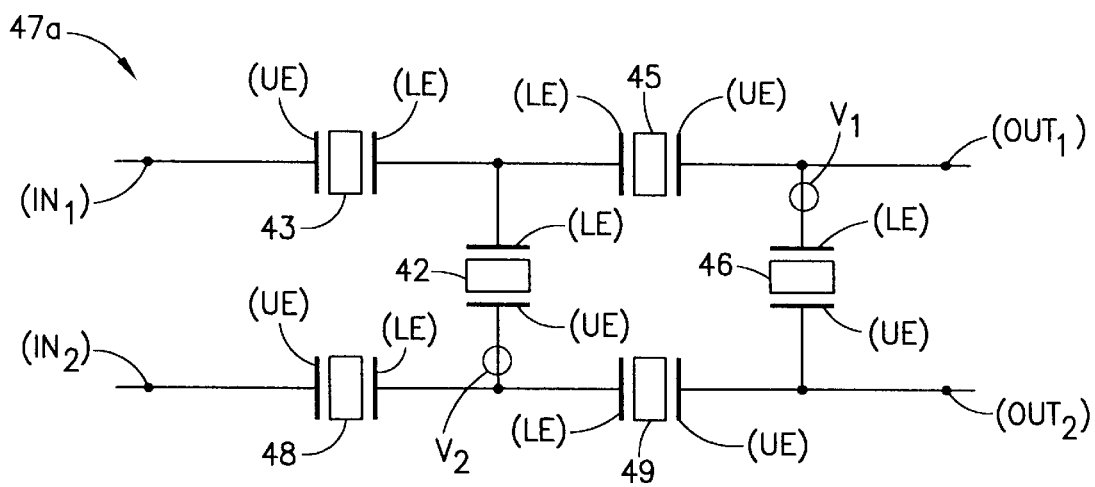
FIG. 9h shows the balanced filter of FIG. 8i having a topology that requires vias (V1) and (V2) to be provided in the filter.

As a further example, FIG. 9h shows a balanced filter 47a that is similar to balanced filter 47 of FIG. 8i. In this example, the BAW resonators 42, 43, 45, 46, 48, and 49 are connected within the filter 47a in a manner so that upper electrode (UE) of BAW resonator 43 is coupled to input node (In1), upper electrode (UE) of BAW resonator 48 is coupled to input node (In2), upper electrodes (UE) of the BAW resonators 46 and 49 are coupled to output node (Out2), and upper electrode (UE) of BAW resonator 45 and lower electrode (LE) of BAW resonator 46 are coupled to output node (Out1). With this configuration, it is necessary to provide only two vias in the filter 47a, namely a via V1 and a via V2.

In the various embodiments of the BAWR-SCF device to be described below, the BAW resonators and SCFs of these devices are preferably arranged in a manner which permits there to be a minimum number of vias in the structures of the respective devices.

Figure 10A:
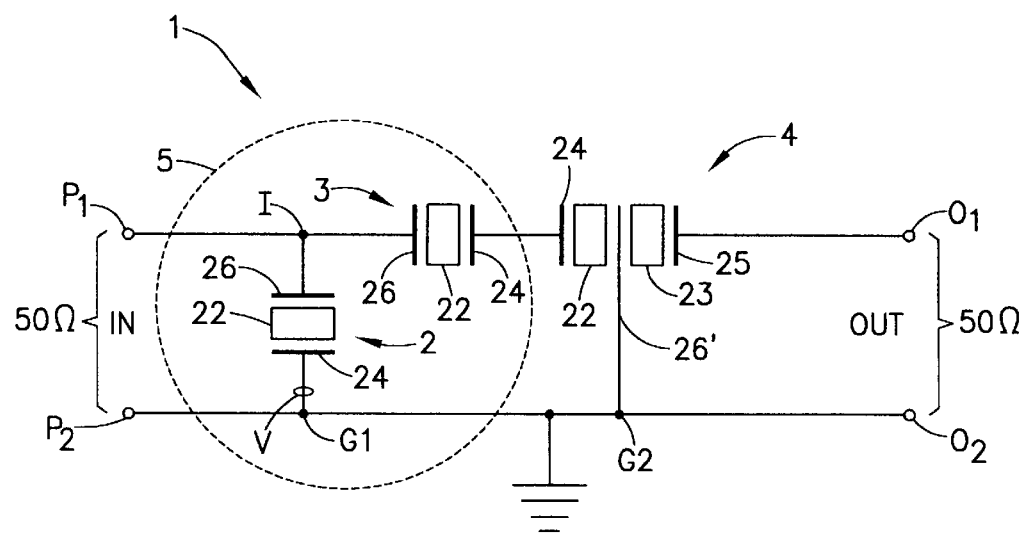
FIG. 10a illustrates a circuit diagram of a Bulk Acoustic Wave Resonator-Stacked Crystal Filter (BAWR-SCF) device that is constructed in accordance with an embodiment of the invention, and which has a basic topology.

The various embodiments of the BAWR-SCF device of the invention will now be described. Referring to FIG. 10a, a schematic diagram is shown of a circuit having a basic topology of a BAWR-SCF device constructed in accordance with the invention. The circuit, namely, a BAWR-SCF circuit (or device) 1, comprises a ("shunt") BAW resonator 2, a ("series") BAW resonator 3, and a Stacked Crystal Filter 4. Preferably, the BAWR-SCF device 1 is a four port device, and includes ports (or nodes) (P1) and (P2), and ports (O1) and (O2). The ports (P1) and (P2) are, for example, 50 Ohm ports, and the ports (O1) and (O2) are also, for example, 50 ohm ports. For the purposes of convenience, only upper electrode 26, lower electrode 24, and piezoelectric layer 22 of the BAW resonators 2 and 3 are shown in the diagram of FIG. 10a, as well as upper, lower, and middle electrodes 25, 24, and 26' of the SCF 4.

In the preferred embodiment of the invention, the electrodes 26 and 24 of the BAW resonator 2 are connected to a node (I) and a node (G1) (which is preferably connected to ground during use), respectively, of the device 1. Upper electrode 26 of the BAW resonator 3 is also coupled to the node (I). The lower electrode 24 of the BAW resonator 3 is coupled to the lower electrode 24 of the SCF 4. The middle electrode 26' of the SCF 4 is coupled to a node (G2) (which is also preferably connected to ground during use), and the upper electrode 25 of the SCF 4 is coupled to node (O1). As the lower electrode 24 of BAW resonator 2 is coupled to ground node (G1), a via is provided in the structure of the device 1. The via is represented in FIG. 10a by the label "V". For the purposes of this description, the BAW resonator 2 and the BAW resonator 3 are collectively referred to as an "L segment 5".

Figure 9I:
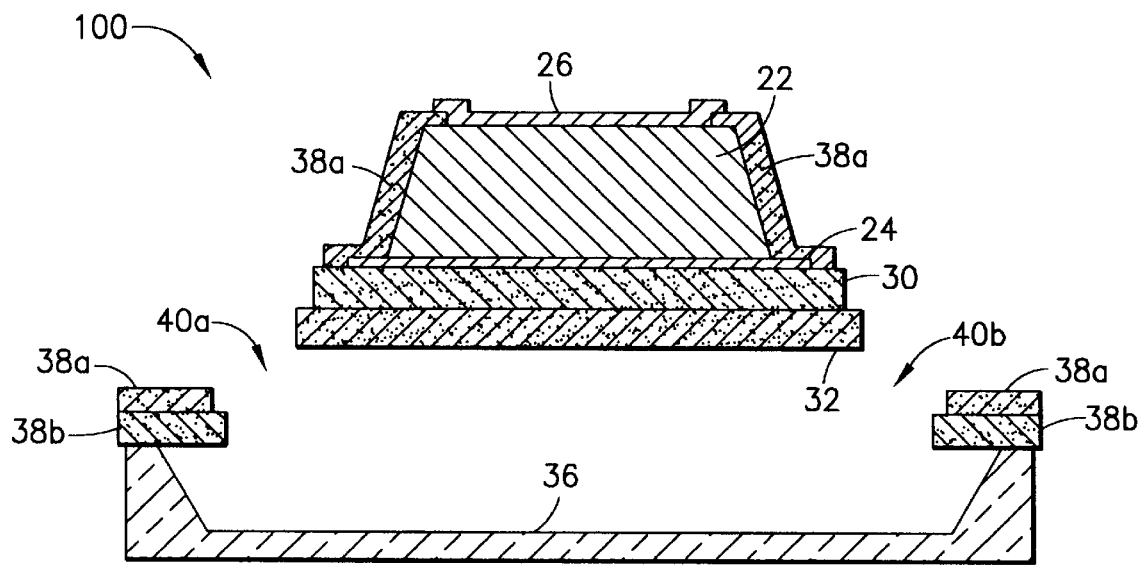
FIG. 9i shows a cross section of an exemplary BAW resonator structure.
Figure 9J:
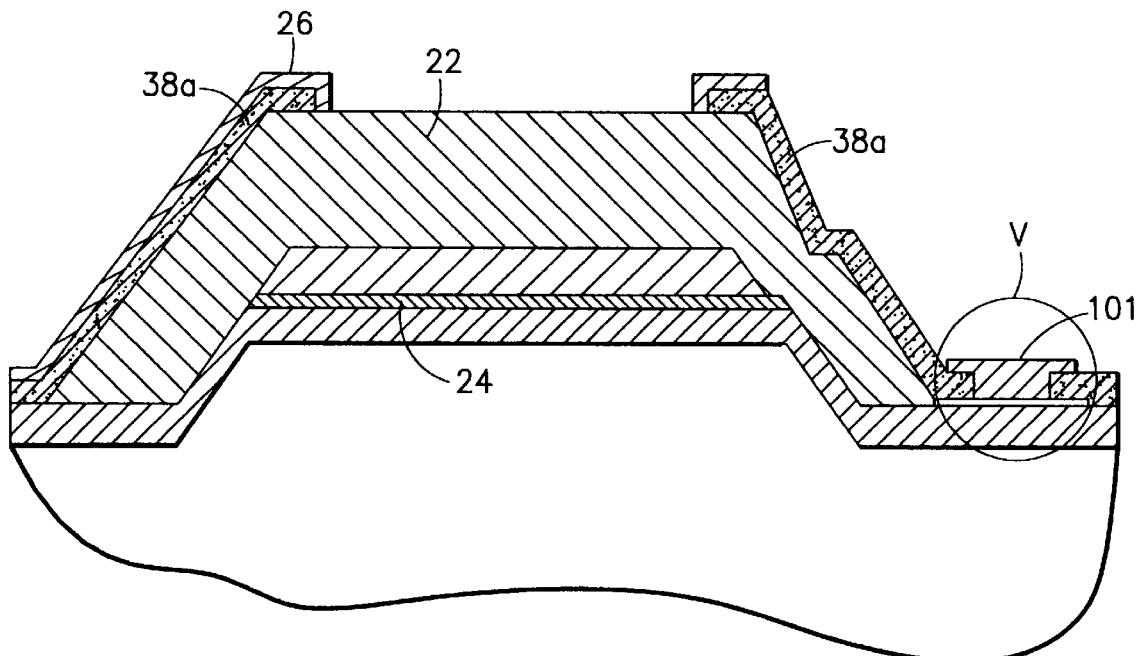
FIG. 9j shows a cross section of the BAW resonator structure of FIG. 9i, taken along line 9j—9j of FIG. 9i, wherein a via (V) is included in the BAW resonator structure.

An appreciation of the precise location of the via (V) in the BAWR-SCF device 1 may be further had in view of FIGS. 9i and 9j, which show cross sections of an exemplary structure of the BAW resonator 2 of the BAWR-SCF circuit 1. As can be seen in view of FIGS. 9i and 9j, the BAW resonator 2 in this example has a bridge structure, and includes similar layers as the BAW resonator 20 of FIG. 1a. The via (V) is shown in FIG. 9j, and, within the via (V) is shown an electrode 101 that couples the lower electrode 24 of the resonator structure to node (G1) (not shown in FIGS. 9i or 9j) of the BAWR-SCF device 1.

Referring again to FIG. 10a, in accordance with the above description, the (series) BAW resonator 3 preferably has a thinner layer stack than the BAW resonator 2 so that the series and parallel resonances yielded by the (series) BAW resonator 3 occur at somewhat higher frequencies than the series and parallel resonant frequencies yielded by BAW resonator 2. Also in accordance with the above description, the parallel resonances yielded by BAW resonator 3 causes the device 1 to exhibit a notch above the upper edge of the device's passband, and the series resonance yielded by the BAW resonator 2 causes the device 1 to exhibit a notch below the lower edge of the device's passband. Also, the series resonance of BAW resonator 3 and the parallel resonance of BAW resonator 2 occur near the center frequency of the BAWR-SCF circuit 1, which is also the center frequency of the L segment 5. Further in accordance with the above description, the devices 2, 3, and 4 are preferably constructed so that the SCF 4 exhibits a second harmonic resonance at approximately the center frequency of the device 1 (i.e., at approximately the center frequency of the L segment 5).

Figure 10B:
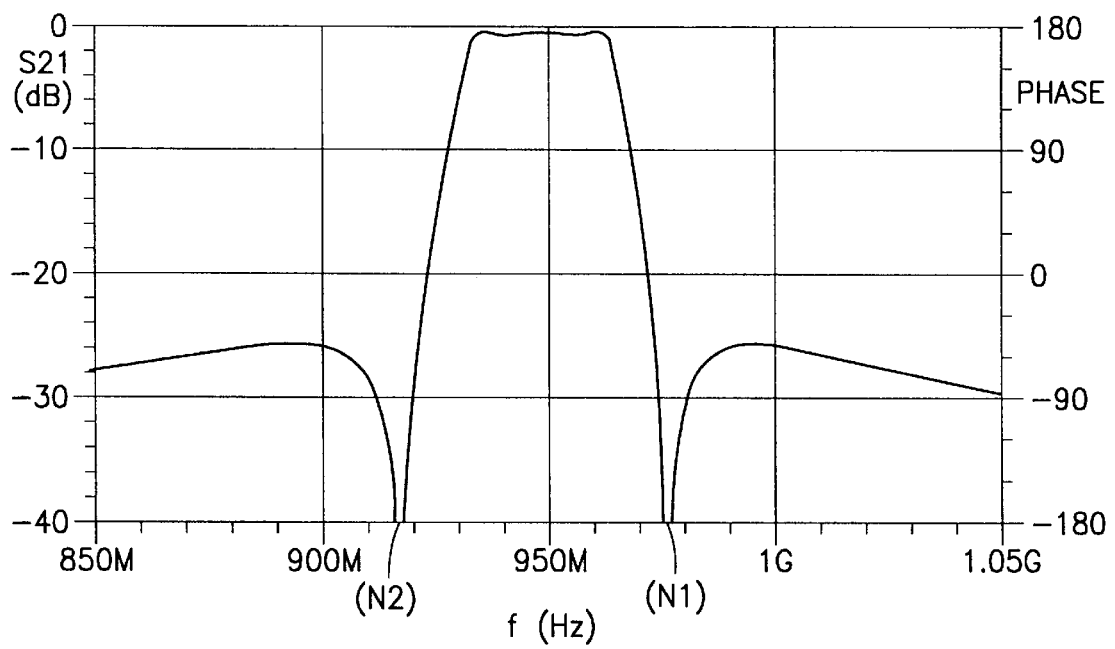
Figure 10C:
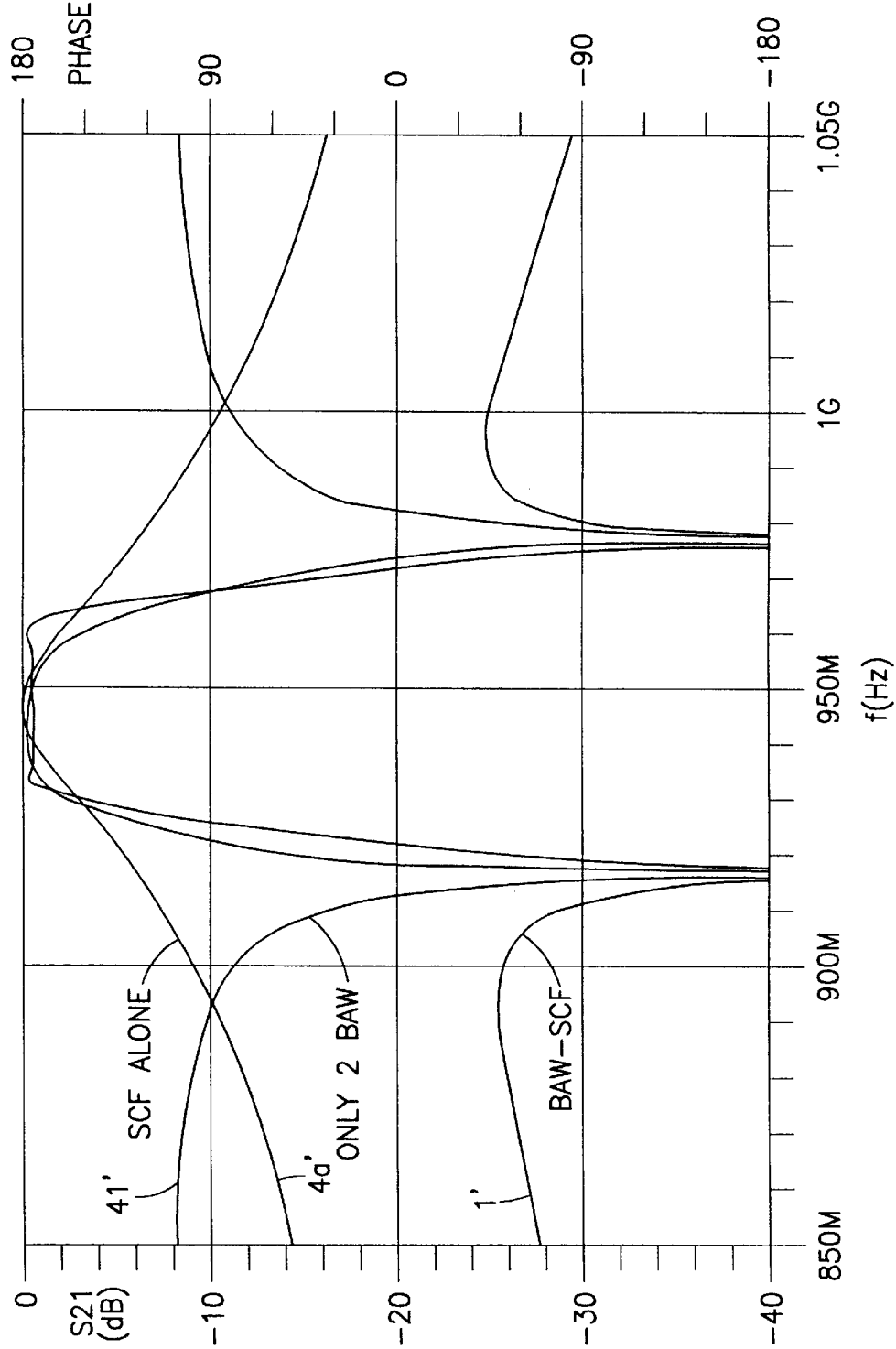
FIG. 10c shows the frequency response of FIG. 10b superimposed over the frequency responses of FIGS. 8e and 8c.
Figure 10D:
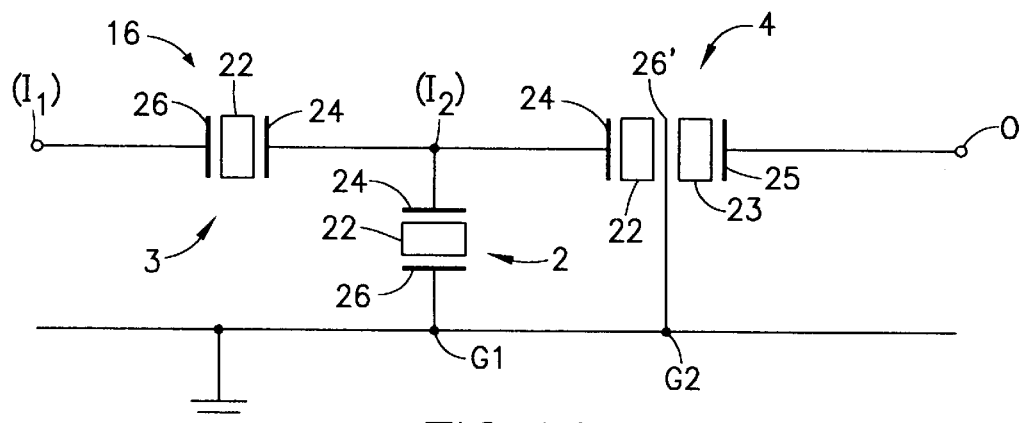
FIG. 10d shows a circuit diagram of a BAWR-SCF device that is constructed in accordance with another embodiment of the invention.
Figure 10E:
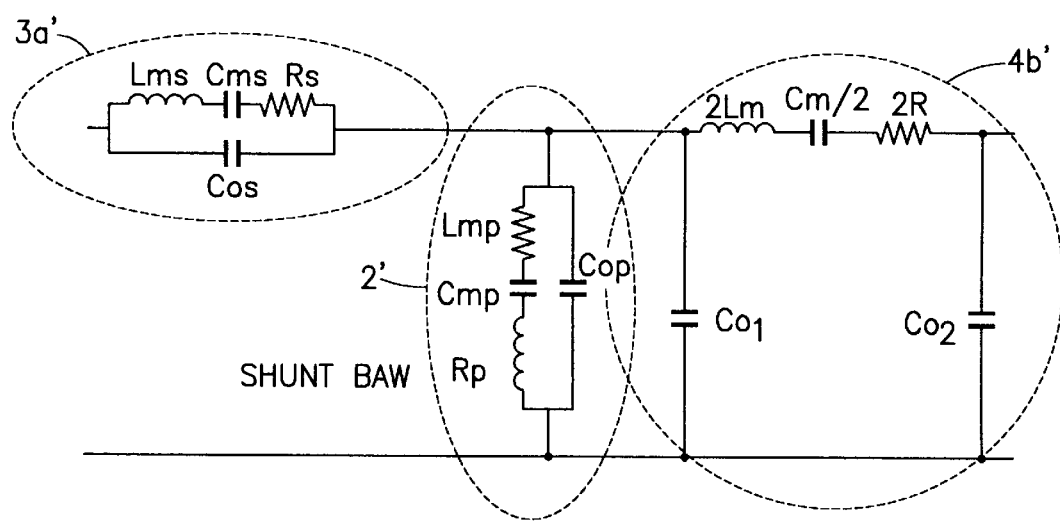
FIG. 10e shows a lumped element equivalent circuit of the device of FIG. 10d.
Figure 10F:
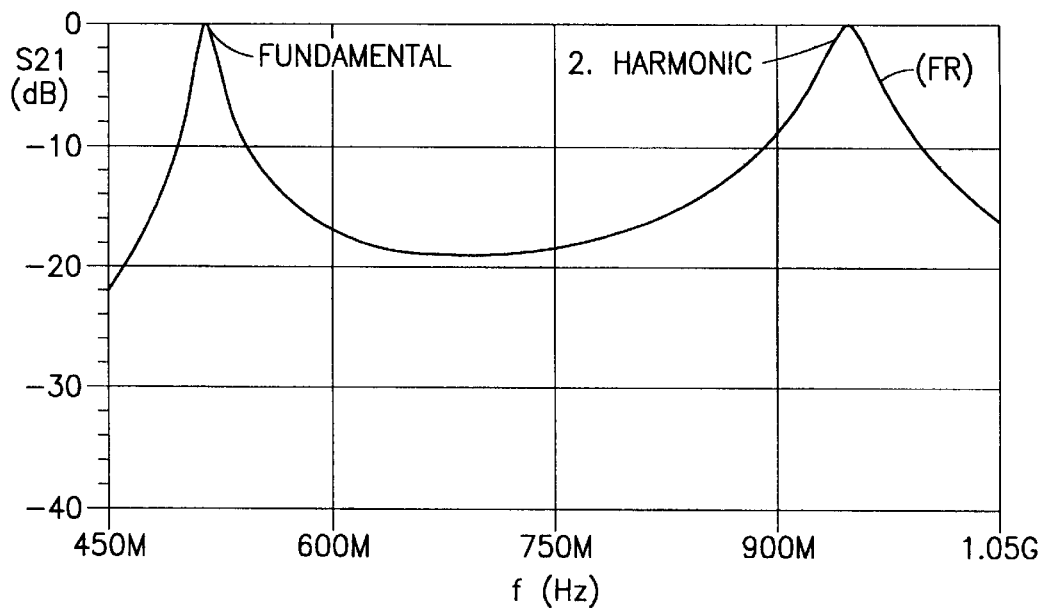
Figure 10G:
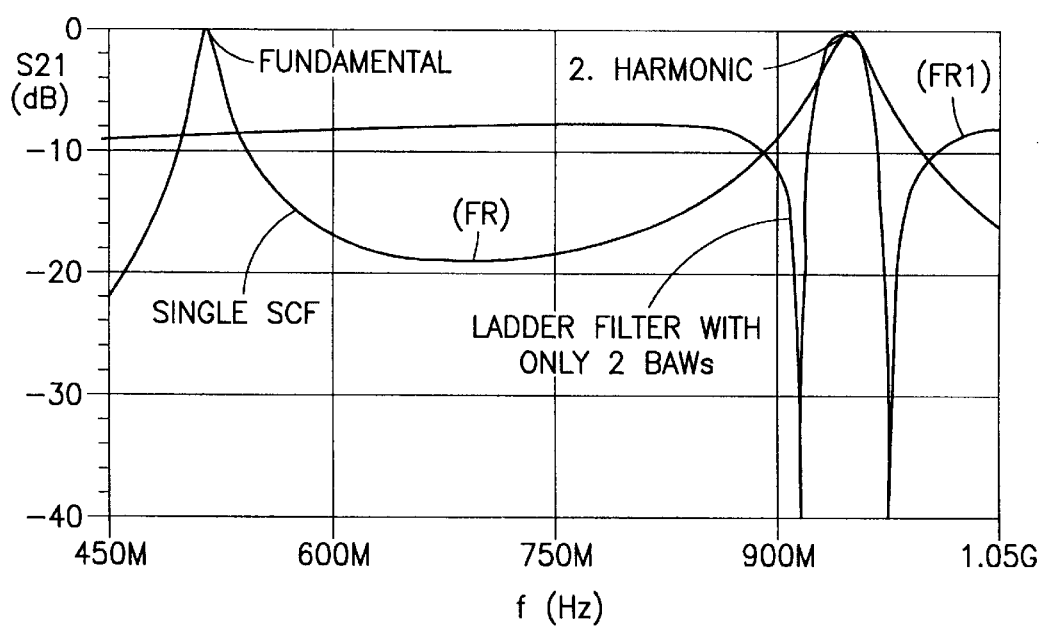
FIG. 10g shows a frequency response (FR1) of a BAW ladder filter portion of the BAWR-SCF device of FIG. 10a superimposed over the frequency response (FR) of FIG. 10f.

FIG. 10*b* shows a frequency response of the BAWR-SCF circuit 1, for an exemplary case in which 1) the device 1 is constructed so as to yield a passband having a bandwidth of approximately 25 MHz and a center frequency of about 947.5 MHz, 2) the ports (P1) and (P2) of the device 1 are 50 ohm ports, 3) the ports (O1) and (O2) of the device 1 are 50 ohm ports, and 4) the individual BAW resonators 2 and 3 and the SCF 4 include layers having the thicknesses shown in Tables 3, 4, and 5, respectively. As can appreciated in view of the exemplary dimensions shown in these Tables, each of the lower and upper piezoelectric layers 22 and 23 of the SCF 4 has a thickness which is equal to the thickness of the piezoelectric layer 22 of each of the BAW resonators 2 and 3, and the middle electrode (ground electrode) 26' of the SCF 4 has a thickness of 520 nm. Having these thicknesses, the SCF 4 exhibits a second harmonic frequency at the center frequency of the BAWR-SCF circuit 1. This can be further understood in view of FIGS. 10*f* and 10*g*. FIG. 10*f* shows a frequency response (FR) of the SCF 4 alone. Having the layer dimensions shown in Table 5, the SCF 4 yields a fundamental resonance at approximately 511 MHz, and a second harmonic resonance at approximately 947.5 MHz. In FIG. 10*g*, a frequency response (FR1) of the ladder configuration (L segment 5) of BAW resonators 2 and 3 is shown superimposed over the frequency response (FR) of the SCF 4. As can be seen in view of FIG. 10*g*, the resonant frequency of the SCF 4 is similar to the center frequency of the ladder configuration (L segment 5) of BAW resonators 2 and 3.

TABLE 3

SERIES RESONATOR

| Layer | Thickness |
| --- | --- |
| Upper electrode 26 | 250 nm |
| Piezoelectric layer 22 | 2362 nm |
| Lower electrode 24 | 250 nm |
| first membrane layer | 62 nm |
| Area of electrode | 225 um* |
|  | 225 um |

TABLE 4

SHUNT RESONATOR

| Layer | Thickness |
| --- | --- |
| Upper electrode 26 | 250 nm |
| Piezoelectric layer 22 | 2362 nm |
| Lower electrode 24 | 250 nm |
| first membrane layer | 62 nm |

TABLE 4-continued

SHUNT RESONATOR

| Layer | Thickness |
| --- | --- |
| second membrane layer | 213 nm |
| Area of electrode | 372 um* |
|  | 372 um |

TABLE 5

SCF

| Layer | Thickness |
| --- | --- |
| Upper electrode 25 | 250 nm |
| Upper piezoelectric layer 23 | 2362 nm |
| Ground electrode 26' | 520 nm |
| Lower piezoelectric layer 22 | 2362 nm |
| Lower electrode 24 | 250 nm |
| first membrane layer | 62 nm |
| second membrane layer | 213 nm |
| Area of electrode | 340 um* |
|  | 340 um |

In FIG. 10*b*, a notch (N1) that is located above the upper edge of the passband, and a notch (N2) which is located below the lower edge of the passband, are shown. Notch (N1) is caused by the parallel resonance of the BAW resonator 3, and notch (N2) is caused by the series resonance of the BAW resonator 2.

The BAWR-SCF device 1 exhibits an improved frequency response over those yielded by, for example, the individual ladder filter 41 of FIG. 8*d* (which, unlike the BAWR-SCF device 1, does not include an SCF 4), or an individual SCF. This can be seen in view of FIG. 10*c*, which shows the frequency response 1' of the BAWR-SCF circuit 1 overlapped with the frequency response 41' of the filter 41 of FIG. 8*d* and the frequency response 4*a'* of the individual SCF 4. As can be appreciated in view of FIG. 10*c*, the BAW resonators 2 and 3 of the BAWR-SCF circuit 1 enable the frequency response 1' to have steeply-sloped upper and lower passband edges, and deep notches above and below the passband. Also, the SCF 4 enables the device 1 to exhibit greater stopband attenuation (e.g., out-of-band rejection) than is yielded by, for example, the ladder filter 41 of FIG. 8*d*.

It should be noted that, depending on requirements for an application of interest, either of the pairs of ports (P1) and (P2) and (O1) and (O2) may be employed as input ports or output ports for the BAWR-SCF device 1, since the transmission of energy within the BAWR-SCF device 1 can be provided in either the direction from ports (P1) and (P2) to ports (O1) and (O2), or in the direction from ports (O1) and (O2) to ports (P1) and (P2). Being that energy may be transmitted within the BAWR-SCF device 1 in either direction, the device 1 functions similarly in each case and yields the same performance characteristics (described above) in each case.

In accordance with the preferred embodiment of the invention, the BAWR-SCF device 1 is constructed on a single wafer, and may be fabricated in accordance with the following steps to include layers listed in Tables 3, 4, and 5.

1. A first membrane layer is deposited on a substrate. The first membranae layer has a thickness of, by example, 62 nm, and is comprised of SiO2.
2. A second membrane layer is deposited on the first membrane layer, and is patterned to produce a "cushion" layer for the remaining stack layers of the shunt BAW resonator 2 and the SCF 4 to be deposited in steps 3–8. Etching is then performed to remove portions of the deposited second membrane layer over which no further layers of the shunt BAW resonator 2 and the SCF 4 are to be deposited. The second membrane layer has a thickness of, by example, 213 nm, and is comprised of SiO2.

3. An electrode layer is deposited over the layers formed in steps 1 and 2, and is then patterned to form a lower electrode layer of the BAW resonators 2 and 3 and the SCF 4. The lower electrode layer has a thickness of, for example, 250 nm, and is comprised of Mo.
4. A first piezoelectric layer is deposited on top of the lower electrode layer, and is patterned to form piezoelectric layers of the BAW resonators 2 and 3 and a lower piezoelectric layer of the SCF 4. These piezoelectric layers have thicknesses of, for example, 2362 nm, and are comprised of ZnO.
5. As a next step, another electrode layer is deposited over the lower layers of the devices 2, 3, and 4, and is then patterned to form a middle electrode of the SCF 4. Portions of this deposited electrode layer that were deposited over the BAW resonators 2 and 3 are then removed by etching. The electrode layer has a thickness of, by example, 520 nm, and is comprised of Mo.
6. A next step includes depositing and patterning a second piezoelectric layer on the middle electrode of the SCF 4. The second piezoelectric layer has a thickness of, by example, 2363 nm, and is comprised of ZnO.
7. A next step includes depositing and patterning a further electrode layer over the lower layers of the BAW resonators 2 and 3 and the SCF 4, and thereby forming an upper layer of the devices 2, 3, and 4. The thickness of the upper electrode layer is, by example, 250 nm, and the electrode layer is comprised of Mo.
8. A further step includes depositing a protective layer, if needed, over the layers formed in the preceding steps.

It should be noted that, if the individual BAW resonators 2 and 3 and the SCF 4 include bridge structures, then prior to the performance of step 1, steps are performed of forming etch openings (i.e., windows) through the membrane layers and the protective layer, and removing the sacrificial layer by wet etching.

Other topologies may also be provided for the BAWR-SCF device of the invention besides the one shown in FIG. 10a, depending on the particular frequency response characteristics required for a particular application of interest. By example, in cases in which it is required that narrower passband bandwidths be yielded (e.g., a 5 MHz passband bandwidth centered at 947.5 GHz instead of a 25 MHz passband bandwidth centered at 947.5 GHz), a BAWR-SCF circuit may be provided which is similar to that of FIG. 10a, except that the BAW resonators 2 and 3 forming the L segment 5 have an "inverted" configuration. Referring to FIG. 10d, for example, a BAWR-SCF circuit 16 is provided which is similar to the BAWR-SCF circuit 1 of FIG. 10a, except that the BAW resonators 2 and 3 of BAWR-SCF circuit 16 have an "inverted" configuration with respect to the L segment 5 of FIG. 10a. With this configuration, upper electrode 26 of the BAW resonator 3 is coupled to node (I1), and lower electrode 24 of the BAW resonator 3 is coupled to a node (I2). BAW resonator 2 is connected between the node (I2) and ground node (G1). Lower electrode 24 of the BAW resonator 2 is coupled to the node (I2) and the upper electrode 26 of the BAW resonator 2 is connected to the ground node (G1). The lower electrode 24 of the SCF 4 is coupled to the node (I2), the middle electrode 26' of the SCF 4 is connected to the ground node (G2), and the upper electrode 25 of the SCF 4 is connected to node (O).

The BAWR-SCF circuit 16 exhibits a narrower passband bandwidth than is exhibited by the BAWR-SCF circuit 1 of FIG. 10a. This may be further understood in view of FIG. 10e, which shows a lumped element equivalent circuit of the BAWR-SCF circuit 16. The equivalent circuit includes equivalent circuits 4b', 2', and 3a' of the SCF 4 and the BAW resonators 2 and 3, respectively. Shunt capacitance ($Co_1$) of the SCF equivalent circuit 4b' is in parallel with the parallel capacitance (Cop) of the BAW resonator equivalent circuit 2', and, as a result, the effective equivalent shunt capacitance of the BAW resonator 2 is defined by equivalent capacitances (Cop) and ($Co_1$) instead of by only (Cop). Also as a result, the series resonance of the BAW resonator 2 is defined by equivalent inductance (Lmp) and equivalent capacitance (Cmp), and the parallel resonance of the (shunt) BAW resonator 2 occurs at a frequency that is lower on the frequency spectrum than, for example, the parallel resonant frequency yielded by BAW resonator 2 of the BAWR-SCF circuit 1 of FIG. 10a. This causes the series and parallel resonant frequencies yielded by the BAW resonator 2 of BAWR-SCF circuit 16 to be closer to one another on the frequency spectrum than, for example, the series and parallel resonant frequencies of BAW resonator 2 of BAWR-SCF circuit 1. The parallel resonant frequency of the BAW resonator 2 of BAWR-SCF circuit 16 is preferably increased to a desired frequency (e.g., to the same parallel resonant frequency of BAW resonator 2 of BAWR-SCF circuit 1) by fabricating the BAW resonator 2 so that the thickness of the layer stack of BAW resonator 2 is less than that of, for example, BAW resonator 2 of the BAWR-SCF circuit 1 by an appropriate amount to enable the desired parallel resonant frequency to be yielded. The precise layer stack thickness selected may be determined in accordance with any suitable, known technique for enabling a BAW device to yield a desired resonant frequency based on the layer stack thickness of the device. The reduction in the thickness of the resonator stack also causes the series resonant frequency of the BAW resonator 2 to be increased. As can be appreciated, since the series resonant frequency of the BAW resonator 2 causes a notch below the passband of the BAWR-SCF circuit 16, the frequency at which this notch occurs is also increased, and the passband bandwidth of the BAWR-SCF circuit becomes narrower with respect to the passband bandwidth of the BAWR-SCF circuit 1.

Figure 10H:
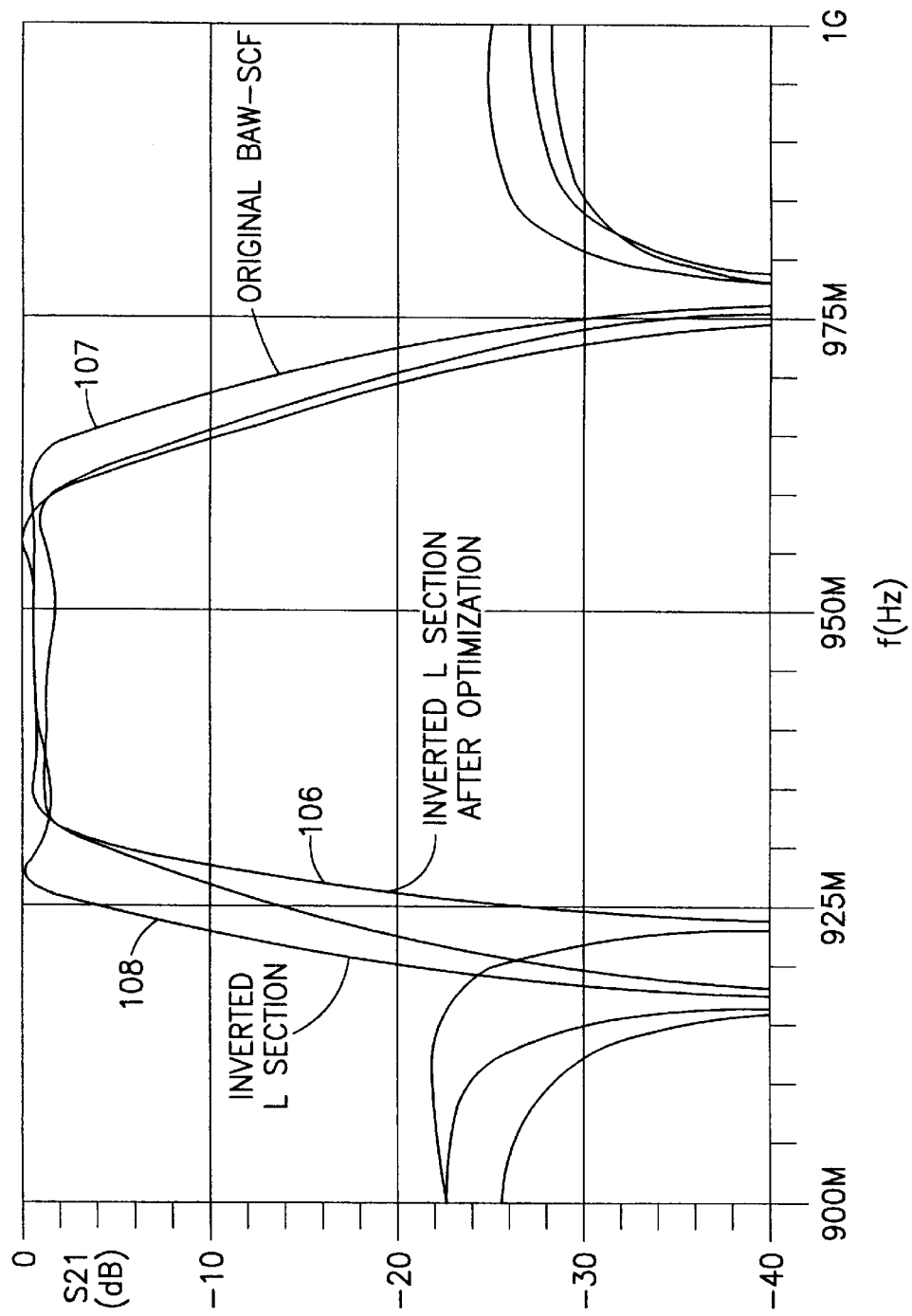
FIG. 10h shows a frequency response 106 of the BAWR-SCF device of FIG. 10d superimposed over the frequency response of FIG. 10b and a frequency response 108 of an exemplary "inverted" BAW ladder filter.

FIG. 10h shows a frequency response 106 of the BAWR-SCF circuit 16, for an exemplary case in which 1) the devices 3, 2 and 4 include layers having thicknesses shown in Tables 3, 4, and 5, respectively, 2) the second membrane layer of shunt resonator 2 has a thickness of 158 nm instead of 213 nm, and 3) the area of the upper electrode of the shunt resonator 2 is 200 $\mu$m×200 $\mu$m instead of 372 $\mu$m×372 $\mu$m. In FIG. 10h, the frequency response 106 is superimposed over a frequency response 107, which represents the frequency response of FIG. 10b of the BAWR-SCF circuit 1 of FIG. 10a (which does not include an "inverted" L segment). Also shown in FIG. 10h is a frequency response 108. The frequency response 108 represents a frequency response of the inverted L segment configuration of the BAW resonators 2 and 3 of the BAWR-SCF 16 of FIG. 10d, for a case in which the BAW resonators 2 and 3 includes the layers having the thicknesses shown in Tables 4 and 3, respectively.

Figure 11A:
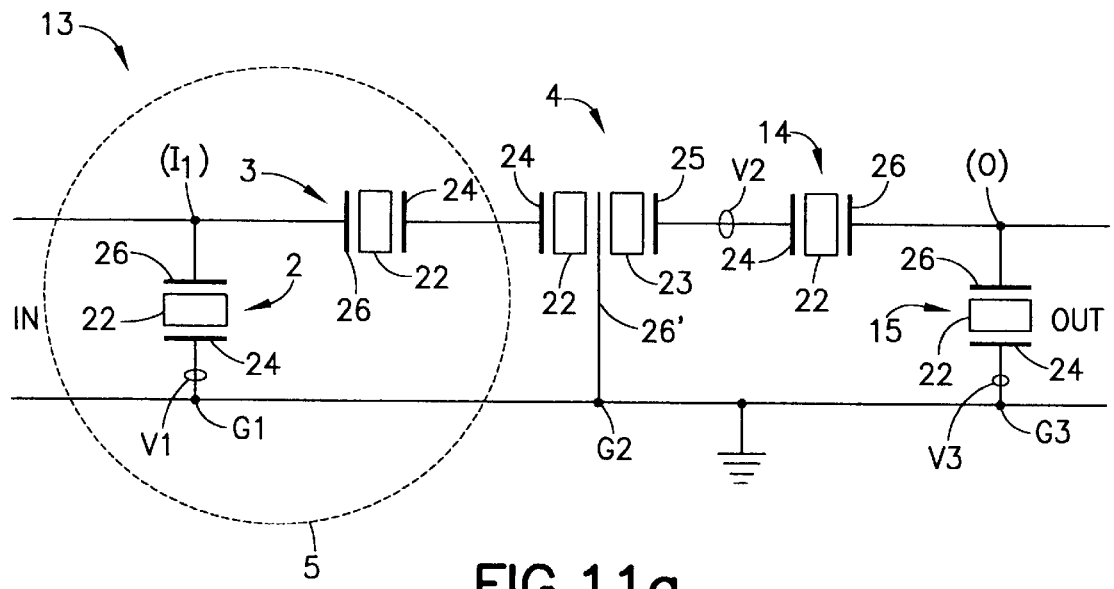
FIG. 11a shows a BAWR-SCF device that is constructed in accordance with a another embodiment of the invention.

FIG. 11a shows a BAWR-SCF circuit 13 that is constructed in accordance with another embodiment of the invention. The BAWR-SCF circuit 13 is similar to the BAWR-SCF circuit 1 of FIG. 10a, except that the BAWR-SCF circuit 13 comprises a (series) BAW resonator 14 and a (shunt) BAW resonator 15, in addition to the BAW resonators 2 and 3 and the SCF 4. The BAW resonators 2 and 3 and the SCF 4 are connected within the BAWR-SCF circuit 13 in a similar manner as resonators 2 and 3 and SCF 4 are connected within the BAWR-SCF circuit 1 of FIG. 10a. BAW resonator 14 of BAWR-SCF circuit 13 is connected between the SCF 4 and node (O). In a preferred embodiment of the invention, lower electrode 24 of the BAW resonator 14 is coupled to the upper electrode 25 of the SCF 4, and upper electrode 26 of the BAW resonator 14 is connected to node (O). BAW resonator 15 is connected between node (O) and a ground node (G3). Upper electrode 26 of the BAW resonator 15 is preferably coupled to the node (O) and lower electrode 24 of the BAW resonator 15 is preferably connected to the ground node (G3). With this configuration, there are three vias provided in the device 13, namely via V1, via V2, and via V3.

Figure 11B:
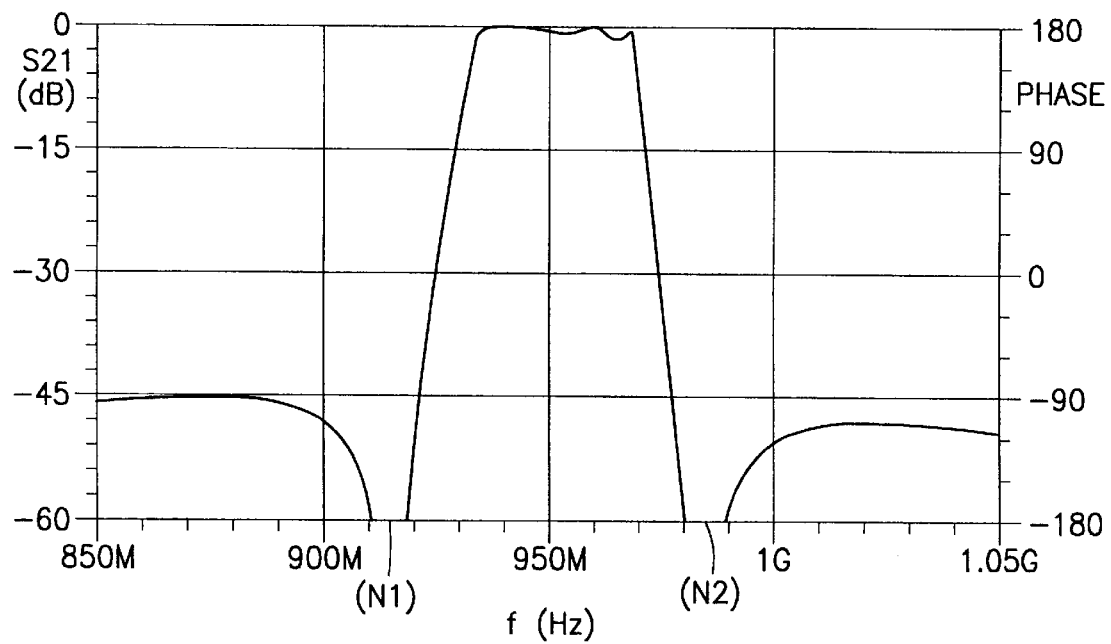

FIG. 11b shows a frequency response of the BAWR-SCF circuit 13 for an exemplary case in which the layers of the BAW resonators 3 and 14 have the thicknesses shown in Table 3 above, the layers of the BAW resonators 2 and 15 have the thicknesses shown in Table 4 above, and the layers of the SCF 4 have the thicknesses shown in Table 5 above.

As can be appreciated in view of FIG. 11b, the series resonances of the BAW resonators 2 and 15 enable the BAWR-SCF circuit 13 to yield a notch (N1) below the passband of the BAWR-SCF circuit 13, and the BAW resonators 3 and 14 enable the BAWR-SCF circuit 13 to yield a notch (N2) above the passband of the BAWR-SCF circuit 13. The SCF 4 of BAWR-SCF circuit 13 functions in a similar manner as the SCF 4 of BAWR-SCF circuit 1. As can be appreciated in view of FIGS. 10b and 11b, which show the frequency responses of the BAWR-SCF circuits 1 (FIG. 10a) and 13, respectively, the inclusion of the BAW resonators 14 and 15 in the circuit 13 enables the BAWR-SCF circuit 13 to provide greater stopband attenuation than is provided by the BAWR-SCF circuit 1. The BAWR-SCF circuit 13 also provides better stopband attenuation characteristics than are provided by, for example, the prior art BAW ladder filter 44 of FIG. 8f. By example, and referring to both the frequency response of FIG. 11b and the frequency response of the BAW ladder filter 44 shown in FIG. 8g, the level of stopband attenuation provided by the BAWR-SCF circuit 13 is improved by over 20 dB over that of BAW ladder filter 44, while the passband bandwidths and passband ripple magnitudes of the respective frequency responses are similar.

Figure 11C:
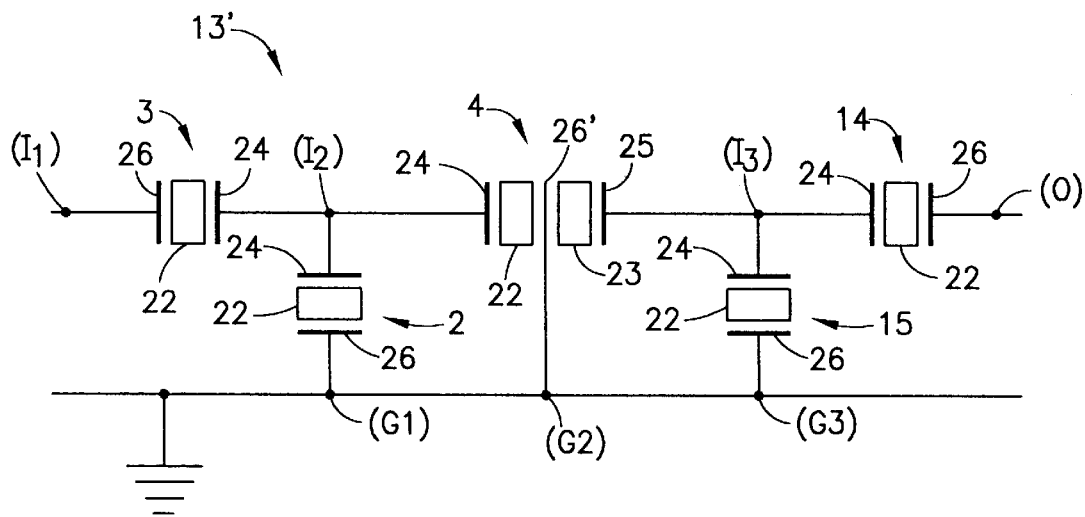
FIG. 11c shows a circuit diagram of a BAWR-SCF device that is constructed in accordance with a further embodiment of the invention.

In cases in which it is necessary to provide a BAWR-SCF circuit that yields similar frequency response characteristics as the BAWR-SCF circuit 13 of FIG. 11a, but which yields a narrower passband bandwidth than is yielded by the BAWR-SCF circuit 13, a BAWR-SCF circuit 13' in accordance with the invention may be provided, as is shown in FIG. 11c. The BAWR-SCF circuit 13' includes BAW resonators 2, 3, 14 and 15, and a SCF 4. In a preferred embodiment of the invention, upper electrode 26 of BAW resonator 3 is coupled to node (I1), and a lower electrode 24 of the BAW resonator 3 is coupled to a node (I2). BAW resonator 2 is connected between node (I2) and ground node (G1). Upper electrode 26 of BAW resonator 2 is coupled to ground node (G1) and lower electrode 24 of the BAW resonator 2 is coupled to the node (I2). Lower electrode 24 of the SCF 4 is coupled to node (I2), middle electrode 26' of the SCF 4 is coupled to ground node (G2), and upper electrode 25 of the SCF 4 is coupled to a node (I3) of the BAWR-SCF circuit 13'. Lower electrode 24 of the BAW resonator 15 is coupled to node (I3) and upper electrode 26 of the BAW resonator 15 is coupled to ground node (G3).

Lower electrode 24 of BAW resonator 14 is coupled to node (I3) and upper electrode 26 of the BAW resonator 14 is coupled to node (O).

Owing to the configuration of the BAWR-SCF circuit 13', the BAWR-SCF circuit 13' yields a passband bandwidth that is more narrow than the passband bandwidth yielded by the BAWR-SCF circuit 13 of FIG. 11a. As can be appreciated, the inclusion of the BAW resonators 14 and 15 in the BAWR-SCF circuit 13' enables the circuit 13' to provide better stopband attenuation characteristics than can be provided by, for example, the BAWR-SCF circuit 16, which does not include BAW resonators 14 and 15. Also, in an ideal case, the BAW resonators 14 and 15 influence the passband bandwidth of the BAWR-SCF 13', narrowing it to a certain extent.

Figure 12:
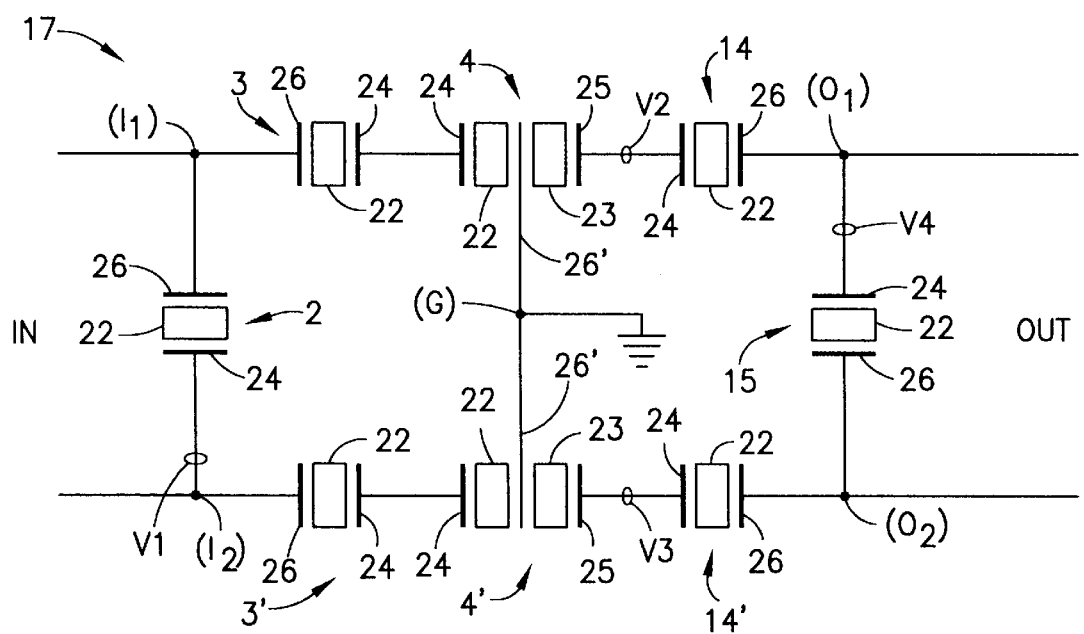
FIG. 12 shows a circuit diagram of a balanced BAWR-SCF device that is constructed in accordance with an embodiment of the invention.

Referring to FIG. 12, a balanced filter (also referred to as a "BAWR-SCF circuit") 17 in accordance with the invention will now be described. In accordance with a preferred embodiment of the invention, the balanced filter 17 comprises BAW resonators 2, 3, 3', 14, 14' and 15, a SCF 4, and a SCF 4'. BAW resonator 2 and a BAW resonator 3 are connected in an "L segment" configuration similar to that described above. More particularly, BAW resonator 2 is connected across nodes (I1) and (I2) of the filter 17. Upper electrode 26 of the BAW resonator 2 is connected to node (I1) and lower electrode 24 of the BAW resonator 2 is connected to node (I2). Upper electrode 26 of BAW resonator 3 is also connected to node (I1), and lower electrode 24 of the BAW resonator 3 is coupled to lower electrode 24 of the SCF 4. Middle electrode 26' of the SCF 4 is coupled to ground node (G), and upper electrode 25 of the SCF 4 is connected to lower electrode 24 of BAW resonator 14. Upper electrode 26 of the BAW resonator 14 is connected to node (O1).

Also in the preferred embodiment of the invention, upper electrode 26 of BAW resonator 3' is connected to node (I2), and lower electrode 24 of the BAW resonator 3' is connected to lower electrode 24 of SCF 4'. Middle electrode 26' of the SCF 4' is coupled to ground node (G), and upper electrode 25 of the SCF 4' is coupled to lower electrode 24 of resonator 14'. Upper electrode 26 of BAW resonator 14' is coupled to node (O2). BAW resonator 15 is connected across nodes (O1) and (O2). Lower electrode 24 of the BAW resonator 15 is coupled to node (O1), and upper electrode 26 of BAW resonator 15 is coupled to node (O2). As can be appreciated, with this configuration, vias V1, V2, V3, and V4 are provided in the structure of the BAWR-SCF circuit 17. The BAWR-SCF circuit 17 functions in a similar manner as the BAWR-SCF circuit 13, and exhibits a similar passband response as that (shown in FIG. 11b) exhibited by the BAWR-SCF circuit 13. However, in the balanced filter 17 of FIG. 12, there is a 180 degree phase differential between signals that are applied to one of the pairs of nodes (I1) and (I2) and (O1) and (O2), and between output signals at the other pair of these nodes, although these signals have equal magnitudes.

The balanced filter 17 may be employed in cases in which, by example, it is required to filter a balanced signal traveling between two circuit components (e.g., amplifiers) having balanced inputs and outputs. The use of the balanced filter 17 in this case is more advantageous than the use of a non-balanced filter since, if a non-balanced filter were employed between the circuit components, the balanced signal output by a first one of the components would need to be converted to an unbalanced signal before being applied to the non-balanced filter, and would then need to be converted back to a balanced signal after being output by the non-balanced filter.

As can be appreciated in view of the above description, each of the BAWR-SCF circuits described above yields frequency response characteristics that are improved over those exhibited individual BAW ladder filters and individual SCF devices. Because the BAWR-SCF circuits do not require the use of tuning elements (e.g., inductors) to enable the devices to yield the improved frequency response characteristics, whereas individual BAW ladder filters and individual SCF devices do require the use of tuning elements to yield somewhat improved frequency responses, the BAWR-SCF devices of the invention can be smaller in size and less complex than the individual BAW ladder filters and individual SCF devices which incorporate tuning elements.

Each of the various embodiments described above can be operated over frequencies ranging from approximately 500 Mhz to 5 Ghz. Preferably, the BAWR-SCF devices operate in the longitudinal mode since this allows for easier fabrication of the piezoelectric layers (perpendicular to electrodes) of the devices. However, in other embodiments the BAWR-SCF devices can be operated in the shear mode if the layer dimensions are chosen appropriately (e.g., piezoelectric layer axes parallel to electrode layers).

It should be noted that the invention is not intended to be limited to the BAWR-SCF circuits having the topologies described above, and that BAWR-SCF devices having other topologies may also be provided. By example, depending on applicable performance criteria, BAWR-SCF circuits may be provided which include additional BAW resonators and/ or SCFs. It should be noted, however, that BAWR-SCF devices having lesser component (e.g., BAW resonators and SCFs) areas have lesser levels of insertion loss than do BAWR-SCF devices having greater component areas. Also, the dimensions of the BAW resonators and the SCFs described in the Tables above are intended to be exemplary in nature, and the BAW resonators and SCFs may be provided with other suitable dimensions that cause desired frequency response characteristics (e.g., passband bandwidth, center frequency, insertion loss level, etc.) to be provided.

Furthermore, the manner in which the BAW resonators and SCFs are interconnected within the BAWR-SCF circuits may also be varied. By example, in accordance with an alternate embodiment of the invention, the BAW resonator 2 of BAWR-SCF circuit 1 of FIG. 10a may be connected within the circuit 1 so that upper electrode 26 of BAW resonator 2 is coupled to the ground node (G1) and the lower electrode 24 is connected to the node (I). Also, the BAW resonator 3 of BAWR-SCF circuit 1 may be connected so that lower electrode 24 of BAW resonator 3 is connected to the node (I) and the upper electrode 26 of BAW resonator 3 is connected to electrode 25 of the SCF 4. Similarly, electrode 24 of the SCF 4 may be connected to node (O1) of BAWR-SCF circuit 1. As can be appreciated, however, in this embodiment more vias need to be provided than are provided in the preferred embodiment of the circuit 1 described above. It should also be noted that for each of the devices described above, the transmission of energy can be provided in either direction within the respective devices, depending on which side of the devices signals are applied to. For either case, the BAWR-SCF devices function in a similar manner and exhibit similar performance characteristics.

A further aspect of the invention will now be described. As was described above, conventional duplexers such as, for example, ceramic duplexers and duplexers that include SAW devices, suffer from a number of drawbacks. For example, ceramic duplexers in general are undesirably large in size, and SAW devices cannot function at certain high RF power levels, such as those used in GSM transmitting applications. In view of the problems associated with these prior art duplex filters, the inventor has developed a novel duplex filter that is smaller in size than conventional ceramic duplexers, and which can operate at high RF power levels, including those employed by GSM transmitters.

Figure 13:
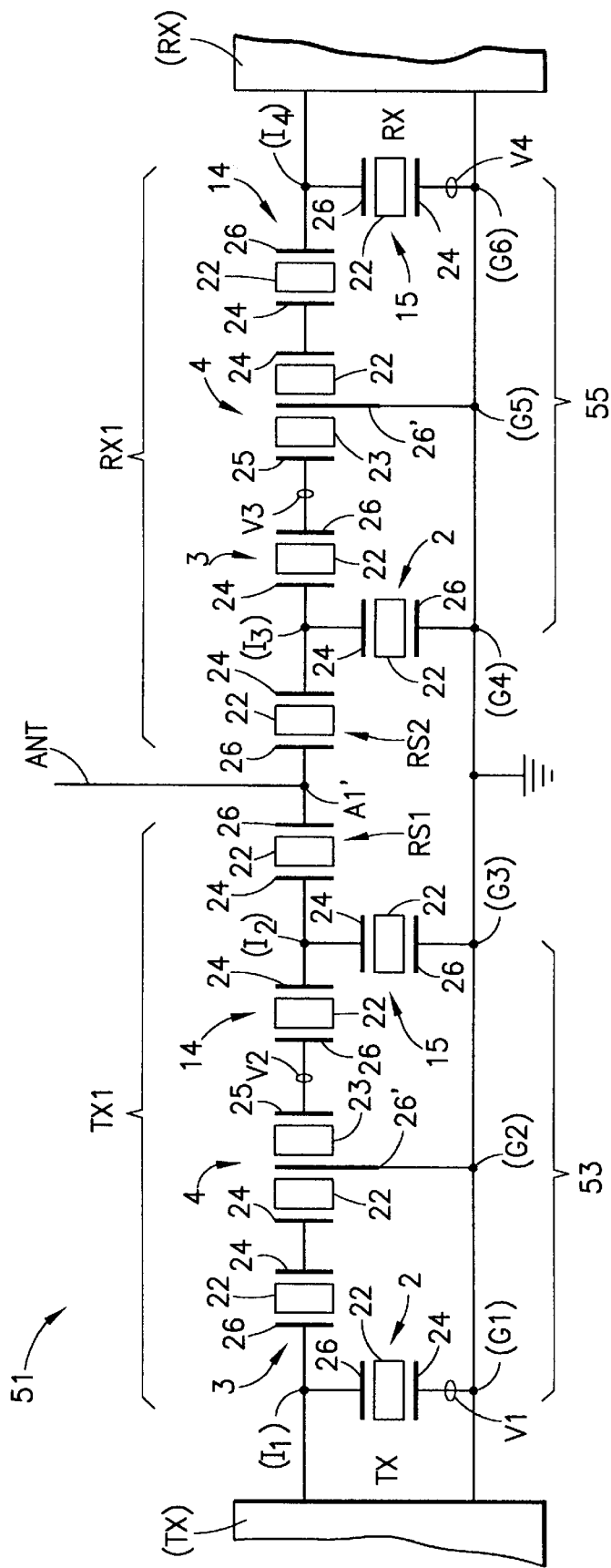
FIG. 13 shows a schematic diagram of a duplex filter (duplexer) that is constructed in accordance with an embodiment of the invention.

Referring to FIG. 13, a schematic diagram of a duplex filter (duplexer) 51 that is constructed in accordance with a preferred embodiment of the invention is shown. The duplexer 51 comprises at least one antenna (ANT), a first, "transmit" portion (labeled "TX1"), and a second, "receive" portion (labeled "RX1"). The duplexer 51 may be employed in a transceiver. By example, during times when the duplexer 51 is connected within the transceiver, the first portion (TX1) filters signals that are output by a transmitter portion (TX) of the transceiver before the signals are transmitted from the transceiver over antenna (ANT). Also within the transceiver, the second portion (RX1) of duplexer 51 filters signals that are received by the antenna (ANT), and then provides filtered signals to a receiver portion (RX) of the transceiver.

The first portion (TX1) of the duplexer 51 includes a BAWR-SCF circuit 53 and a BAW resonator (RS1), and the second portion (RX1) of the duplexer 51 includes a BAWR-SCF circuit 55 and a resonator (RS2). According to a preferred embodiment of BAW the invention, the BAWR-SCF circuit 53 of the first portion (TX1) comprises similar components as the BAWR-SCF circuit 13 of FIG. 11a, including the BAW resonators 2, 3, 14, and 15, and the SCF 4. The BAW resonators 2 and 3 and the SCF 4 of the first portion (TX1) of the duplexer 51 are preferably connected within the device in a manner that is similar to the manner in which BAW resonators 2 and 3 and SCF 4 of FIG. 11a are connected within the BAWR-SCF circuit 13. Also, the BAW resonator 14 of first portion (TX1) is preferably connected within the first portion (TX1) so that upper electrode 26 of the BAW resonator 14 is coupled to upper electrode 25 of the SCF 4, and so that lower electrode 24 of the BAW resonator 14 is coupled to a node (I2). BAW resonator 15 is preferably connected within the first portion (TX1) so that upper electrode 26 is coupled to ground node (G3) and lower electrode 24 is coupled to node (I2). BAW resonator (RS1) is coupled between node (I2) and a node. (A1') which is coupled to antenna (ANT). Lower electrode 24 of the BAW resonator (RS1) is coupled to the node (I2), and upper electrode 26 of BAW resonator (RS1) is coupled to the node (A1'). With this configuration, the first portion (TX1) of the duplexer 51 includes vias V1 and V2.

As was described above, the second portion (RX1) of the duplexer 51 includes a BAWR-SCF circuit 55 and a BAW resonator (RS2). In the preferred embodiment of the invention, upper electrode 26 of BAW resonator (RS2) is coupled to node (A1'), and lower electrode 24 of BAW resonator (RS2) is coupled to a node (I3). The BAWR-SCF circuit 55 includes similar components as the BAWR-SCF circuit 13 of FIG. 11a. However, in the second portion (RX1) of the duplexer 51, upper electrode 26 of BAW resonator 2 is preferably coupled to a node (G4), and lower electrode 24 of the BAW resonator 2 is preferably coupled to node (I3). Also, lower electrode 24 of BAW resonator 3 is preferably coupled to node (I3), and upper electrode 26 of BAW resonator 3 is preferably coupled to upper electrode 25 of SCF 4. Middle electrode 26' of SCF 4 is coupled to ground node (G5). BAW resonator 14 of the second portion (RX1) is preferably connected within the device so that lower electrode 24 of the BAW resonator 14 is coupled to the lower electrode 24 of the SCF 4, and so that upper electrode 26 of the BAW resonator 14 is coupled to a node (I4). BAW resonator 15 is preferably connected within the second portion (RX1) of the duplexer 51 so that upper electrode 26 of the resonator 15 is coupled to node (I4) and lower electrode 24 is coupled to node (G6). With this configuration, the second portion (RX1) of the duplexer 51 includes vias V3 and V4.

Figure 17A:
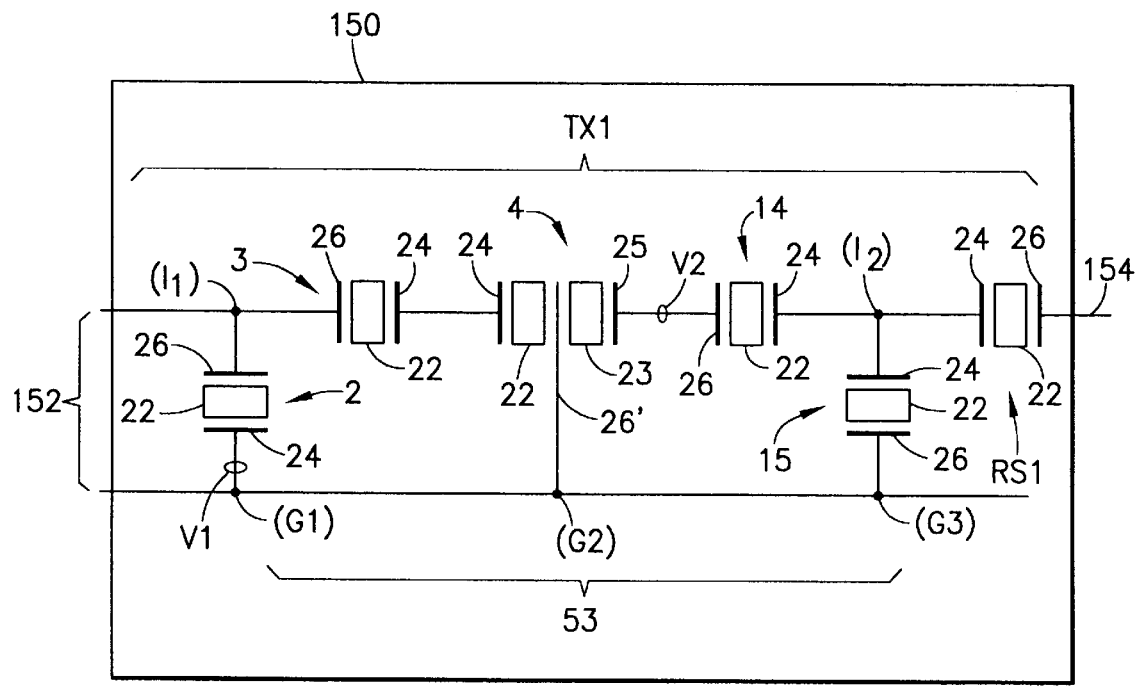
FIGS. 17a and 17b show alternate embodiments of BAWR-SCF circuits that may be employed in transmitter portions of the duplex filter of FIG. 13 and the dual duplexer of FIG. 16.
Figure 17B:
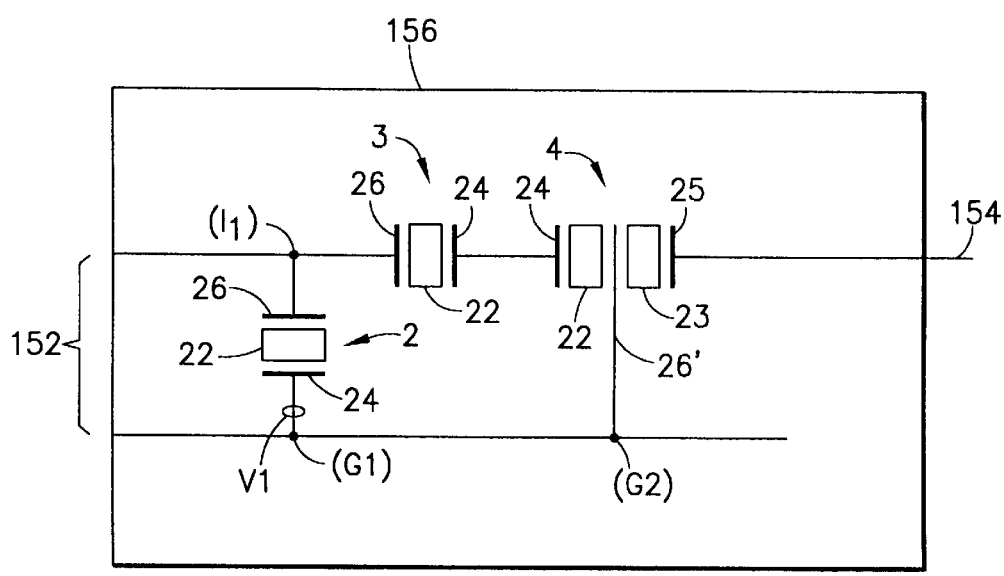
Figure 18A:
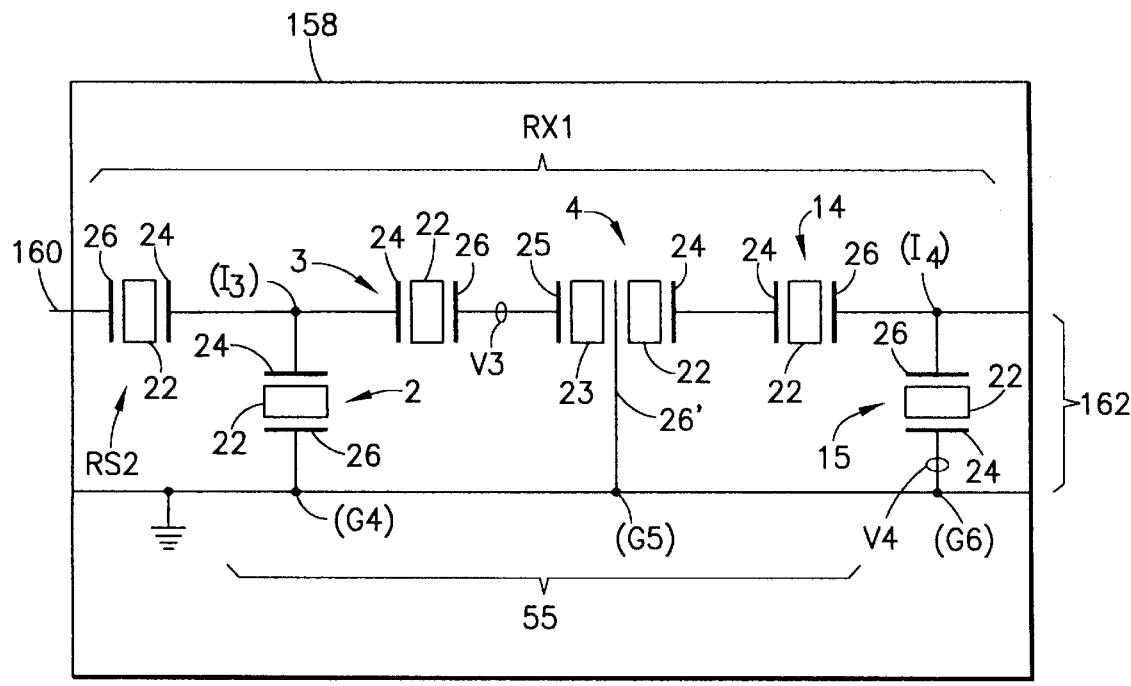
FIGS. 18a and 18b show alternate embodiments of BAWR-SCF circuits that may be employed in receiver portions of the duplex filter of FIG. 13 and the dual duplexer of FIG. 16.
Figure 18B:
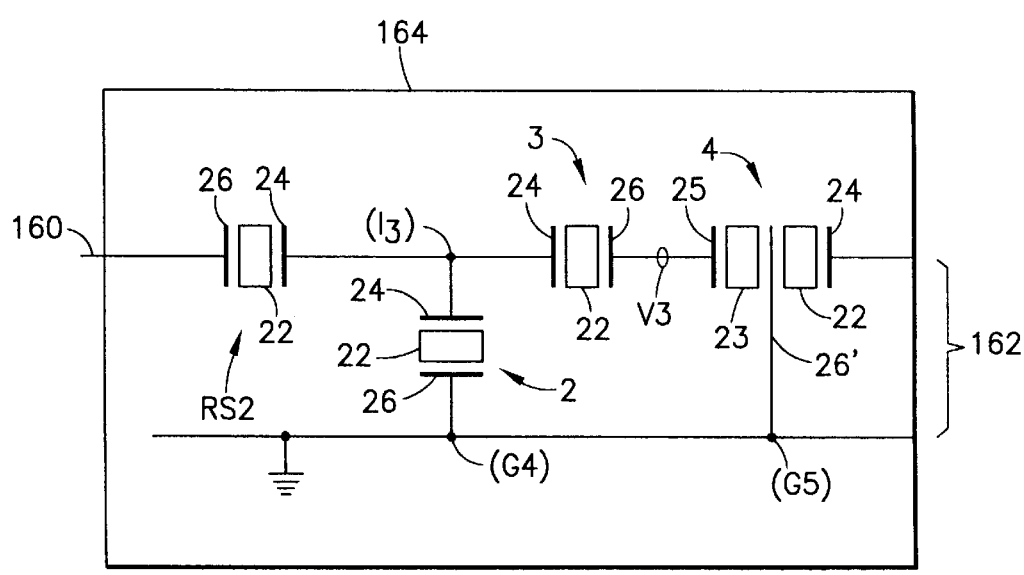

It should be noted that the BAWR-SCF circuits 53 and 55 of the respective first and second portions (TX1) and (RX1) of duplexer 51 may have other topologies than those shown in FIG. 13. For example, the BAWR-SCF circuits 53 and 55 of the respective first and second portions (TX1) and (RX1) may have topologies that are similar to those shown in blocks 156 and 164 of FIGS. 17b and 18b, respectively. As can be appreciated, the topologies in this case are the same as the topologies of respective portions (TX1) and (RX1) of FIG. 13, except that a lesser number of BAW resonators are employed. An input 152 and output 154 are also shown in FIG. 17b, and an input 160 and an output 162 are also shown in FIG. 18b. Also by example, the respective first and second portions (TX1) and (RX1) of duplexer 51 may have topologies that are similar to any of the devices shown in the above-described FIGS. 10d and 11c, or any other suitable topology may be employed, depending on applicable performance criteria for the duplexer 51.

In accordance with the invention, the duplexer 51 is constructed so that the first portion (TX1) yields a passband (e.g., a transmit band) over selected frequencies that are different than selected passband (e.g., receive band) frequencies of the second portion (RX1). That is, the series BAW resonators of the first portion (TX1) preferably are tuned to yield a parallel resonance that enables the first portion (TX1) to provide a notch at a selected frequency $f_2$ above the passband of the first portion (TX1), and the parallel BAW resonators of the first portion (TX1) are preferably tuned to yield a series resonance that enables the first portion (TX1) to provide a notch at a selected frequency $f_1$ below the passband of first portion (TX1). The series BAW resonators of the second portion (RX1) of duplexer 51 preferably are tuned to yield a parallel resonance that enables the second portion (RX1) to provide a notch at a selected frequency $f_4$ above the passband of the second portion (RX1), and the parallel BAW resonators of the second portion (RX1) are preferably tuned to yield a series resonance that enables the second portion (RX1) to provide a notch at a selected frequency $f_3$ below the passband of the second portion (RX1). Also, the series and parallel BAW resonators of the portions (RX1) and (TX1) of the duplexer 51 are preferably constructed so as to yield series and parallel resonances, respectively, at or near the desired center frequencies of the respective portions (RX1) and (TX1) of the duplexer 51, and the SCFs of these portions (RX1) and (TX1) of the duplexer 51 are also preferably constructed so as to yield series resonances at the respective, desired center frequencies of these portions (RX1) and (TX1) of the duplexers.

Preferably, the passbands of the respective first and second portions (TX1) and (RX1) of the duplexer 51 are sufficiently spaced apart from one another on the frequency spectrum so as to enable a high level of selectivity to be provided for the respective portions (RX1) and (TX1) of the duplexer 51.

Figure 15:
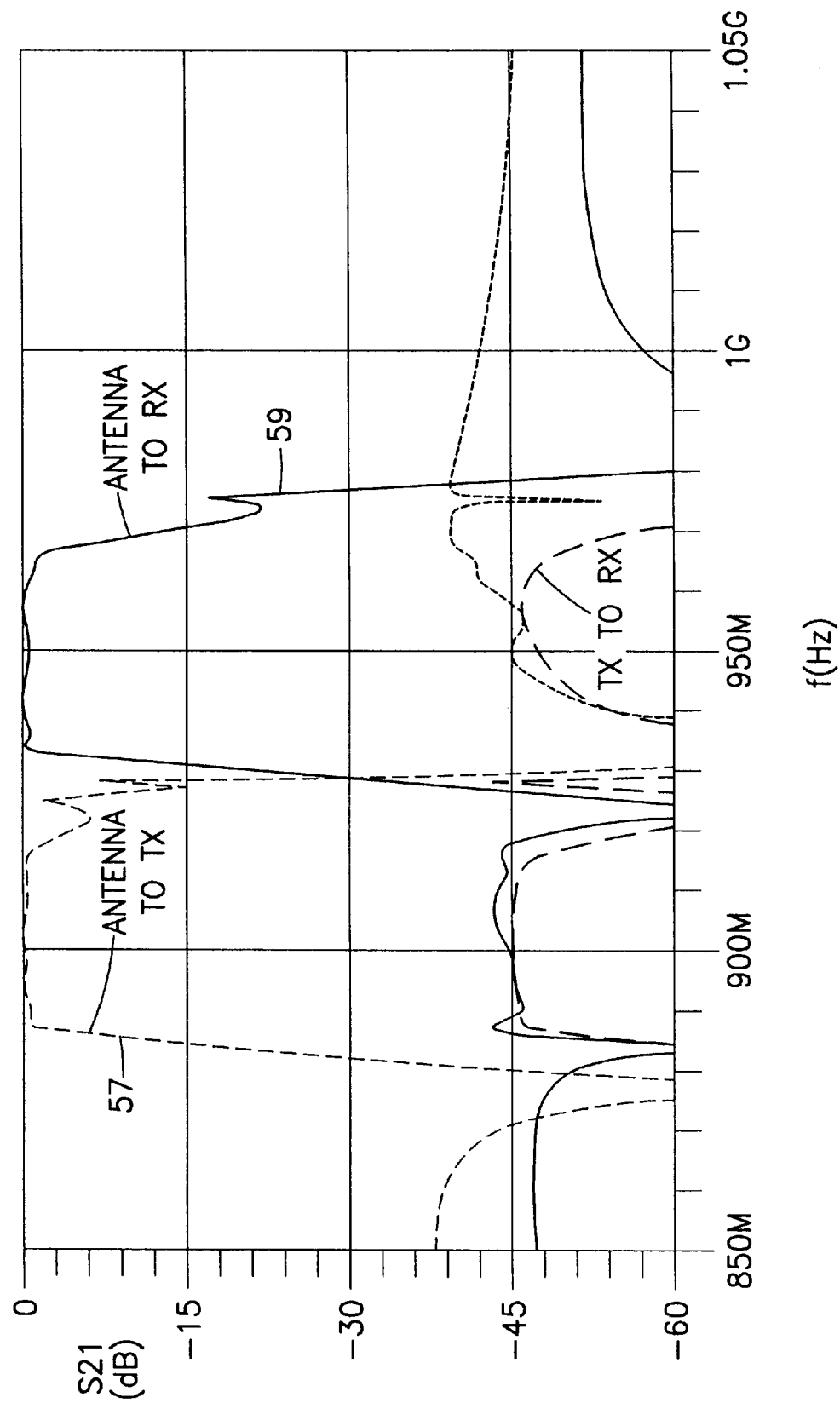
FIG. 15 shows frequency responses 57 and 59 of first and second portions (TX1) and (RX1), respectively, of the duplex filter of FIG. 13.

FIG. 15 illustrates the frequency responses of the first portion (TX1) and the second portion (RX1) of the duplexer 51 for an exemplary case in which the duplexer 51 is designed for use in a GSM transceiver (i.e., in GSM applications, the transmit band ideally extends between the frequencies of 890 MHz to 915 MHz, and the receive band ideally extends between the frequencies of 935 Mhz to 960 Mhz). For this application, the BAW resonators and the SCF of the respective portions (TX1) and (RX1) of the duplexer 51 are assumed to include the layers and layer dimensions shown in Tables 6 and 7, respectively, below. Also, the BAW resonators and the SCF of the respective portions (TX1) and (RX1) are assumed to include "bridge" structures (i.e., the devices include membrane layers), and the antenna port is assumed to have a resistance of 50 Ohms.

TABLE 6

Dimensions of RX1 Portion

| Series BAW resonators 3 and 14 | | Shunt BAW resonators 2 and 15 | | SCF 4 | | BAW resonator (RS2) | |
| --- | --- | --- | --- | --- | --- | --- | --- |
| Layer | Thickness | Layer | Thickness | Layer | Thickness | Layer | Thickness |
| | | | | upper electrode | 266 nm | | |
| | | | | upper piezoelectric layer | 2760 nm | | |
| upper electrode | 266 nm | upper electrode | 266 nm | ground electrode | 266 nm | upper electrode | 266 nm |
| piezoelectric layer | 2289 nm | piezoelectric layer | 2289 nm | lower piezoelectric layer | 2289 nm | lower piezoelectric layer | 2289 nm |
| lower electrode | 266 nm | lower electrode | 266 nm | lower electrode | 266 nm | lower electrode | 266 nm |
| 1. membrane layer | 50 nm | 1. membrane layer | 50 nm | 1. membrane layer | 50 nm | 1. membrane layer | 50 nm |
| 2. membrane layer | — | 2. membrane layer | 265 nm | 2. membrane layer | 265 nm | 2. membrane layer | — |
| area of electrode | 178 um* 178 um | area of electrode | 370 um* 370 um | area of electrode | 365 um* 365 um | area of electrode | 204 um* 204 um |

TABLE 7

Dimensions of TXI Portion

| Series BAW resonators 3 and 14 | | Shunt BAW resonators 2 and 15 | | SCF 4 | | BAW Resonator RS1 | |
| --- | --- | --- | --- | --- | --- | --- | --- |
| Layer | Thickness | Layer | Thickness | Layer | Thickness | Layer | Thickness |
|  |  |  |  | upper electrode | 254 nm |  |  |
|  |  |  |  | upper piezolayer | 3060 nm |  |  |
| upper electrode | 254 nm | upper electrode | 254 nm | ground electrode | 254 nm | upper electrode | 254 nm |
| lower piezoelectric layer | 2483 nm | piezoelectric layer | 2483 nm | lower piezoelectric layer | 2483 nm | piezoelectric layer | 2483 nm |
| electrode | 254 nm | lower electrode | 254 nm | lower electrode | 254 nm | lower electrode | 254 nm |
| 1. membrane layer | 50 nm | 1. membrane layer | 50 nm | 1. membrane layer | 50 nm | 1. membrane layer | 50 nm |
| 2. membrane layer | — | 2. membrane layer | 255 nm | 2. membrane layer | 255 nm | 2. membrane layer | — |
| area of electrode | 248 um* 248 um | area of electrode | 342 um* 342 um | area of electrode | 373 nm* 373 um | area of electrode | 268 um* 268 um |

The frequency response (for the transmit band) of the first portion (TX1) is labeled "57" in FIG. 15, and the frequency response (for the receive band) of the second portion (RX1) is labeled "59" in FIG. 15. As can be appreciated in view of FIG. 15, a high level of selectivity is provided by the duplexer 51, and there is more than 45 dB of isolation between the responses 57 and 59 of the respective first portion (TX1) and second portion (RX1) of the duplexer 51.

As can seen in view of the exemplary frequency responses of FIG. 15, the transmit band and the receive bands are spaced closely together on the frequency spectrum. The notch located between the lower edge of the response 59 and the upper edge of the response 57 is caused by the series resonances of the shunt BAW resonators 24 and 26 of the second portion (RX1) of the duplexer 51. At the series resonant frequencies of the BAW resonators 24 and 26, the devices 24 and 26 have low impedances (i.e., and resemble short circuits).

The inclusion of the BAW resonators (RS1) and (RS2) in the duplexer 51 enables the high level of frequency selectivity to be provided for the respective first and second portions (TX1) and (RX1) of duplexer 51, and also enables a high level of out-of-band rejection to be provided for these portions (TX1) and (RX1) of the duplexer 51. The BAW resonators (RS1) and (RS2) also enable a high degree of component matching to be provided for the first portion (TX1) and antenna (ANT), and for the second portion (RX1) and antenna (ANT) (e.g., a 50 Ohm antenna). By example, and as was described above, because the BAW resonator (RS2) is series-connected within the second, "receive" portion (RX1) of the duplexer 51, the BAW resonator (RS2) is preferably tuned to yield a series resonance at the center frequency of this portion (RX1) of the duplexer 51. At frequencies that are lower than the series resonant frequency of the BAW resonator (RS2), and which are within the transmit band, the BAW resonator (RS2) performs like a capacitor and causes an increase in the input impedance of the portion (RX1) of the duplexer 51. If, by example, the BAW resonator (RS2) is not included in the duplexer 51, then the input impedance of the portion (RX1) in this case is less than that provided by the portion (RX1) that includes the BAW resonator (RS2), and the level of component matching provided for the duplexer portions (RX1) and (TX1) and the antenna (ANT) may become somewhat degraded at upper transit band frequencies.

It should be noted that the duplexer 51 of the invention may also be employed in various other types of transceiver systems besides GSM transceivers. Also, in systems that are designed to have a greater frequency separation between the transmit and receive bands, the BAW resonators (RS1) and (RS2) need not be employed. Moreover, for cases in which zinc-oxide is employed for the piezoelectric layers of the BAW resonators and SCFs of the duplexer 51, the respective portions (RX1) and (TX1) of the duplexer 51 yield somewhat wider passband bandwidths than are yielded by these portions (RX1) and (TX1) in a case in which aluminum nitride is employed for the piezoelectric layers of the BAW resonators and SCFs, assuming that similar thicknesses are employed for the piezoelectric layers in both cases. Thus, in a case wherein it is desired that the first and second portions (TX1) and (RX1) of the duplexer 51 provide passbands of a greater bandwidth than, for example, 25 MHz (i.e., for a case in which 35 MHz passband bandwidths are required), it is preferred that zinc-oxide be employed for the piezoelectric layers of the BAW resonators and SCFs of the the duplexer 51. For cases wherein it is desired that the first and second portions (TX1) and (RX1) of the duplexer 51 provide passband bandwidths of approximately 25 MHz or less, it is preferred that aluminum nitride be employed for the piezoelectric layers of the BAW resonators and SCFs of the duplexer 51. An advantage of employing aluminum nitride is that it is generally easier to process and fabricate than is zinc-oxide.

Figure 14A:
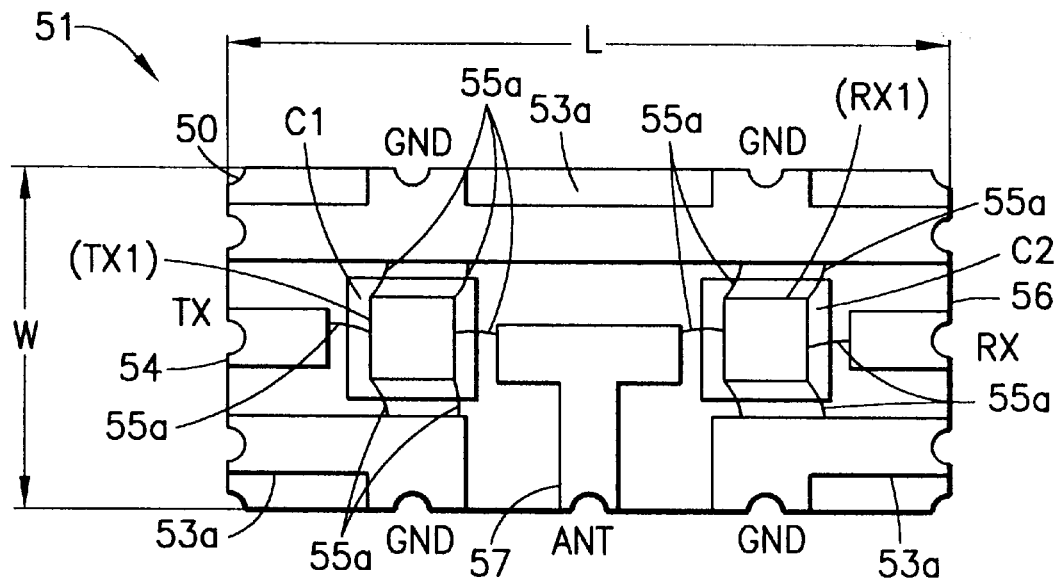
FIG. 14a shows a top view of duplex filter that is constructed in accordance with the invention.
Figure 14B:
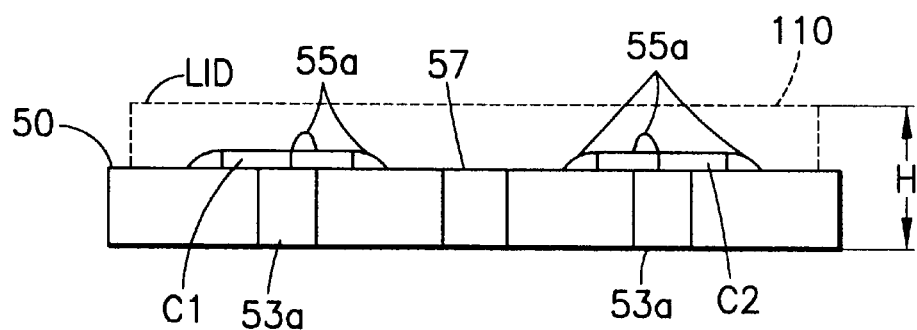

Referring to FIGS. 14a and 14b, the second portion (RX1) and the first portion (TX1) can be fabricated on individual filter chips (C2) and (C1), respectively. The chips (C2) and (C1) may then be placed on an interconnect substrate 50 to create the duplex filter 51. Substrate wiring 53a, 54, 56, and 57 for connecting the duplexer 51 to ground, a transmitter, a receiver, and an antenna, respectively, is coupled to the second portion (RX1) and the first portion (TX1) of the duplexer 51 via bonding wires 55a. In accordance with a preferred embodiment of the invention, the width (W) of the substrate 50 is about 4 mm, the length (L) of the substrate 50 is about 7 mm, and the height (H) of the substrate 50, including a lid covering 110, is about 2 mm. The lid covering 110 includes, by example, a suitable metal or a ceramic material having a solder "ring" or a glass paste (not shown) located at a lower surface perimeter of the lid covering 110 for being hermetically attached to the interconnect substrate 50. For a case in which it is required that the duplexer 51 have smaller dimensions, the second and first portions (RX1) and (TX1) can both be fabricated on the same substrate 50, and may then be packaged. Also, in another embodiment of the invention, the first and second portions (RX1) and (TX1) of the duplexer 51 may be coupled to the substrate wiring 53a, 54, 56, and 57 using flip-chip technology. In this case, parasitic inductances are reduced relative to those that may be present in the embodiment employing bonding wires.

The duplexer of the invention offers a number of advantages over conventional types of duplexers such as, for example, ceramic duplexers and duplexers that include Surface Acoustic Wave devices. For example, the duplexer of the invention can be fabricated to be smaller in size than ceramic duplexers and at least as small in size as a BAW duplexer. Also, the duplexer of the invention can operate at higher RF-power levels than can duplexers that include Surface Acoustic Wave devices, and can provide a high level of selectivity for both the (RX1) and (TX1) portions of the duplexer.

Figure 16:
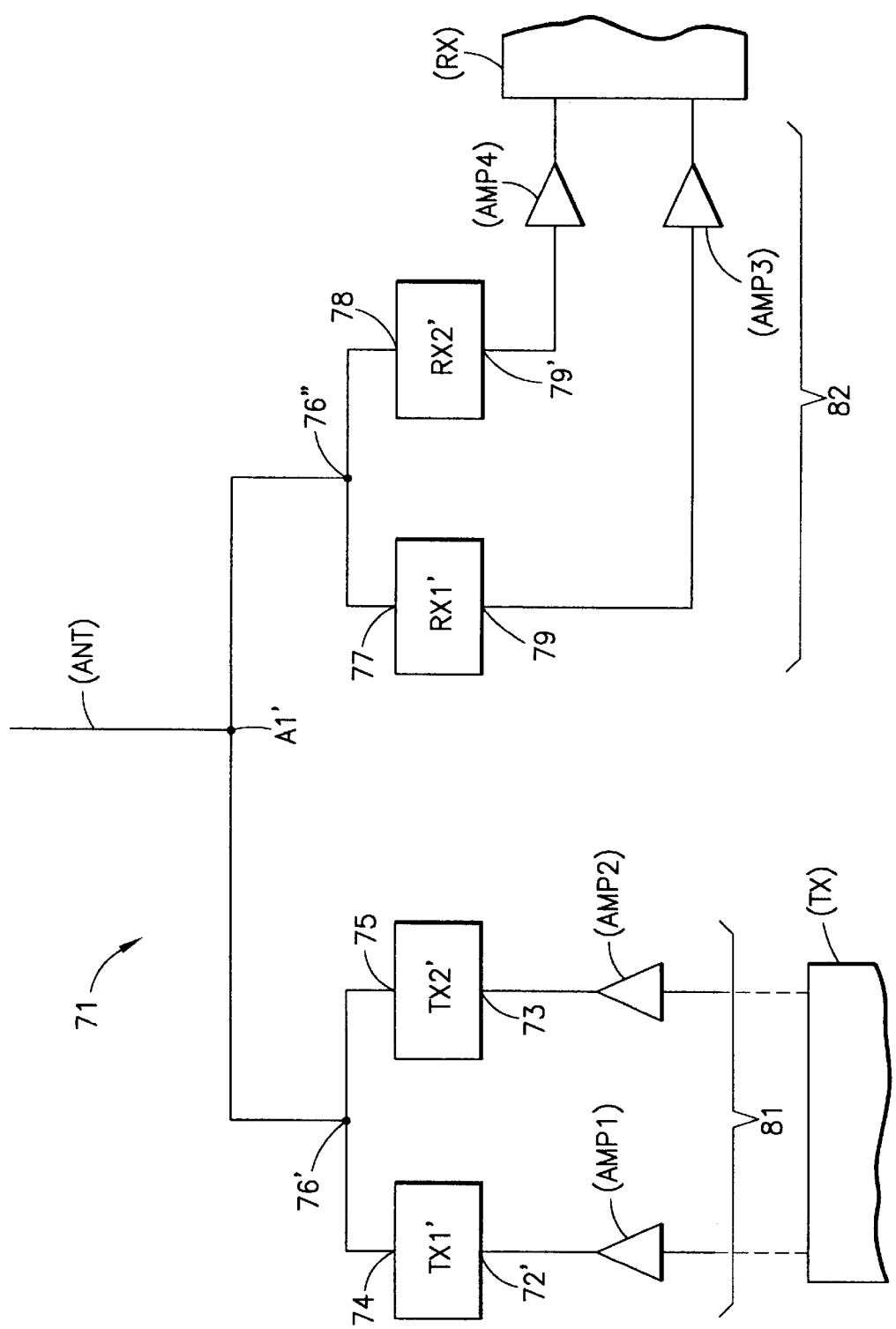
FIG. 16 shows a dual duplexer device that is constructed in accordance with the invention.

Referring to FIG. 16, a further embodiment of the invention will now be described. FIG. 16 shows a dual (or double) duplexer device 71 that is constructed in accordance with the invention. The dual duplexer device 71 may be employed to provide filtering in a dual-mode transceiver, such as a mobile station (not shown), as will be further described below. Preferably, the dual duplexer device 71 comprises at least one antenna (ANT), amplifiers (AMP1), (AMP2), (AMP3), and (AMP4), and first and second duplexer portions 81 and 82, respectively. The first duplexer portion 81 includes a filter block (TX1'), and a filter block (TX2'), and the second duplexer portion 82 includes a filter block (RX1') and a filter block (RX2'). In a preferred embodiment of the invention, each of the filter blocks (TX1') and (TX2') preferably includes similar components as the first, transmit portion (TX1) of the duplexer 51 described above. For example, FIG. 17a shows a filter block 150 that includes a BAWR-SCF circuit similar to the transmit portion (TX1) of the duplexer 51. In the preferred embodiment of the invention, the filter block 150 forms the filter blocks (TX1') and (TX2') of FIG. 16, input 152 of FIG. 17a forms respective inputs 72' and 73 of FIG. 16, and output 154 of FIG. 17a forms respective outputs 74 and 75 of FIG. 16.

Also in the preferred embodiment of the invention, each of the filter blocks (RX1') and (RX2') of the dual duplexer 71 includes similar components as the second, receive portion (RX1) of the duplexer 51 described above. By example, FIG. 18a shows a filter block 158 that includes a BAWR-SCF circuit similar to the receive portion (RX1) of the duplexer 51. In the preferred embodiment of the invention, the filter block 158 forms the filter blocks (RX1') and (RX2') of FIG. 16, input 160 forms respective inputs 77 and 78 of FIG. 16, and output 162 forms respective outputs 79 and 79' of FIG. 16.

Inputs 72' and 73 of the respective filter blocks (TX1') and (TX2') are coupled to outputs of the respective amplifiers (AMP1) and (AMP2). Outputs 74 and 75 of the respective filter blocks (TX1') and (TX2') of the dual duplexer 71 are coupled to an antenna port (A1') via a common node 76'. Inputs 77 and 78 of the respective filter blocks (RX1') and (RX2') are coupled to antenna port (A1') via a common node 76", and respective outputs 79 and 79' of the respective filter blocks (RX1') and (RX2') are coupled to amplifiers (AMP3) and (AMP4), respectively. The amplifiers (AMP1) and (AMP2) are preferably connected at their inputs to some further circuitry such as, by example, transmitter circuitry (TX) of a dual-mode transceiver device. Also, the amplifiers (AMP3) and (AMP4) are preferably connected at their outputs to some further circuitry such as, by example, receiver circuitry (RX) of the dual-mode transceiver device.

As described above, the dual duplexer 71 can be employed to provide filtering in a dual-mode transceiver device. As such, and according to a presently preferred embodiment of the invention, the BAW resonators and SCFs of each portion (TX1'), (TX2'), (RX1'), and (RX2') of the dual duplexer 71 are constructed in a manner so that the filter block (TX1') yields a passband (e.g., a transmit band) over a first selected band of frequencies, the filter block (TX2') yields a passband (e.g., a transmit band) over a second selected band of frequencies, the filter block (RX1') yields a passband (e.g., a receive band) over a third selected band of frequencies, and the filter block (RX2') yields a passband (e.g., a receive band) over a fourth selected band of frequencies. In this manner, during times when the dual duplexer 71 is connected within the dual-mode transceiver device, the filter block (TX1') filters signals that are output by transmitter (TX) of the transceiver device and which have a frequency within the passband of the filter block (TX1'), before the signals are transmitted from the transceiver device over antenna (ANT). The filter block (TX2') filters signals that are output by the transmitter (TX) of the transceiver device and which have a frequency within the passband of the filter block (TX2'), before the signals are transmitted from the transceiver device over the antenna (ANT). Also within the transceiver device, the filter block (RX1') of the dual duplexer 71 filters signals that are received by the antenna (ANT) and which have a frequency within the passband of the block (RX1'), and then provides filtered signals to the receiver circuitry (RX) of the transceiver device. Similarly, the filter block (RX2') of the dual duplexer 71 filters signals that are received by the antenna (ANT) and which have a frequency within the passband of the block (RX2'), and then provides filtered signals to the receiver circuitry (RX) of the transceiver device.

Preferably, the passbands of the respective filter blocks (TX1'), (TX2'), (RX1'), and (RX2') of the dual duplexer 71 are sufficiently spaced apart from one another on the frequency spectrum so as to enable a high level of selectivity to be provided for the blocks (RX1'), (RX2'), (TX1'), and (TX2') of the dual duplexer 71. Also, as for the duplexer 51 described above, for cases in which the passbands of the respective blocks (TX1'), (TX2'), (RX1'), and (RX2') are sufficiently spaced apart from one another on the frequency spectrum, the resonators RS1 and RS2 need not be employed. Moreover, appropriate FET switches may be employed within the dual duplexer 71, if desired.

It should be noted that, depending on, e.g., applicable performance criteria, the filter blocks (TX1'), (TX2'), (RX1'), and (RX2') may include BAWR-SCF circuits having other topologies than those shown in FIGS. 17a and 18a. For example, the filter blocks (TX1') and (TX2') may have topologies that are similar to those shown in block 156 of FIG. 17b, and the filter blocks (RX1') and (RX2') may have topologies that are similar to those shown in block 164 of FIG. 18b. As can be appreciated, the topologies in this case are the same as the topologies of the BAWR-SCF circuits of FIGS. 17a and 18a, respectively, except that a lesser number of BAW resonators are employed. In this embodiment, input 152 and output 154 of FIG. 17b form the inputs 72' and 73 and the outputs 74 and 75, respectively, of filter blocks (TX1') and (TX2'). Also, input 160 and output 162 of FIG. 18b form inputs 77 and 78 and outputs 79 and 79', respectively, of filter blocks (RX1') and (RX2'). It should also be noted that the BAWR-SCF circuits of the respective filter blocks (TX1'), (TX2'), (RX1'), and (RX2') of dual duplexer 71 may have topologies that are similar to any of the devices shown in the above-described FIGS. 10d and 11c, or any other suitable topology may be employed, depending on applicable performance criteria for the duplexer 51.

While the invention has been particularly shown and described with respect to preferred embodiments thereof, it will be understood by those skilled in the art that changes in form and details may be made therein without departing from the scope and spirit of the invention. By example, as was described above, in cases in which it is required to provide more narrow passband bandwidths than are provided by the BAWR-SCF circuits 1 and 13 of FIGS. 10a and 11a, respectively, circuits having the configuration of BAWR-SCF devices 16 and 13' may be employed. However, it is not intended that the invention be so limited, and relatively narrow passband bandwidths may also be provided by employing the configurations of the individual BAWR-SCF devices 1 and 13, wherein the thicknesses of one or more of the BAW resonator stack layers of these devices are optimized to enable the desired narrow passband bandwidth to be provided. For example, within one or more of the BAW resonators of the respective BAWR-SCF devices 1 and 13, a membrane layer may be employed (in the parallel BAW resonators) that is thicker than the membrane layers of other BAW resonators of the respective devices by an appropriate amount. Also, a piezoelectric layer may be employed (in the series resonators) that is less thick than the piezoelectric layers of the other BAW resonators of the BAWR-SCF devices by an appropriate amount, in order to enable the desired narrow passband bandwidth to be provided.

What is claimed is:

1. A Bulk Acoustic Wave (BAW) filter, comprising:
   a first pair of ports;
   a second pair of ports;
   a first lead connected between a first and a second one of said first pair of ports;
   a second lead connected between a first and a second one of said second pair of ports;
   a first plurality of BAW resonators, said first plurality of BAW resonators including a first BAW resonator connected in series in said first lead, said first plurality of BAW resonators also including a second BAW resonator connected between said first lead and said second lead;
   a first Stacked Crystal Filter (SCF), said first SCF having first and second terminals connected in said first lead between said first BAW resonator and one of said first pair of ports, said first SCF also having a third terminal connected to a node in said second lead, wherein said BAW filter yields a pass band response having a center frequency fM a lower notch at a frequency X, and an upper notch at a frequency Y; and
   wherein the thickness of said first BAW resonator is chosen to provide a series resonance substantially at said center frequency fM of said pass band response and a parallel resonance substantially at frequency Y and wherein the thickness of said second BAW resonator is chosen to provide a parallel resonance substantially at said center frequency fM of said pass band response and a series resonance substantially at frequency X.

2. A Bulk Acoustic Wave (BAW) filter as described in claim 1, wherein said first SCF is fabricated to operate at a second harmonic resonance which is substantially at said center frequency fM of said pass band response.

3. A BAW filter as set forth in claim 1, wherein said first BAW resonator has a first terminal coupled to said first port of said first pair of ports and a second terminal coupled to said first terminal of said first SCF, wherein said second BAW resonator has a first terminal coupled to said first lead between said second terminal of said first BAW resonator and said first terminal of said first SCF, and wherein said second BAW resonator also has a second terminal coupled to said second lead between said first one of said second pair of ports and said node.

4. A Bulk Acoustic Wave (BAW) filter, comprising:
   a first pair of ports;
   a second pair of ports;
   a first lead connected between a first and a second one of said first pair of ports;
   a second lead connected between a first and a second one of said second pair of ports;
   a first plurality of BAW resonators, each of said resonators having a piezoelectric element, said first plurality of BAW resonators including a first BAW resonator connected in series in said first lead, said first plurality of BAW resonators also including a second BAW resonator connected between said first lead and said second lead;
   at least one Stacked Crystal Filter (SCF), each of said SCF's having first and second piezoelectric elements, said first SCF having first and second terminals connected in said first lead between said first BAW resonator and one of said first pair of ports, said first SCF also having a third terminal connected to a node in said second lead, wherein said BAW filter yields a passband response having a center frequency $f_c$, a lower notch at a frequency X, and an upper notch at a frequency Y; and
   wherein said piezoelectric elements of said plurality of resonators are configured to exhibit response characteristics sufficiently complementary to the response characteristics of said first piezoelectric element of said SCF to allow said resonator piezoelectric elements and said first piezoelectric element to be formed in a single layer.

5. A Bulk Acoustic Wave (BAW) filter, comprising:
   a first pair of ports;
   a second pair of ports;
   a first lead connected between a first and a second one of said first pair of ports;
   a second lead connected between a first and a second one of said second pair of ports;
   a first plurality of BAW resonators, said first plurality of BAW resonators including a first BAW resonator connected in series in said first lead, said first plurality of BAW resonators also including a second BAW resonator connected between said first lead and said second lead; and
   a first Stacked Crystal Filter (SCF), said first SCF having first and second terminals connected in said first lead between said first BAW resonator and one of said first pair of ports, said first SCF also having a third terminal connected to a node in said second lead, wherein said BAW filter yields a passband response having a center frequency $f_c$, a lower notch at a frequency X, and an upper notch at a frequency Y.
   wherein said first BAW resonator has a first terminal coupled to said first port of said first pair of ports and a second terminal coupled to said first terminal of said first SCF, wherein said second BAW resonator has a first terminal coupled to said first lead between said first terminal of said first BAW resonator and said first port of said first pair of ports, and wherein said second BAW resonator also has a second terminal coupled to said second lead between said first one of said second pair of ports and said node.

6. A Bulk Acoustic Wave (BAW) filter, comprising:

a first pair of ports;

a second pair of ports;

a first lead connected between a first and a second one of said first pair of ports;

a second lead connected between a first and a second one of said second pair of ports;

a first plurality of BAW resonators, said first plurality of BAW resonators including a first BAW resonator connected in series in said first lead, said first plurality of BAW resonators also including a second BAW resonator connected between said first lead and said second lead; and a first Stacked Crystal Filter (SCF), said first SCF having first and second terminals connected in said first lead between said first BAW resonator and one of said first pair of ports, said first SCF also having a third terminal connected to a node in said second lead, wherein said BAW filter yields a passband response having a center frequency $f_c$, a lower notch at a frequency X, and an upper notch at a frequency Y; and further comprising a second plurality of BAW resonators, said second plurality of BAW resonators including a third and a fourth BAW resonator, said third BAW resonator connected in series in said first lead between said first SCF and said second one of said first pair of ports, said fourth BAW resonator having a first terminal coupled to said first lead between said third BAW resonator and said second one of said first pair of ports, said fourth BAW resonator also having a second terminal coupled to said second lead between said node and said second one of said second pair of ports.

7. A Bulk Acoustic Wave (BAW) filter, comprising:

a first pair of ports;

a second pair of ports;

a first lead connected between a first and a second one of said first pair of ports;

a second lead connected between a first and a second one of said second pair of ports;

a first plurality of BAW resonators, said first plurality of BAW resonators including a first BAW resonator connected in series in said first lead, said first plurality of BAW resonators also including a second BAW resonator connected between said first lead and said second lead;

a first Stacked Crystal Filter (SCF), said first SCF having first and second terminals connected in said first lead between said first BAW resonator and one of said first pair of ports, said first SCF also having a third terminal connected to a node in said second lead, wherein said BAW filter yields a passband response having a center frequency $f_c$, a lower notch at a frequency X, and an upper notch at a frequency Y; and wherein said BAW filter further comprises a second plurality of BAW resonators, said second plurality of BAW resonators including a third and a fourth BAW resonator, said third BAW resonator connected in series in said first lead between said first SCF and said second one of said first pair of ports, said fourth BAW resonator having a first terminal coupled to said first lead between said first SCF and said third BAW resonator, said fourth BAW resonator also having a second terminal coupled to said second lead between said node and said second one of said second pair of ports.

8. A Bulk Acoustic Wave (BAW) filter, comprising:

a first pair of ports;

a second pair of ports;

a first lead connected between a first and a second one of said first pair of ports;

a second lead connected between a first and a second one of said second pair of ports;

a first plurality of BAW resonators, said first plurality of BAW resonators including a first BAW resonator connected in series in said first lead, said first plurality of BAW resonators also including a second BAW resonator connected between said first lead and said second lead;

a first Stacked Crystal Filter (SCF), said first SCF having first and second terminals connected in said first lead between said first BAW resonator and one of said first pair of ports, said first SCF also having a third terminal connected to a node in said second lead, wherein said BAW filter yields a passband response having a center frequency $f_c$, a lower notch at a frequency X, and an upper notch at a frequency Y; and wherein at least one of said first BAW resonator, said second BAW resonator, and said first SCF includes one of a membrane structure and an acoustic mirror structure.

9. A Bulk Acoustic Wave (BAW) filter, comprising:

a first pair of ports;

a second pair of ports;

a first lead connected between a first and a second one of said first pair of ports;

a second lead connected between a first and a second one of said second pair of ports;

a first plurality of BAW resonators, said first plurality of BAW resonators including a first BAW resonator connected in series in said first lead, said first plurality of BAW resonators also including a second BAW resonator connected between said first lead and said second lead;

a first Stacked Crystal Filter (SCF), said first SCF having first and second terminals connected in said first lead between said first BAW resonator and one of said first pair of ports, said first SCF also having a third terminal connected to a node in said second lead, wherein said BAW filter yields a passband response having a center frequency $f_c$, a lower notch at a frequency X, and an upper notch at a frequency Y;

wherein said first BAW resonator is tuned to yield a resonance at a first resonant frequency and said second BAW resonator is tuned to yield a resonance at a second resonant frequency, wherein said lower notch is a function of said second resonant frequency, wherein said upper notch is a function of said first resonant frequency, and wherein said center frequency $f_c$ is a function of another resonant frequency yielded by at least one of said first and second BAW resonators and a resonant frequency yielded by said first SCF; and wherein said first SCF is tuned to yield a second harmonic resonance at a frequency which is approximately equal to said center frequency $f_c$.

10. A BAW filter as set forth in claim 9, wherein each of said first BAW resonator and said second BAW resonator includes a piezoelectric layer having a thickness of T, wherein said first SCF includes a pair of piezoelectric layers each having a respective thickness of T, and wherein said frequency of said second harmonic resonance of said first SCF is a function of said respective thickness of each one of said pair of piezoelectric layers of said first SCF.

11. A Bulk Acoustic Wave (BAW) filter, comprising:
a first pair of ports;
a second pair of ports;
a first lead connected between a first and a second one of said first pair of ports;
a second lead connected between a first and a second one of said second pair of ports;
a first plurality of BAW resonators, said first plurality of BAW resonators including a first BAW resonator connected in series in said first lead, said first plurality of BAW resonators also including a second BAW resonator connected between said first lead and said second lead;
a first Stacked Crystal Filter (SCF), said first SCF having first and second terminals connected in said first lead between said first BAW resonator and one of said first pair of ports, said first SCF also having a third terminal connected to a node in said second lead, wherein said BAW filter yields a passband response having a center frequency $f_c$, a lower notch at a frequency X, and an upper notch at a frequency Y; and
wherein said first BAW resonator has a first terminal coupled to said first port of said first pair of ports and a second terminal directly coupled to said first terminal of said first SCF, wherein said second BAW resonator has a first terminal coupled to said first lead between said second terminal of said first BAW resonator and said first terminal of said first SCF, and wherein said second BAW resonator also has a second terminal coupled to said second lead between said first one of said second pair of ports and said node.

12. A Bulk Acoustic Wave (BAW) filter, comprising:
a first pair of ports;
a second pair of ports;
a first lead connected between a first and a second one of said first pair of ports;
a second lead connected between a first and a second one of said second pair of ports;
a first plurality of BAW resonators, said first plurality of BAW resonators including a first BAW resonator connected in series in said first lead, said first plurality of BAW resonators also including a second BAW resonator connected between said first lead and said second lead; and
a first Stacked Crystal Filter (SCF), said first SCF having first and second terminals connected in said first lead between said first BAW resonator and one of said first pair of ports, said first SCF also having a third terminal connected to a node in said second lead;
a second plurality of BAW resonators, said second plurality of BAW resonators including a third and a fourth BAW resonator, said third BAW resonator connected in series in said first lead between said first SCF and said second one of said first pair of ports, said fourth BAW resonator having a first terminal coupled to said first lead between said third BAW resonator and said second one of said first pair of ports, said fourth BBAW resonator also having a second terminal coupled to said second lead between said node and said second one of said second pair of ports.
a fifth BAW resonator connected in series in said second lead, said fifth BAW resonator having a first terminal coupled to said first one of said second pair of ports;
a sixth BAW resonator connected in series in said second lead, said sixth BAW resonator having a first terminal coupled to said second one of said second pair of ports; and
a second SCF, said second SCF having a first terminal coupled to a second terminal of said fifth BAW resonator, said second SCF also having a second terminal coupled to a second terminal of said sixth BAW resonator, and said second SCF further having a third terminal connected to said node, said node for being connected to ground.

13. A Bulk Acoustic Wave (BAW) filter, comprising:
first means, said first means having a first and a second pair of nodes, said first means for yielding a first characteristic frequency response in response to receiving a signal across one of said first pair of nodes and said second pair of nodes of said first means, said first characteristic frequency response including a first passband shape, wherein said first means includes a first plurality of BAW resonators connected in a ladder configuration; and
second means, said second means having a respective first and a second pair of nodes, said first pair of nodes of said second means being coupled to said second pair of nodes of said first means, said second means for yielding a second characteristic frequency response in response to receiving a signal across one of said first pair of nodes and said second pair of nodes of said second means, said second characteristic frequency response including a second passband shape, said second means including at least one SCF;
wherein said BAW filter yields a third frequency response that includes a third passband shape, said third frequency response being a function of said first and second characteristic frequency responses.

14. A BAW filter as set forth in claim 13, wherein said third frequency response includes notches that are located above and below said third passband shape, said notches being a function of said first characteristic frequency response, and wherein said third frequency response has a stopband attenuation level that is a function of said second characteristic frequency response.

15. A BAW filter as set forth in claim 13, and further including third means, said third means having a first and a second pair of nodes, said first pair of nodes of said third means being coupled to said second pair of nodes of said second means, said third means for yielding a fourth characteristic frequency response in response to receiving a signal across one of said first pair of nodes and said second pair of nodes of said third means, said fourth characteristic frequency response including a first passband shape, wherein said third frequency response is also a function of said fourth characteristic frequency response, and wherein said third means includes a respective plurality of BAW resonators connected in a ladder configuration.

16. A duplex filter for use in a transceiving device having at least one transceiving antenna, said duplex filter comprising:
a first portion, said first portion having an input and an output, said output being coupled to said at least one antenna, said first portion for filtering signals that are applied to said input of said first portion, and for outputting first filtered signals through said output, said first portion comprising a first Bulk Acoustic Wave Resonator-Stacked Crystal Filter (BAWR-SCF) circuit, said first portion being tuned to yield a frequency response having a center frequency $f_{c1}$, a lower notch at a frequency $f_{N1}$, and an upper notch at a frequency $f_{N2}$; and a second portion, said second portion having an input and an output, said input of said second portion being coupled to said at least one antenna, said second portion for filtering signals that are forwarded to said input of said second portion from said at least one antenna, and for outputting second filtered signals through said output of said second portion, said second portion comprising a second BAWR-SCF circuit, said second portion being tuned to yield a frequency response having a center frequency $f_{c2}$, a lower notch at a frequency $f_{N3}$, and an upper notch at a frequency $f_{N4}$;

wherein each of said first and second BAWR-SCF circuits includes a plurality of Bulk Acoustic Wave (BAW) resonators connected in a ladder configuration and at least one Stacked Crystal Filter (SCF).

17. A duplex filter as set forth in claim 16, wherein said first portion further comprises another BAW resonator interposed between said output of said first portion and said at least one antenna, and wherein said second portion further comprises an additional BAW resonator interposed between said at least one antenna and said input of said second portion.

18. A duplex filter as set forth in claim 16, wherein said input of at least one of said first and second portions includes a respective first pair of ports, wherein said output of said at least one of said portions includes a respective second pair of ports, wherein said BAWR-SCF circuit of said at least one of said portions further comprises:

a first lead connected between a first one of said first pair of ports and a first one of said second pair of ports; and a second lead connected between a second one of said first pair of ports and a second one of said second pair of ports;

wherein said plurality of BAW resonators of said BAWR-SCF circuit of said at least one of the portions includes a first BAW resonator connected in series in said first lead and a second BAW resonator connected between said first lead and said second lead, wherein said SCF of said BAWR-SCF circuit of said at least one of the portions has first, second, and third terminals, said first and second terminals being connected in said first lead between said first BAW resonator and said first one of said second pair of ports, said third terminal being connected to said second lead.

19. A duplex filter as set forth in claim 18, wherein said BAWR-SCF circuit of said at least one of said portions further comprises:

a third BAW resonator interposed between said SCF and said first one of said second pair of ports; and a fourth BAW resonator having a first terminal coupled between said third BAW resonator and said first one of said second pair of ports, said fourth BAW resonator also having a second terminal coupled to said second lead.

20. In a dual-mode transceiving device having a transmitter portion, a receiver portion, and at least one antenna, a double duplex filter, said double duplex filter comprising:

a first duplexer, said first duplexer including a first filter and a second filter, each of said first and second filters having a respective first pair of ports coupled to an output of said transmitter portion, each of said first and second filters also having a respective second pair of ports, at least a first one of said second pair of ports of each of said first and second filters being coupled to said at least one antenna, each of said first and second filters comprising a respective Bulk Acoustic Wave (BAW) filter circuit, said first and second filters being tuned to yield passbands over a first frequency band and a second frequency band, respectively; and a second duplexer, said second duplexer including a third filter and a fourth filter, each of said third and fourth filters having a respective first pair of ports, at least a first one of said first pair of ports of each of said third and fourth filters being coupled to said at least one antenna, each of said third and fourth filters also having a respective second pair of ports coupled to an input of said receiver portion, each of said third and fourth filters comprising a respective BAW filter circuit, said third and fourth filters being tuned to yield passbands over a third frequency band and a fourth frequency band, respectively; and wherein said BAW filter circuit of each of said first, second, third, and fourth filters includes:

a first lead connected between the first one of the first pair of ports of the filter and a first one of the second pair of ports of said filter;

a second lead connected between a second one of the first pair of ports of the filter and a second one of the second pair of ports of said filter;

a first BAW resonator connected in series in said first lead;

a second BAW resonator connected between said first lead and said second lead; and a Stacked Crystal Filter (SCF) having first and second terminals connected in said first lead between said first BAW resonator and the first one of said second pair of ports of the filter, said SCF also having a third terminal connected to a node of said second lead.

21. In a dual-mode transceiving device as set forth in claim 20, wherein the BAW filter circuit of each of said first, second, third, and fourth filters further comprises:

a third BAW resonator, said third BAW resonator connected in series in said first lead, said third BAW resonator having a first terminal coupled to said second terminal of said SCF, said third BAW resonator also having a second terminal coupled to said first one of the second pair of ports of said filter; and a fourth BAW resonator, said fourth BAW resonator having a first terminal coupled to said first lead between said second terminal of said third BAW resonator and said first one of the second pair of ports of the filter, said fourth BAW resonator also having a second terminal coupled to said second lead between said node and said second one of the second pair of ports of the duplex filter.

22. In a dual-mode transceiving device as set forth in claim 21, wherein the BAW filter circuit of each of said first and second duplex filters further comprises a fifth BAW resonator connected in series in said first lead between said third BAW resonator and said first one of the second pair of ports of the filter.

23. In a dual-mode transceiving device as set forth in claim 21, wherein the BAW filter circuit of each of said third and fourth duplex filters further comprises a fifth BAW resonator connected in series in said first lead between said first one of said first pair of ports and said first BAW resonator.

* * * * *